(12) United States Patent
Lyden

(10) Patent No.: US 12,223,294 B2
(45) Date of Patent: *Feb. 11, 2025

(54) COMPUTER LANGUAGE AND CODE FOR APPLICATION DEVELOPMENT AND ELECTRONIC AND OPTICAL COMMUNICATION

(71) Applicant: Robert Lyden, Ashland, OR (US)

(72) Inventor: Robert Lyden, Ashland, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/467,177

(22) Filed: Sep. 14, 2023

(65) Prior Publication Data

US 2024/0004617 A1     Jan. 4, 2024

Related U.S. Application Data

(63) Continuation of application No. 17/577,922, filed on Jan. 18, 2022, now Pat. No. 11,809,839.

(51) Int. Cl.
*G06F 8/30* (2018.01)
(52) U.S. Cl.
CPC ..................... *G06F 8/31* (2013.01)
(58) Field of Classification Search
None
See application file for complete search history.

(56) References Cited

U.S. PATENT DOCUMENTS

| | | |
|---|---|---|
| 235,199 A | 12/1880 | Bell |
| 1,450,246 A | 4/1923 | Cady |
| 1,472,583 A | 10/1923 | Cady |
| 2,212,845 A | 8/1940 | Nicolson |
| 4,128,843 A | 12/1978 | Chiang |
| 4,405,829 A | 9/1983 | Rivest et al. |
| 4,461,944 A * | 7/1984 | Cohen .................. G06F 3/05 219/110 |
| 5,247,693 A | 9/1993 | Bristol |
| 5,692,047 A | 11/1997 | McManis |
| 5,706,502 A | 1/1998 | Foley et al. |
| 5,754,857 A | 5/1998 | Gadol |
| 5,815,718 A | 9/1998 | Tock |
| 5,892,904 A | 4/1999 | Atkinson et al. |
| 5,920,720 A | 7/1999 | Toutonghi et al. |
| 5,925,123 A | 7/1999 | Tremblay et al. |
| 5,966,542 A | 10/1999 | Tock |
| 6,003,038 A | 12/1999 | Chen |

(Continued)

FOREIGN PATENT DOCUMENTS

| | | | |
|---|---|---|---|
| CA | 2840674 A1 * | 7/2014 | ............. H04R 5/027 |
| CN | 101833374 A * | 9/2010 | |

(Continued)

OTHER PUBLICATIONS

Doty, S.R.., "Python Basics," academia.edu, 2008, 20pg. (Year: 2008).*

(Continued)

*Primary Examiner* — Ryan D. Coyer
(74) *Attorney, Agent, or Firm* — Westman, Champlin & Koehler, P.A.

(57) ABSTRACT

The present disclosure relates to a computer language and code for software application development, data compression, and use with conventional, optical, hybrid electro-optical and quantum computers.

32 Claims, 19 Drawing Sheets

(56) References Cited

U.S. PATENT DOCUMENTS

| | | |
|---|---|---|
| 6,003,050 A | 12/1999 | Silver et al. |
| 6,006,241 A | 12/1999 | Purnaveja et al. |
| 6,026,485 A | 2/2000 | O'Connor et al. |
| 6,031,993 A | 2/2000 | Andrews et al. |
| 6,035,119 A | 3/2000 | Massena et al. |
| 6,044,218 A | 3/2000 | Faustini |
| 6,058,482 A | 5/2000 | Liu |
| 6,061,520 A | 5/2000 | Yellin et al. |
| 6,070,239 A | 5/2000 | McManis |
| 6,093,216 A | 7/2000 | Adl-Tabatabai et al. |
| 6,122,745 A | 9/2000 | Wong-Insley |
| 6,131,191 A | 10/2000 | Cierniak et al. |
| 6,134,600 A | 10/2000 | Liu |
| 6,134,627 A | 10/2000 | Bak |
| 6,141,794 A | 10/2000 | Dice et al. |
| 6,158,048 A | 12/2000 | Lueh et al. |
| 6,170,083 B1 | 1/2001 | Adl-Tabatabai |
| 6,173,317 B1 | 1/2001 | Chaddha et al. |
| 6,188,995 B1 | 2/2001 | Garst et al. |
| 6,216,227 B1 | 4/2001 | Goldstein et al. |
| 6,223,346 B1 | 4/2001 | Tock |
| 6,229,537 B1 | 5/2001 | Sobeski et al. |
| 6,230,172 B1 | 5/2001 | Purnaveja et al. |
| 6,230,182 B1 | 5/2001 | Le et al. |
| 6,233,582 B1 | 5/2001 | Traversat et al. |
| 6,253,256 B1 | 6/2001 | Wollrath et al. |
| 6,260,077 B1 | 7/2001 | Rangarajan et al. |
| 6,260,078 B1 | 7/2001 | Fowlow |
| 6,282,568 B1 | 8/2001 | Sondur et al. |
| 6,289,504 B1 | 9/2001 | Cierniak et al. |
| 6,289,506 B1 | 9/2001 | Kwong et al. |
| 6,308,315 B1 | 10/2001 | Dice et al. |
| 6,317,869 B1 | 11/2001 | Adl-Tabatabai et al. |
| 6,349,333 B1 | 2/2002 | Panikatt et al. |
| 6,349,344 B1 | 2/2002 | Sauntry et al. |
| 6,366,898 B2 | 4/2002 | Taivalsaari et al. |
| 6,367,012 B1 | 4/2002 | Atkinson et al. |
| 6,370,685 B1 | 4/2002 | Robison |
| 6,401,134 B1 | 6/2002 | Razavi et al. |
| 6,407,759 B1 | 6/2002 | Kanungo et al. |
| 6,415,334 B1 | 7/2002 | Kanamori |
| 6,418,444 B1 | 7/2002 | Raduchel et al. |
| 6,427,153 B2 | 7/2002 | Nelson et al. |
| 6,430,567 B2 | 8/2002 | Burridge |
| 6,446,084 B1 | 9/2002 | Shaylor et al. |
| 6,459,097 B1 | 10/2002 | Zagoskin |
| 6,466,974 B1 | 10/2002 | Nelson et al. |
| 6,484,188 B1 | 11/2002 | Kwong et al. |
| 6,484,311 B2 | 11/2002 | Sobeski et al. |
| 6,484,312 B1 | 11/2002 | Morrison |
| 6,499,035 B1 | 12/2002 | Sobeski |
| 6,504,172 B2 | 1/2003 | Zagoskin et al. |
| 6,504,554 B1 | 1/2003 | Stone et al. |
| 6,522,343 B2 | 2/2003 | Sobeski et al. |
| 6,537,847 B2 | 3/2003 | Zagoskin et al. |
| RE38,104 E | 4/2003 | Gosling |
| 6,542,900 B1 | 4/2003 | Xia |
| 6,563,310 B2 | 5/2003 | Zagoskin |
| 6,563,311 B2 | 5/2003 | Zagoskin |
| 6,573,202 B2 | 6/2003 | Ivanov et al. |
| 6,576,951 B2 | 6/2003 | Ivanov et al. |
| 6,580,102 B2 | 6/2003 | Ivanov et al. |
| 6,605,822 B1 | 8/2003 | Blais et al. |
| 6,611,864 B2 | 8/2003 | Putzolu et al. |
| 6,614,047 B2 | 9/2003 | Tzalenchuk et al. |
| 6,625,803 B1 | 9/2003 | Massena et al. |
| 6,627,915 B1 | 9/2003 | Ustinov et al. |
| 6,627,916 B2 | 9/2003 | Amin et al. |
| 6,633,876 B1 | 10/2003 | Heatlie |
| 6,637,021 B1 | 10/2003 | Dubey |
| 6,651,140 B1 | 11/2003 | Kumar |
| 6,661,943 B2 | 12/2003 | Li |
| 6,665,865 B1 | 12/2003 | Ruf |
| 6,670,630 B2 | 12/2003 | Blais et al. |
| 6,711,739 B1 | 3/2004 | Kutcher |
| 6,721,777 B1 | 4/2004 | Sharma |
| 6,728,131 B2 | 4/2004 | Ustinov |
| 6,742,006 B2 | 5/2004 | Raduchel et al. |
| 6,745,387 B1 | 6/2004 | Ng et al. |
| 6,748,588 B1 | 6/2004 | Fraser et al. |
| 6,751,790 B2 | 6/2004 | Sokolov et al. |
| 6,753,546 B2 | 6/2004 | Tzalenchuk et al. |
| 6,754,796 B2 | 6/2004 | Sokolov et al. |
| 6,766,349 B1 | 7/2004 | Belkin |
| 6,772,178 B2 | 8/2004 | Mandal et al. |
| 6,784,451 B2 | 8/2004 | Amin et al. |
| 6,791,109 B2 | 9/2004 | Tzalenchuk et al. |
| 6,799,185 B2 | 9/2004 | Wallman et al. |
| 6,803,599 B2 | 10/2004 | Amin et al. |
| 6,804,681 B2 | 10/2004 | Sokolov et al. |
| 6,812,484 B2 | 11/2004 | Tzalenchuk et al. |
| 6,822,255 B2 | 11/2004 | Tzalenchuk et al. |
| 6,823,140 B1 | 11/2004 | Davidson |
| 6,823,504 B1 | 11/2004 | Sokolov |
| 6,839,647 B2 | 1/2005 | Volkov et al. |
| 6,850,953 B1 | 2/2005 | Deshpande et al. |
| 6,854,114 B1 | 2/2005 | Sexton et al. |
| 6,854,122 B1 | 2/2005 | Sheriff et al. |
| 6,862,674 B2 | 3/2005 | Dice et al. |
| 6,873,984 B1 | 3/2005 | Campos et al. |
| 6,877,111 B2 | 4/2005 | Sharma et al. |
| 6,885,325 B2 | 4/2005 | Omelyanchouk et al. |
| 6,886,157 B2 | 4/2005 | Long et al. |
| 6,889,227 B1 | 5/2005 | Hamilton |
| 6,897,468 B2 | 5/2005 | Blais et al. |
| 6,898,786 B1 | 5/2005 | Sokolov |
| 6,900,454 B2 | 5/2005 | Blais et al. |
| 6,900,456 B2 | 5/2005 | Blais et al. |
| 6,901,591 B1 | 5/2005 | Sokolov |
| 6,905,887 B2 | 6/2005 | Amin et al. |
| 6,911,664 B2 | 6/2005 | Il'ichev et al. |
| 6,912,569 B1 | 6/2005 | Sharma et al. |
| 6,918,109 B2 | 7/2005 | Sokolov |
| 6,919,579 B2 | 7/2005 | Amin et al. |
| 6,922,796 B1 | 7/2005 | Matena et al. |
| 6,928,456 B2 | 8/2005 | Sadhasivan et al. |
| 6,930,320 B2 | 8/2005 | Blais et al. |
| 6,934,726 B2 | 8/2005 | Sokolov et al. |
| 6,934,946 B2 | 8/2005 | Sokolov et al. |
| 6,936,841 B2 | 8/2005 | Amin et al. |
| 6,943,368 B2 | 9/2005 | Amin et al. |
| 6,951,014 B1 | 9/2005 | Sokolov |
| 6,957,427 B1 | 10/2005 | Wollrath et al. |
| 6,957,428 B2 | 10/2005 | Sokolov et al. |
| 6,959,430 B2 | 10/2005 | Sokolov et al. |
| 6,960,780 B2 | 11/2005 | Blais et al. |
| 6,961,843 B2 | 11/2005 | O'Connor et al. |
| 6,961,933 B2 | 11/2005 | Sokolov |
| 6,964,033 B2 | 11/2005 | Wallman et al. |
| 6,976,061 B1 | 12/2005 | Sharma |
| 6,978,401 B2 | 12/2005 | Avvari et al. |
| 6,978,456 B1 | 12/2005 | Sokolov et al. |
| 6,979,836 B2 | 12/2005 | Zagoskin et al. |
| 6,980,979 B2 | 12/2005 | Huang et al. |
| 6,981,246 B2 | 12/2005 | Dunn |
| 6,981,255 B2 | 12/2005 | Kanamori |
| 6,983,465 B2 | 1/2006 | Mandal et al. |
| 6,986,129 B2 | 1/2006 | Arbouzov et al. |
| 6,987,282 B2 | 1/2006 | Amin et al. |
| 6,996,587 B2 | 2/2006 | Wagener et al. |
| 6,996,824 B2 | 2/2006 | Sokolov |
| 6,996,826 B2 | 2/2006 | Kanamori |
| 7,000,235 B2 | 2/2006 | Mandal et al. |
| 7,002,174 B2 | 2/2006 | Il'ichev et al. |
| 7,003,778 B2 | 2/2006 | Sokolov |
| 7,015,499 B1 | 3/2006 | Zagoskin |
| 7,016,966 B2 | 3/2006 | Saulpaugh et al. |
| 7,018,852 B2 | 3/2006 | Wu et al. |
| 7,032,216 B1 | 4/2006 | Nizhegorodov |
| 7,039,904 B2 | 5/2006 | Sokolov |
| 7,042,005 B2 | 5/2006 | Il'ichev et al. |
| 7,043,732 B2 | 5/2006 | Mandal et al. |
| 7,043,738 B2 | 5/2006 | Mandal et al. |
| 7,047,524 B1 | 5/2006 | Braddock, Jr. |

(56) References Cited

U.S. PATENT DOCUMENTS

| | | |
|---|---|---|
| 7,054,890 B2 | 5/2006 | Musante et al. |
| 7,055,133 B2 | 5/2006 | Plummer et al. |
| 7,058,934 B2 | 6/2006 | Sokolov |
| 7,065,747 B2 | 6/2006 | Sokolov et al. |
| 7,069,554 B1 | 6/2006 | Stammers et al. |
| 7,096,467 B2 | 8/2006 | Wallman et al. |
| 7,109,593 B2 | 9/2006 | Freedman et al. |
| 7,117,489 B2 | 10/2006 | Wallman et al. |
| 7,130,773 B1 | 10/2006 | Wong |
| 7,131,111 B2 | 10/2006 | Passanisi |
| 7,131,120 B2 | 10/2006 | Veselov |
| 7,135,701 B2 | 11/2006 | Amin et al. |
| 7,155,501 B2 | 12/2006 | Mandal et al. |
| 7,159,213 B2 | 1/2007 | Tock |
| 7,162,711 B2 | 1/2007 | Czajkowski et al. |
| 7,165,108 B2 | 1/2007 | Matena et al. |
| 7,167,894 B1 | 1/2007 | Boudnik et al. |
| 7,177,934 B2 | 2/2007 | Matena et al. |
| 7,181,724 B2 | 2/2007 | Sokolov et al. |
| 7,191,453 B2 | 3/2007 | Srinivasan et al. |
| 7,194,729 B2 | 3/2007 | Stone et al. |
| 7,197,750 B2 | 3/2007 | Wallman et al. |
| 7,209,960 B2 | 4/2007 | Veselov |
| 7,210,127 B1 | 4/2007 | Rangachari |
| 7,219,331 B2 | 5/2007 | Pabla |
| 7,228,533 B2 | 6/2007 | Sokolov |
| 7,230,266 B2 | 6/2007 | Hilton et al. |
| 7,240,338 B1 | 7/2007 | Bell et al. |
| 7,243,356 B1 | 7/2007 | Saulpaugh et al. |
| 7,246,134 B1 | 7/2007 | Kitain et al. |
| 7,246,345 B2 | 7/2007 | Sharma et al. |
| 7,250,624 B1 | 7/2007 | Freedman et al. |
| 7,251,066 B2 | 7/2007 | Chao et al. |
| 7,253,654 B2 | 8/2007 | Amin |
| 7,266,816 B1 | 9/2007 | Sharma et al. |
| 7,266,822 B1 | 9/2007 | Boudnik et al. |
| 7,268,576 B2 | 9/2007 | Amin |
| 7,290,045 B2 | 10/2007 | Mandal |
| 7,296,235 B2 | 11/2007 | Bhat et al. |
| 7,305,671 B2 | 12/2007 | Davidov et al. |
| 7,307,275 B2 | 12/2007 | Lidar et al. |
| 7,318,128 B1 | 1/2008 | Dice |
| 7,321,131 B2 | 1/2008 | Freedman et al. |
| 7,332,738 B2 | 2/2008 | Blais et al. |
| 7,335,909 B2 | 2/2008 | Amin et al. |
| 7,346,889 B1 | 3/2008 | Semenov et al. |
| 7,370,322 B1 | 5/2008 | Matena et al. |
| 7,376,547 B2 | 5/2008 | Meredith |
| 7,394,092 B2 | 7/2008 | Freedman et al. |
| 7,398,533 B1 | 7/2008 | Slaughter et al. |
| 7,409,439 B2 | 8/2008 | Raja et al. |
| 7,418,283 B2 | 8/2008 | Amin |
| 7,421,687 B1 | 9/2008 | Yellin et al. |
| 7,426,721 B1 | 9/2008 | Saulpaugh et al. |
| 7,448,042 B1 | 11/2008 | Engber et al. |
| 7,451,393 B1 | 11/2008 | Herbison et al. |
| 7,454,428 B2 | 11/2008 | Wang et al. |
| 7,461,395 B2 | 12/2008 | Ng |
| 7,480,921 B1 | 1/2009 | Vigesaa et al. |
| 7,490,330 B2 | 2/2009 | Sexton et al. |
| 7,509,631 B2 | 3/2009 | Lucas et al. |
| 7,518,138 B2 | 4/2009 | Freedman et al. |
| 7,533,068 B2 | 5/2009 | Maassen van den Brink et al. |
| 7,533,156 B1 | 5/2009 | Jeyaraman et al. |
| 7,543,288 B2 | 6/2009 | Sokolov et al. |
| 7,546,590 B2 | 6/2009 | Stone et al. |
| 7,546,605 B1 | 6/2009 | Kruger et al. |
| 7,548,946 B1 | 6/2009 | Saulpaugh et al. |
| 7,565,647 B2 | 7/2009 | Davidov et al. |
| 7,566,896 B2 | 7/2009 | Freedman et al. |
| 7,574,710 B1 | 8/2009 | Jeyaraman et al. |
| 7,584,302 B1 | 9/2009 | Pg et al. |
| 7,598,514 B2 | 10/2009 | Freedman et al. |
| 7,605,600 B2 | 10/2009 | Harris |
| 7,613,764 B1 | 11/2009 | Hilton et al. |
| 7,613,765 B1 | 11/2009 | Hilton et al. |
| 7,619,437 B2 | 11/2009 | Thom et al. |
| 7,624,088 B2 | 11/2009 | Johnson et al. |
| 7,634,779 B2 | 12/2009 | Foote et al. |
| 7,639,035 B2 | 12/2009 | Berkley |
| 7,644,403 B2 | 1/2010 | Atsatt |
| 7,647,415 B1 | 1/2010 | Sandoz et al. |
| 7,650,505 B1 | 1/2010 | Masurkar |
| 7,685,430 B1 | 3/2010 | Masurkar |
| 7,687,938 B2 | 3/2010 | Bunyk et al. |
| 7,716,274 B1 | 5/2010 | Kumar |
| 7,716,339 B2 | 5/2010 | Chitilian et al. |
| 7,720,877 B1 | 5/2010 | Kumar |
| 7,730,492 B1 | 6/2010 | Blaukopf et al. |
| 7,730,523 B1 | 6/2010 | Masurkar |
| 7,739,665 B2 | 6/2010 | Stone et al. |
| 7,752,626 B1 | 7/2010 | Pandey et al. |
| 7,784,043 B2 | 8/2010 | Atsatt |
| 7,788,192 B2 | 8/2010 | Amin |
| 7,788,489 B2 | 8/2010 | Ng |
| 7,793,255 B1 | 9/2010 | Kawaguchi et al. |
| 7,800,395 B2 | 9/2010 | Johnson et al. |
| 7,802,239 B2 | 9/2010 | Hamilton |
| 7,802,240 B2 | 9/2010 | Reinhold |
| 7,814,472 B2 | 10/2010 | Atsatt |
| 7,827,535 B2 | 11/2010 | Maron |
| 7,840,939 B1 | 11/2010 | Chinnici |
| 7,840,967 B1 | 11/2010 | Czajkowski et al. |
| 7,843,209 B2 | 11/2010 | Berkley |
| 7,844,656 B2 | 11/2010 | Macready et al. |
| 7,870,087 B2 | 1/2011 | Macready et al. |
| 7,870,112 B2 | 1/2011 | Karun et al. |
| 7,873,951 B1 | 1/2011 | Bissett et al. |
| 7,873,979 B1 | 1/2011 | Foote et al. |
| 7,876,248 B2 | 1/2011 | Berkley et al. |
| 7,877,333 B2 | 1/2011 | Macready |
| 7,880,529 B2 | 2/2011 | Amin |
| 7,898,282 B2 | 3/2011 | Harris et al. |
| 7,899,852 B2 | 3/2011 | Amin |
| 7,900,215 B2 | 3/2011 | Engber et al. |
| 7,921,169 B2 | 4/2011 | Jacobs et al. |
| 7,925,952 B1 | 4/2011 | Katz et al. |
| 7,932,515 B2 | 4/2011 | Bunyk |
| 7,949,760 B2 | 5/2011 | Chitilian et al. |
| 7,953,773 B2 | 5/2011 | Lindholm et al. |
| 7,962,527 B2 | 6/2011 | Simpson |
| 7,962,902 B2 | 6/2011 | Chow et al. |
| 7,962,925 B2 | 6/2011 | Fry et al. |
| 7,969,805 B2 | 6/2011 | Thom et al. |
| 7,984,012 B2 | 7/2011 | Coury et al. |
| 7,990,662 B2 | 8/2011 | Berkley et al. |
| 8,008,942 B2 | 8/2011 | van den Brink et al. |
| 8,008,991 B2 | 8/2011 | Teaciuc et al. |
| 8,018,244 B2 | 9/2011 | Berkley |
| 8,027,925 B1 | 9/2011 | Garst et al. |
| 8,032,474 B2 | 10/2011 | Macready et al. |
| 8,032,872 B2 | 10/2011 | Violleau et al. |
| 8,046,772 B2 | 10/2011 | Upton |
| 8,064,065 B2 | 11/2011 | Bennett |
| 8,082,489 B2 | 12/2011 | Jiang |
| 8,156,482 B2 | 4/2012 | Lagergren |
| 8,180,746 B2 | 5/2012 | Somogyi et al. |
| 8,195,721 B2 | 6/2012 | Lindholm et al. |
| 8,196,128 B2 | 6/2012 | Susarla et al. |
| 8,219,609 B1 | 7/2012 | Bhattacharjee et al. |
| 8,245,206 B2 | 8/2012 | Lagergren et al. |
| 8,250,572 B2 | 8/2012 | Dahlstedt |
| 8,255,680 B1 | 8/2012 | Gong |
| 8,261,269 B2 | 9/2012 | Garmark |
| 8,316,083 B2 | 11/2012 | Xiao et al. |
| 8,321,450 B2 | 11/2012 | Thatte et al. |
| 8,332,835 B2 | 12/2012 | Atsatt |
| 8,365,157 B2 | 1/2013 | Lagergren |
| 8,387,076 B2 | 2/2013 | Thatte et al. |
| 8,426,871 B2 | 4/2013 | Rapoport et al. |
| 8,429,650 B2 | 4/2013 | Ferwerda et al. |
| 8,452,712 B2 | 5/2013 | Garst et al. |
| 8,463,852 B2 | 6/2013 | Sposetti et al. |
| 8,490,120 B2 | 7/2013 | Cable |

(56) References Cited

U.S. PATENT DOCUMENTS

| | | |
|---|---|---|
| 8,495,107 B2 | 7/2013 | Khanna |
| 8,533,383 B2 | 9/2013 | Ohrstrom et al. |
| 8,533,621 B1 * | 9/2013 | Meddaugh .......... G06F 3/04895 |
| | | 715/773 |
| 8,555,264 B2 | 10/2013 | Ohrstrom |
| 8,566,826 B2 | 10/2013 | Garmark |
| 8,572,579 B2 | 10/2013 | Ashish et al. |
| 8,581,227 B2 | 11/2013 | Freedman et al. |
| 8,601,447 B2 | 12/2013 | Browne et al. |
| 8,615,734 B2 | 12/2013 | Susarla et al. |
| 8,627,328 B2 | 1/2014 | Mousseau et al. |
| 8,635,185 B2 | 1/2014 | Somogyi et al. |
| 8,635,660 B2 | 1/2014 | Ng et al. |
| 8,639,787 B2 | 1/2014 | Lagergren et al. |
| 8,661,407 B2 | 2/2014 | Siegemund et al. |
| 8,695,006 B2 | 4/2014 | Grieve et al. |
| 8,713,546 B2 | 4/2014 | Lagergren |
| 8,732,191 B2 | 5/2014 | Somogyi et al. |
| 8,744,075 B2 | 6/2014 | Tanaka |
| 8,776,053 B2 | 7/2014 | Lagergren et al. |
| 8,781,971 B2 | 7/2014 | Garst, Jr. et al. |
| 8,793,670 B2 | 7/2014 | Lagergren |
| 8,799,885 B2 | 8/2014 | Atsatt |
| 8,805,896 B2 | 8/2014 | Khanna |
| 8,806,493 B2 | 8/2014 | Dahlstedt |
| 8,813,031 B2 | 8/2014 | Agarwal |
| 8,826,246 B2 | 9/2014 | Lagergren et al. |
| 8,832,710 B2 | 9/2014 | Mousseau et al. |
| 8,838,669 B2 | 9/2014 | Cable |
| 8,850,412 B2 | 9/2014 | Bovet et al. |
| 8,856,294 B2 | 10/2014 | Lagergren et al. |
| 8,856,460 B2 | 10/2014 | Bihani et al. |
| 8,856,805 B2 | 10/2014 | Poore et al. |
| 8,863,126 B2 | 10/2014 | Poore et al. |
| 8,875,094 B2 | 10/2014 | Kalyanasundaram |
| 8,875,113 B2 | 10/2014 | Wagner et al. |
| 8,881,099 B2 | 11/2014 | Gallagher |
| 8,924,789 B2 | 12/2014 | Larsen et al. |
| 8,959,106 B2 | 2/2015 | de Castro Alves et al. |
| 8,959,485 B2 | 2/2015 | Kvartskhava et al. |
| 8,965,950 B2 | 2/2015 | Clinick et al. |
| 8,978,023 B2 | 3/2015 | Poore et al. |
| 9,037,542 B2 | 5/2015 | Mishra |
| 9,043,768 B2 | 5/2015 | Ohrstrom |
| 9,058,471 B2 | 6/2015 | Sastry et al. |
| 9,141,539 B2 | 9/2015 | Ahmad |
| 9,152,924 B2 | 10/2015 | Bonderson et al. |
| 9,160,749 B2 | 10/2015 | Subramanian et al. |
| 9,171,096 B2 | 10/2015 | Palanisamy et al. |
| 9,177,033 B2 | 11/2015 | Ilitchev et al. |
| 9,183,013 B2 | 11/2015 | Lagergren |
| 9,185,054 B2 | 11/2015 | Revanuru et al. |
| 9,213,562 B2 | 12/2015 | Veresov |
| 9,231,995 B2 | 1/2016 | Junnarkar et al. |
| 9,239,814 B2 | 1/2016 | Lagergren et al. |
| 9,246,602 B2 | 1/2016 | Ukita et al. |
| 9,256,834 B2 | 2/2016 | Bonderson et al. |
| 9,411,566 B2 | 8/2016 | Ohrstrom |
| 9,417,992 B2 | 8/2016 | Huang et al. |
| 9,430,222 B2 | 8/2016 | Denise et al. |
| 9,448,928 B2 | 9/2016 | Ahad et al. |
| 9,467,355 B2 | 10/2016 | Doering et al. |
| 9,509,745 B2 | 11/2016 | Gangadharan et al. |
| 9,519,466 B2 | 12/2016 | Delsart |
| 9,542,222 B2 | 1/2017 | Mousseau et al. |
| 9,552,277 B2 | 1/2017 | Deshmukh et al. |
| 9,588,047 B2 | 3/2017 | Jungwirth et al. |
| 9,588,742 B2 | 3/2017 | Shakespeare et al. |
| 9,600,546 B2 | 3/2017 | Shivarudraiah et al. |
| 9,626,488 B2 | 4/2017 | Traversat et al. |
| 9,648,084 B2 | 5/2017 | Bihani et al. |
| 9,667,430 B2 | 5/2017 | Connelly |
| 9,715,950 B2 | 7/2017 | Jungwirth et al. |
| 9,740,597 B2 | 8/2017 | Rose et al. |
| 9,766,071 B2 | 9/2017 | Compton et al. |
| 9,804,946 B2 | 10/2017 | Conlon et al. |
| 9,811,359 B2 | 11/2017 | Bansal |
| 9,843,629 B2 | 12/2017 | Abdelaziz et al. |
| 9,875,122 B2 | 1/2018 | Dahlstedt |
| 9,880,938 B2 | 1/2018 | Shivarudraiah et al. |
| 9,904,668 B2 | 2/2018 | Bruno et al. |
| 9,930,129 B2 | 3/2018 | Felts et al. |
| 9,952,841 B2 | 4/2018 | Lattner et al. |
| 9,971,618 B2 | 5/2018 | Lagergren et al. |
| 10,049,127 B1 | 8/2018 | Shavit et al. |
| 10,103,946 B2 | 10/2018 | Xiao et al. |
| 10,115,116 B2 | 10/2018 | Livshits et al. |
| 10,127,259 B2 | 11/2018 | Tian et al. |
| 10,133,827 B2 | 11/2018 | Then et al. |
| 10,145,792 B2 | 12/2018 | Jungwirth et al. |
| 10,225,323 B2 | 3/2019 | Revanuru et al. |
| 10,229,032 B2 | 3/2019 | Ashish et al. |
| 10,268,456 B2 | 4/2019 | Kalyanasundaram et al. |
| 10,268,622 B2 | 4/2019 | Hilton et al. |
| 10,272,400 B2 | 4/2019 | Staheli et al. |
| 10,275,422 B2 | 4/2019 | Israel et al. |
| 10,290,798 B2 | 5/2019 | Harris et al. |
| 10,291,326 B2 * | 5/2019 | Glatfelter .......... H04B 10/25891 |
| 10,318,881 B2 | 6/2019 | Rose et al. |
| 10,320,360 B2 | 6/2019 | Wiebe et al. |
| 10,320,394 B1 | 6/2019 | Powell et al. |
| 10,324,692 B2 | 6/2019 | Alabes et al. |
| 10,326,071 B2 | 6/2019 | Uchaykin |
| 10,331,163 B1 | 6/2019 | Luo |
| 10,340,052 B2 | 7/2019 | Jungwirth et al. |
| 10,346,348 B2 | 7/2019 | Hastings et al. |
| 10,346,349 B2 | 7/2019 | Maassen van den Brink et al. |
| 10,346,508 B2 | 7/2019 | Amin et al. |
| 10,346,761 B2 | 7/2019 | Clarke et al. |
| 10,366,339 B2 | 7/2019 | Bocharov et al. |
| 10,373,139 B2 | 8/2019 | Traversat et al. |
| 10,374,610 B1 | 8/2019 | Braun |
| 10,378,803 B2 | 8/2019 | Uchaykin |
| 10,411,713 B2 | 9/2019 | Harms et al. |
| 10,417,370 B2 | 9/2019 | Hastings et al. |
| 10,423,887 B2 | 9/2019 | Roetteler et al. |
| 10,430,162 B2 | 10/2019 | Roetteler et al. |
| 10,453,894 B2 | 10/2019 | Ladizinsky et al. |
| 10,454,015 B2 | 10/2019 | Lanting et al. |
| 10,467,543 B2 | 11/2019 | Macready et al. |
| 10,467,545 B2 | 11/2019 | Harris |
| 10,468,793 B2 | 11/2019 | Petroff et al. |
| 10,469,087 B1 | 11/2019 | Granade et al. |
| 10,474,998 B2 | 11/2019 | Xiao et al. |
| 10,476,938 B2 | 11/2019 | Barnes et al. |
| 10,489,477 B2 | 11/2019 | Lanting |
| 10,490,600 B2 | 11/2019 | Freedman et al. |
| 10,496,933 B1 | 12/2019 | Karzig |
| 10,507,385 B2 | 12/2019 | Lyden |
| 10,520,024 B2 | 12/2019 | Jin |
| 10,528,886 B2 | 1/2020 | Boothby |
| 10,546,621 B2 | 1/2020 | Murduck et al. |
| 10,547,664 B2 | 1/2020 | Kinebuchi et al. |
| 10,552,755 B2 | 2/2020 | Lanting et al. |
| 10,552,757 B2 | 2/2020 | Amin et al. |
| 10,558,434 B2 | 2/2020 | Shakespeare et al. |
| 10,574,268 B2 | 2/2020 | Hastings |
| 10,586,566 B1 | 3/2020 | Stafford |
| 10,599,988 B2 | 3/2020 | Thom et al. |
| 10,606,568 B2 | 3/2020 | Hou |
| 10,621,140 B2 | 4/2020 | Raymond |
| 10,635,988 B2 | 4/2020 | Lutchyn et al. |
| 10,635,990 B1 | 4/2020 | Park et al. |
| 10,651,808 B2 | 5/2020 | Egan et al. |
| 10,657,198 B2 | 5/2020 | Amin et al. |
| 10,664,249 B2 | 5/2020 | Amy et al. |
| 10,664,761 B2 | 5/2020 | Haener et al. |
| 10,665,701 B2 | 5/2020 | Freedman et al. |
| 10,671,937 B2 | 6/2020 | Yarkoni et al. |
| 10,691,633 B2 | 6/2020 | Maassen Van Den Brink et al. |
| 10,692,010 B2 | 6/2020 | Freedman et al. |
| 10,699,208 B2 | 6/2020 | Wiebe et al. |
| 10,699,209 B2 | 6/2020 | Haener et al. |
| 10,700,256 B2 | 6/2020 | Ladizinsky et al. |

(56) References Cited

U.S. PATENT DOCUMENTS

| | | |
|---|---|---|
| 10,733,524 B1 | 8/2020 | Feig et al. |
| 10,740,689 B2 | 8/2020 | Kliuchnikov et al. |
| 10,748,079 B2 | 8/2020 | Boothby |
| 10,755,190 B2 | 8/2020 | Tcaciuc et al. |
| 10,760,954 B2 | 9/2020 | Lust |
| 10,769,545 B2 | 9/2020 | Amin et al. |
| 10,777,605 B2 | 9/2020 | Freedman et al. |
| 10,789,329 B2 | 9/2020 | Lanting |
| 10,789,540 B2 | 9/2020 | King et al. |
| 10,804,871 B1 | 10/2020 | Reed et al. |
| 10,809,592 B2 | 10/2020 | Dutt et al. |
| 10,811,587 B2 | 10/2020 | Braun |
| 10,817,796 B2 | 10/2020 | Macready et al. |
| 10,826,975 B2 | 11/2020 | Revanuru et al. |
| 10,846,608 B2 | 11/2020 | Haah et al. |
| 10,860,759 B2 | 12/2020 | Roetteler et al. |
| 10,879,464 B2 | 12/2020 | Krogstrup Jeppesen et al. |
| 10,885,459 B2 | 1/2021 | Biamonte et al. |
| 10,891,554 B2 | 1/2021 | Harris et al. |
| 10,897,068 B2 | 1/2021 | Tcaciuc et al. |
| 10,922,381 B2 | 2/2021 | Amin et al. |
| 10,938,346 B2 | 3/2021 | Berkley et al. |
| 10,951,002 B1 | 3/2021 | Bohn et al. |
| 10,963,125 B2 | 3/2021 | Gupta et al. |
| 10,972,133 B2 | 4/2021 | Chamberland et al. |
| 10,990,677 B2 | 4/2021 | Wiebe et al. |
| 10,991,755 B2 | 4/2021 | Ladizinsky et al. |
| 10,991,802 B2 | 4/2021 | Pillarisetty et al. |
| 10,992,166 B2 | 4/2021 | Hsieh et al. |
| 10,997,337 B2 | 5/2021 | Low et al. |
| 10,997,522 B1 | 5/2021 | Hayes et al. |
| 11,003,046 B2 | 5/2021 | Liscidini et al. |
| 11,004,008 B2 | 5/2021 | Bocharov et al. |
| 11,010,450 B2 | 5/2021 | Granade et al. |
| 11,010,682 B2 | 5/2021 | Bocharov et al. |
| 11,010,683 B2 | 5/2021 | Amin et al. |
| 11,010,684 B2 | 5/2021 | Pikulin |
| 11,023,821 B2 | 6/2021 | Harris et al. |
| 11,031,537 B2 | 6/2021 | Harris et al. |
| 11,038,095 B2 | 6/2021 | Huang et al. |
| 11,042,811 B2 | 6/2021 | Rolfe et al. |
| 11,062,227 B2 | 7/2021 | Amin et al. |
| 11,063,138 B2 | 7/2021 | Singh et al. |
| 11,064,637 B2 | 7/2021 | Sterling et al. |
| 11,075,293 B2 | 7/2021 | Roberts et al. |
| 11,081,634 B2 | 8/2021 | Lutchyn et al. |
| 11,093,440 B2 | 8/2021 | Maassen van den Brink et al. |
| 11,100,416 B2 | 8/2021 | Lanting et al. |
| 11,100,418 B2 | 8/2021 | Bunyk et al. |
| 11,101,352 B2 | 8/2021 | George et al. |
| 11,105,866 B2 | 8/2021 | Swenson et al. |
| 11,107,891 B2 | 8/2021 | Pillarisetty et al. |
| 11,113,084 B2 | 9/2021 | Kliuchnikov et al. |
| 11,119,773 B1 | 9/2021 | Soeken et al. |
| 11,120,359 B2 | 9/2021 | Granade et al. |
| 11,121,303 B2 | 9/2021 | Cassidy et al. |
| 11,125,773 B2 | 9/2021 | Guha et al. |
| 11,127,820 B2 | 9/2021 | Manfra et al. |
| 11,127,893 B2 | 9/2021 | Johnson et al. |
| 11,132,617 B2 | 9/2021 | Haah et al. |
| 11,138,354 B2 | 10/2021 | Gukelberger et al. |
| 11,138,511 B2 | 10/2021 | Yarkoni et al. |
| 11,151,470 B2 | 10/2021 | Pikulin et al. |
| 11,157,817 B2 | 10/2021 | Rolfe |
| 11,157,828 B2 | 10/2021 | Wiebe et al. |
| 11,158,714 B2 | 10/2021 | Pillarisetty et al. |
| 11,158,731 B2 | 10/2021 | Pillarisetty et al. |
| 11,170,302 B2 | 11/2021 | Wiebe et al. |
| 11,177,375 B2 | 11/2021 | Roberts et al. |
| 11,177,912 B2 | 11/2021 | Elsherbini et al. |
| 11,182,230 B2 | 11/2021 | Berkley et al. |
| 11,188,842 B2 | 11/2021 | Kliuchnikov et al. |
| 11,202,960 B2 | 12/2021 | Lyden |
| 11,281,972 B2 * | 3/2022 | Shen ................... G06E 3/005 |
| 2006/0262876 A1 * | 11/2006 | LaDue ................. H04W 4/18 |
| | | 375/295 |
| 2006/0262879 A1 | 11/2006 | Smith et al. |
| 2012/0141135 A1 * | 6/2012 | Yang ................... H04L 1/0065 |
| | | 398/140 |
| 2016/0112141 A1 * | 4/2016 | Rahn ................... H04J 14/02 |
| | | 398/79 |
| 2016/0112414 A1 | 4/2016 | Tsou |
| 2017/0075660 A1 * | 3/2017 | Zhang ................... G06F 8/31 |
| 2017/0364334 A1 * | 12/2017 | Liu ..................... G06F 9/451 |
| 2019/0179572 A1 * | 6/2019 | Bradbury ............. H03M 7/30 |
| 2022/0062756 A1 | 3/2022 | Lyden |

FOREIGN PATENT DOCUMENTS

| | | | | |
|---|---|---|---|---|
| CN | 107872289 A | * | 4/2018 | ........ H04B 10/524 |
| JP | 4757162 B2 | * | 8/2011 | |
| JP | 7090148 B2 | | 6/2022 | |

OTHER PUBLICATIONS

Frenzel, "Understanding Modern Digital Modulation Techniques," published on Jul. 14, 2021 on ElectronicDesign website: https://www.electronicdesign.com/technologies/communications/article/21798737/understanding-modern-digital-modulation-techniques.

Article entitled: "Coherent Binary Modulation techniques" published online by an unknown author, date unknown, on the website: https://ee.eng.usm.my/eeacad/mandeep/EEE436/Chp%204.pdf.

Jenic, "7 Best Oscilloscope Software for Windows," published on Apr. 15, 2020 on windowsreport website: https://windowsreport.com/oscilloscope-software-pc-laptop.

Jefferson, "Research Brings Analog Computers Just One Step From Digital," published on Dec. 8, 2021 on Techxplore website: https://techxplore.com/news/2021-12-analog-digital.html.

Baldwin, "Fun With Java, Understanding the Fast Fourier Transform (FFT) Algorithm," published on Jan. 5, 2005 on the website: https://developer.com/java/fun-with-Java-understanding-the-fast-fourier-transform-fft-algorithm/.

Article entitled "FFT.java," published online by an unknown author on Jan. 14, 2020 by Princeton University on the website, https://introcs.cs.princeton.edu/java/97data/FFT.java.html.

Service," Light-Based Memory Chip is the First to Permanently Store Data," published on Sep. 25, 2015 on the website: https://www.science.org/content/article/light-based-memory-chip-first-permanently-store-data.

"New Optical Memory Cell Achieves Record Data-Storage Density," published by the Oxford News Blog on Dec. 21, 2018 on the website: https://www.ox.ac.uk/news/science-blog/new-optical-memory-cell-achieves-record-data-storage-density-0.

Platt, "The Unbelievable Zombie Comeback of Analog Computing" Backchannel, Wired Magazine, Mar. 30, 2023.

Prosecution history from corresponding U.S. Appl. No. 17/577,922, filed Jan. 18, 2022 including: Notice of Allowance and Fee(s) Due mailed Aug. 18, 2023; and Non-Final Rejection mailed Mar. 31, 2023.

* cited by examiner

COMPUTER LANGUAGE AND CODE FOR APPLICATION DEVELOPMENT AND ELECTRONIC AND OPTICAL COMMUNICATION

CROSS-REFERENCE TO RELATED APPLICATION

The present application is a continuation of and claims priority of U.S. patent application Ser. No. 17/577,922, filed Jan. 18, 2022, the content of which is hereby incorporated by reference in its entirety.

FIELD

The disclosure relates to a computer language and code for software application development, data compression, and use with conventional, optical, hybrid electro-optical and quantum computers.

BACKGROUND

For many years, computer languages and codes have used the binary number system and different series of zeros (0's) and ones (1's) to represent, manipulate, communicate, and store data and information. In 1963, the American Standard Code For Information Exchange (ASCII) developed the original ASCII code which included 128 characters and used 7 bit character encodings. The ASCII code was later succeeded in 1986 by the ISO/IEC 8859 code which expanded ASCII and used 8 bit character encodings. In 1991, the Unicode Consortium then published the first Universal Coded Character Set (USC) Unicode standard which has over 1.1 million possible code points available for use. The Unicode standard has since been updated many times and it is also synchronized with the work of the International Organization for Standardization (ISO) which develops and publishes international standards, and while not being identical with Unicode which is updated more frequently, the current version of ISO/IEC 10646 is largely consistent with Unicode.

In this regard, when using the binary number system each letter of the alphabet as well as other numbers, symbols, and operations are typically identified using at least 8 bits made of zeros (0's) and ones (1's) something which is known as one byte of information. Accordingly, to reproduce and communicate the simple phrase "Run Tag Run" requires at least 72 bits or 9 bytes of digital information. This digital information is most often communicated digitally in the form of a series of square waves with the top of the square wave which corresponds to its maximum amplitude being used to represent the number 1, whereas a portion of the signal having less amplitude or resting at zero is used to represent the value 0. The data is typically communicated, manipulated, and stored with the use of switches which can be either placed in an "on" and closed state which is typically represented by the number 1, or an "off" and open state which is often represented by the value 0 by using millions of small transistors which are included on a Central Processing Unit (CPU) logic chip or memory chip, or alternatively by using capacitors which can store an electrical charge. These transistor switches or capacitors are typically configured to indicate one of three different states or conditions, namely, an "and" state, an "or" state, or a "not" state. In this regard, typical laptop computers and other home computers are not configured today so as to be able to provide a state that represents the possibility of both 1 and 0, "and" and "or", "yes" and "no", or "maybe" at the same time. As a result, the use of the binary system in digital communication is associated in a long string or series of bits which are typically communicated and processed sequentially which can take considerable time and also consume substantial memory. Further, the use of the binary system for representing numbers and mathematical operations can result in certain inaccuracies. The present disclosure is directed to a computer language, and code for software application development which can replace and/or work in association with the binary number system and digital forms of communication.

The ability to make smaller and faster computer chips in order to enhance the performance of computers is beginning to hit certain limitations or barriers having to do with limited space. In this regard, one MegaHerz (MHz) equals 1,000,000 or one million cycles per second. One GigaHerz (GHz) equals 1,000,000,000 or one trillion cycles per second, one TeraHerz (THz) equals 1,000,000,000,000 cycles per second, and one PicoHerz (PHz) equals 0.000000000001_cycles per second. One picosecond is $10^{-12}$ and 000000000001 second, and one femtosecond is $10^{-15}$ and 0.000000000000001 second. The speed of light is 299,792,458 meters/second, thus light travels 299.792458 meters in one MHz cycle. One mm equals 1,000,000 nanometers (nm). A petabit equals a terabit times 1,000 which is 1,000,000,000,000,000 bits. A gigabyte contains 8,000,000,000 bits, and a terabyte equals 1,000.

Some individuals are calling the next stage of evolution in computer technology quantum computing. The quantum computing market is anticipated to reach 65 billion by 2030. In order to perform quantum computing various complex structures such as artificial neural networks composed of artificial neurons or nodes are being created which attempt to reproduce or emulate the complex structure and function of the human brain. A simple neural network typically includes an input layer, and hidden layer, and an output layer. Some neural networks and other structures associated with present efforts to create artificial intelligence can permit what is called quantum entanglement which is known to be the exchange of quantum information between two particles at a distance. Quantum superposition is different principle of quantum physics which holds that somewhat like waves in classical physics it is possible for two or more quantum states to be added together and superposed to create another valid quantum state, and that the resultant quantum state can be represented as a sum of two or more quantum states. In this regard, superposition is held to be the uncertainly of a particle being in several states at once which is called a superposition state. Accordingly, quantum computers which can include neural networks and are capable of producing entanglement and/or superposition can not only represent and process a "yes" or "no," and/or "1" or "0" like conventional computers, but rather they can also process the possibility of "yes" and "no," "1" and "0", or "maybe." The condition associated with both of these possibilities is called a superposition state. Accordingly, the data and information obtained from these quantum states is typically referred to as a quantum bit, or "qubit(s)." As the scale of conventional transistor making on silicon CPU's approaches the molecular and atomic level, and the desire for faster computing speeds using electrons in metal wires results in increases in heat production and energy use, the introduction of optical computers, hybrid electro-optical computers, and quantum computers holds promise for the future.

Optical computers which are sometimes also called photonic computers are being developed for performing complex and high speed quantum computing. In order to perform optical computing, it is necessary to have an optical processor, fiber optic cable, and optical storage. Instead of using electrons, an optical computer uses photons, that is, a form of light in the electromagnetic spectrum to communicate data and information, perform calculations, and to persist and store information in memory. In this regard, photons can move about 20 times faster than electrons, and photons do not suffer the resistance of electrons which instead move in metallic wires something which produces heat and requires greater energy consumption. There are two kinds of optical computers, that is, pure or complete optical computers, and electro-optical hybrid computers.

Visible light falls in the range of the electromagnetic spectrum between ultraviolet and infrared light. Visible light frequencies are between about $4 \times 10^{14}$ and $8 \times 10^{14}$ cycles per second (Hz) which is about 430-750 trillion Hz (THz) and have wavelengths in the range between approximately 380-740 nanometers (nm). The ultraviolet light spectrum includes wavelengths in the range between approximately 10 nm and 400 nm which corresponds to frequencies in the range between approximately 30 PHz-750 THz. The infrared light spectrum includes wavelengths in the range between approximately 700 nm-1 mm and corresponds to frequencies in the range between approximately 430 THz-300 GHz. In this regard, it is known that there can be some overlap as between the visible light spectrum and the infrared and ultraviolet light spectrums. Visible light frequencies and wavelengths correspond in duration of time to about 2 femtoseconds.

The University of California at Santa Barbara (UCSB) is one of the leading centers of optical computing research and development here in the United States. A number of companies including D-Wave Systems, Inc., Honeywell International, Inc., Google, IBM, Intel, Microsoft, and Xanadu Quantum Technologies, Inc. are working on making quantum computers. D-Wave Systems located in British Columbia, Canada has one of the largest patent portfolios in this subject area and can provide quantum computer products and services for the general public. At the present time, the leader in making a practical optical quantum computer is believed to be Xanadu Quantum Technologies, Inc. located in Toronto, Canada. The Xanadu X8 quantum photonic processor has been made available online. The Xanadu X8 photonic processor can be programmed using "Strawberry Fields," which is Xanadu's Python library for simulating and running programs on photonic quantum hardware and "PennyLane" which is the company's Python library for quantum machine learning and computing. In this regard, see the article published online in the IEEE Spectrum entitled "In the Race to Hundreds of Qubits, Photons May Have Quantum Advantage, by Charles Q. Choi, on Mar. 5, 2021: https://spectrum.ieee.org/race-to-hundreds-of-photonic-qubits-xanadu-scalable-photon.

U.S. patents relating to optical computers and/or quantum computers include: U.S. Pat. Nos. 11,182,230, 11,157,817, 11,138,511, 11,127,893, 11,105,866, 11,100,418, 11,100,416, 11,093,440, 11,064,637, 11,062,227, 11,042,811, 11,038,095, 11,031,537, 11,023,821, 11,010,683, 10,991,755, 10,938,346, 10,922,381, 10,897,068, 10,891,554, 10,885,459, 10,817,796, 10,789,540, 10,789,329, 10,769,545, 10,755,190, 10,748,079, 10,700,256, 10,691,633, 10,671,937, 10,657,198, 10,621,140, 10,599,988, 10,552,757, 10,552,755, 10,528,886, 10,489,477, 10,468,793, 10,467,545, 10,467,543, 10,454,015, 10,453,894, 10,378,803, 10,346,508, 10,346,349, 10,326,071, 10,318,881, 10,290,798, 10,275,422, 10,268,622, 11,182,230, 11,157,817, 11,138,511, 11,127,893, 11,105,866, 11,100,418, 11,100,416, 11,093,440, 11,064,637, 11,062,227, 11,042,811, 11,038,095, 11,031,537, 11,023,821, 11,010,683, 10,991,755, 10,938,346, 10,922,381, 10,897,068, 10,891,554, 10,885,459, 10,817,796, 10,789,540, 10,789,329, 10,769,545, 10,755,190, 10,748,079, 10,700,256, 10,691,633, 10,671,937, 10,657,198, 10,621,140, 10,599,988, 10,552,757, 10,552,755, 10,528,886, 10,489,477, 10,468,793, 10,467,545, 10,467,543, 10,454,015, 10,453,894, 10,378,803, 10,346,508, 10,346,349, 10,326,071, 10,318,881, 10,290,798, 10,275,422, 10,268,622, 8,032,474, 8,018,244, 8,008,991, 8,008,942, 7,990,662, 7,984,012, 7,969,805, 7,932,515, 7,899,852, 7,898,282, 7,880,529, 7,877,333, 7,876,248, 7,870,087, 7,844,656, 7,843,209, 7,800,395, 7,788,192, 7,687,938, 7,639,035, 7,624,088, 7,619,437, 7,613,765, 7,613,764, 7,605,600, 7,533,068, 7,418,283, 7,335,909, 7,332,738, 7,307,275, 7,268,576, 7,253,654, 7,230,266, 7,135,701, 7,042,005, 7,018,852, 7,015,499, 7,002,174, 6,987,282, 6,979,836, 6,960,780, 6,943,368, 6,936,841, 6,930,320, 6,919,579, 6,911,664, 6,905,887, 6,900,456, 6,900,454, 6,897,468, 6,885,325, 6,822,255, 6,812,484, 6,803,599, 6,791,109, 6,784,451, 6,753,546, 6,728,131, 6,670,630, 6,627,916, 6,627,915, 6,614,047, 6,605,822, 6,580,102, 6,576,951, 6,573,202, 6,563,311, 6,563,310, 6,537,847, 6,504,172, and 6,459,097 which are assigned to D-Wave Systems, Inc.; U.S. Pat. Nos. 10,997,522, 10,951,002, 10,804,871, 10,760,954, 10,733,524, 10,340,052, 10,145,792, 9,766,071, 9,715,950, 9,588,047, 8,426,871, and 4,128,843 which are assigned to Honeywell International, Inc.; U.S. Pat. Nos. 11,177,912, 11,177,375, 11,158,731, U.S. 11, 158,714, 11,107,891, U.S. Pat. Nos. 11,101,352, 11,075,293, 11,063,138, 10,991,802, 10,992,166, 10,635,990, and 6,661,943 which are assigned to the Intel Corporation; U.S. Pat. No. 8,064,065 assigned to Lawrence Livermore National Security, LLD.; U.S. Pat. Nos. 11,188,842, 11,170,302, 11,157,828, 11,151,470, 11,138,354, 11,132,617, 11,127,820, 11,121,303, 11,120,359, 11,119,773, 11,113,084, 11,081,634, 11,010,684, 11,010,682, 11,010,450, 11,004,008, 10,997,337, 10,990,677, 10,972,133, 10,963,125, 10,879,464, 10,860,759, 10,846,608, 10,811,587, 10,777,605, 10,740,689, 10,699,209, 10,699,208, 10,692,010, 10,665,701, 10,664,761, 10,664,249, 10,651,808, 10,635,988, 10,574,268, 10,546,621, 10,496,933, 10,490,600, 10,469,087, 10,430,162, 10,423,887, 10,417,370, 10,411,713, 10,374,610, 10,366,339, 10,346,761, 10,346,348, 10,331,163, 10,320,394, 10,320,360, 9,256,834, 9,152,924, 8,581,227, 7,598,514, 7,566,896, 7,518,138, 7,394,092, 7,376,547, 7,321,131, 7,250,624, and 7,109,593 which are assigned to the Microsoft corporation also known as Microsoft Technology Licensing, LLC.; U.S. Pat. No. 10,586,566 which is assigned to Sony Interactive Entertainment, Inc.; U.S. Pat. Nos. 9,246,602, and 8,744,075 which are assigned to the Sony Corporation; U.S. Pat. No. 6,823,140 assigned to Sun Microsystems, Inc.; U.S. Pat. Nos. 11,125,773, 11,003,046, 10,809,592, 10,520,024, and 10,272,400 assigned to Xanadu Quantum Technologies, Inc. of Toronto, Canada; and all of the patents recited in this paragraph are hereby incorporated by reference herein.

The JAVA computer language is believed to be one of the best for software program application development, and so the following list of U.S. patents originally assigned to Sun Microsystems, Inc. which developed JAVA is provided: U.S. Pat. Nos. 7,685,430, 7,650,505, 7,647,415, 7,634,779, 7,584,302, 7,574,710, 7,565,647, 7,548,946, 7,546,605, 7,543,288, 7,533,156, 7,451,393, 7,426,721, 7,421,687, 7,409,439, 7,398,533, 7,370,322, 7,318,128, 7,305,671, 7,296,235, 7,290,045, 7,266,822, 7,266,816, 7,246,345, 7,246,134, 7,243,356, 7,228,533, 7,219,331, 7,210,127, 7,209,960, 7,197,750, 7,181,724, 7,177,934, 7,167,894, 7,165,108, 7,162,711, 7,159,213, 7,155,501, 7,131,120, 7,131,111, 7,130,773, 7,117,489, 7,096,467, 7,069,554, 7,065,747, 7,058,934, 7,055,133, 7,054,890, 7,043,738, 7,043,732, 7,039,904, 7,016,966, 7,003,778, 7,000,235, 6,996,824, 6,996,587, 6,986,129, 6,983,465, 6,981,246, 6,980,979, 6,978,456, 6,978,401, 6,976,061, 6,964,033, 6,961,933, 6,961,843, 6,959,430, 6,957,428, 6,957,427, 6,951,014, 6,934,946, 6,934,726, 6,922,796, 6,918,109, 6,912,569, 6,901,591, 6,898,786, 6,889,227, 6,886,157, 6,877,111, 6,862,674, 6,850,953, 6,839,647, 6,823,504, 6,804,681, 6,799,185, 6,772,178, 6,766,349, 6,754,796, 6,751,790, 6,745,387, 6,742,006, 6,721,777, 6,711,739, 6,651,140, 6,637,021, 6,633,876, 6,542,900, 6,466,974, 6,446,084, 6,430,567, 6,427,153, 6,418,444, 6,407,759, 6,401,134, 6,366,898, 6,349,333, 6,308,315, 6,282,568, 6,260,078, 6,260,077, 6,253,256, 6,233,582, 6,223,346, 6,216,227, 6,141,794, 6,134,627, 6,134,600, 6,122,745, 6,070,239, 6,061,520, 6,058,482, 6,044,218, 6,026,485, 6,003,038, 5,966,542, 5,925,123, 5,815,718, 5,754,857, 5,706,502, 5,692,047, U.S. RE 38104, and all of these U.S. patents are hereby incorporated by reference herein.

In 2010, Sun Microsystems, Inc. was purchased by the Oracle Corporation which has continued to develop the JAVA computer language and related software program applications and the following list of U.S. patents relating to JAVA which are assigned to the Oracle Corporation is provided: U.S. Pat. Nos. 10,826,975, 10,558,434, 10,547, 664, 10,476,938, 10,474,998, 10,373,139, 10,324,692, 10,268,456, 10,229,032, 10,225,323, 10,133,827, 10,127, 259, 10,103,946, 10,049,127, 9,971,618, 9,930,129, 9,880, 938, 9,875,122, 9,843,629, 9,811,359, 9,740,597, 9,667,430, 9,648,084, 9,626,488, 9,600,546, 9,588,742, 9,552,277, 9,542,222, 9,519,466, 9,509,745, 9,467,355, 9,448,928, 9,430,222, 9,417,992, 9,411,566, 9,239,814, 9,231,995, 9,213,562, 9,185,054, 9,183,013, 9,177,033, 9,171,096, 9,160,749, 9,141,539, 9,058,471, 9,043,768, 9,037,542, 8,978,023, 8,959,485, 8,959,106, 8,924,789, 8,881,099, 8,875,113, 8,875,094, 8,863,126, 8,856,805, 8,856,460, 8,856,294, 8,850,412, 8,838,669, 8,832,710, 8,826,246, 8,813,031, 8,806,493, 8,805,896, 8,799,885, 8,793,670, 8,776,053, 8,732,191, 8,713,546, 8,695,006, 8,639,787, 8,635,660, 8,635,185, 8,627,328, 8,615,734, 8,601,447, 8,572,579, 8,566,826, 8,555,264, 8,533,383, 8,495,107, 8,490,120, 8,463,852, 8,429,650, 8,387,076, 8,365,157, 8,332,835, 8,321,450, 8,316,083, 8,261,269, 8,255,680, 8,250,572, 8,245,206, 8,219,609, 8,196,128, 8,195,721, 8,180,746, 8,156,482, 8,082,489, 8,046,772, 8,032,872, 7,962,925, 7,962,902, 7,962,527, 7,953,773, 7,949,760, 7,925,952, 7,921,169, 7,873,979, 7,873,951, 7,870,112, 7,840,967, 7,840,939, 7,827,535, 7,814,472, 7,802,240, 7,802,239, 7,793,255, 7,788,489, 7,784,043, 7,752,626, 7,730,523, 7,730,492, 7,720,877, 7,716,339, 7,716,274, 7,644,403, 7,490,330, 7,461,395, 7,454,428, 7,346,889, 7,032,216, 6,873,984, 6,854,114, and all of these U.S. patents are hereby incorporated by reference herein.

The following patents which relate to the JAVA computer language and related software programs are assigned to the Intel Corporation, Inc.: U.S. Pat. Nos. 7,191,453, 6,928,456, 6,854,122, 6,611,864, 6,484,188, 6,370,685, 6,317,869, 6,289,506, 6,289,504, 6,170,083, 6,158,048, 6,131,191, 6,093,216, and all of these U.S. patents are hereby incorporated by reference herein.

The following patents which relate to the JAVA computer language and related software programs are assigned to the Microsoft Corporation: U.S. Pat. Nos. 10,115,116, 8,965, 950, 8,661,407, 7,739,665, 7,546,590, 7,480,921, 7,194,729, 6,996,826, 6,981,255, 6,748,588, 6,665,865, 6,625,803, 6,522,343, 6,504,554, 6,499,035, 6,484,312, 6,484,311, 6,415,334, 6,367,012, 6,349,344, 6,230,172, 6,229,537, 6,173,317, 6,035,119, 6,006,241, 6,003,050, 5,920,720, 5,892,904, and all of these U.S. patents are hereby incorporated by reference herein.

The following patents several of which relate to computer languages, software programs and the enforcement of licensing agreements are assigned to Apple, Inc.: U.S. Pat. Nos. 9,952,841, 8,781,971, 8,452,712, 8,027,925, 7,900, 215, 7,448,042, and 6,188,995, and all of these U.S. patents are hereby incorporated by reference herein.

Other patents relating to computer languages include: U.S. Pat. No. 10,606,568 assigned to Alibaba Group Holding Limited, U.S. Pat. No. 9,804,946 assigned to Oracle International Corporation, U.S. Pat. No. 7,509,631 originally assigned to Bea Systems, Inc., U.S. Pat. No. 7,240,338 assigned to ITT Manufacturing Enterprises, Inc., U.S. Pat. No. 7,047,524 assigned to Hyperformix, U.S. Pat. No. 6,230,182 assigned to the Hewlett-Packard Company, U.S. Pat. No. 6,031,993 assigned to the Tandem Company, and U.S. Pat. No. 5,247,693 assigned to the Foxboro Company, and all of the U.S. patents are hereby incorporated by reference herein.

In the future, whether computing will include and be called optical computing, electro-optical computing, or quantum computing, and the information which is communicated be called waves, vibes, or qubits, that is, instead of bits which have been associated with digital information, there is need for a computer language for software application development which can communicate data and information optically using photons in sine wave form. Further, there is a need for a computer language which can communicate information using a hybrid combination of optical and digital signals. In addition, there is a need for a computer language which can represent and communicate words, numbers, and operations using fewer bits than the binary digital system, and also for data compression which can permit faster communication and processing of data and information. Moreover, there is need for a computer language and related computer software application that is easy for members of the public to understand and use.

Human beings do not normally process information in a binary manner with the input and output being communicated in a string of information one bit at a time. Seeing, hearing and speaking are things which all happen in a frequency domain. We constantly process information from multiple sensory sources, actions, and events at the same time. Accordingly, a computer language which permits similar multitasking is conducive to optical and quantum computing, the use of neural networks which can permit entanglement, superposition, and the making and use of artificial intelligence. The present disclosure is directed in to a computer language and code for software application development, data compression, and computers which can perform conventional, but also optical, hybrid electro-optical, and/or quantum computing. This language can permit data and information to be converted to and from other existing computer languages which are typically communicated using the binary number system, and also devices, methods, and processes which presently use electronic signals and digital means of communication.

SUMMARY

A first aspect of the present disclosure is a method of making a computer language which includes providing a dictionary including a list including a plurality of member alphabetical letters and/or words and/or numbers and/or symbols, each member of the plurality being represented by a corresponding wave form having a specific frequency and wavelength.

Optionally, the wave form is in the electromagnetic spectrum.

Optionally, the wave form is a photonic wave in the visible light spectrum and/or invisible portion of the infrared light spectrum.

Optionally, the wave form is a sine wave.

Optionally, the wave form is an electronic wave.

Optionally, the wave form is a square wave.

Optionally, the wave form is a product of data compression.

Optionally, the list of alphabetic letters and/or words further includes a plurality of sub-lists including the following categories: noun, verb, adjective, adverb, pronoun, preposition, conjunction, determiner, and exclamation.

Optionally, the plurality of member numbers are represented by a first wave form having a first frequency and wavelength which represents the base portion of a specific number, and a second wave form having a second frequency and wavelength which represents the exponent portion of the specific number, whereby the value of the specific number can be represented and communicated.

Optionally, a difference exists in time and/or space between the start of the first wave form and the second wave form and the second wave form is substantially identical in amplitude and shape to the first wave form, but the second wave form is phase shifted relative to the first wave form, and the first wave form represents the base portion of the specific number, and the amount to which the second wave form is phase shifted in time and/or space represents the value of the exponent corresponding to the specific number, whereby the value of the specific number can be represented and communicated.

Optionally, the absence of a break between two of the plurality of member numbers which are represented and/or communicated in a series represents a mathematic function of addition.

Optionally, the absence of a break between two of the plurality of member numbers which are represented and/or communicated in a series represents a mathematical function of multiplication.

Optionally, a break between two of the plurality of member letters and/or words and/or numbers and/or symbols represents a separation between the plurality member letters and/or words and/or numbers and/or symbols.

Optionally, the presence of a wave form representing a symbol disposed between two of the plurality of member numbers represents a mathematical function and operation between the member numbers.

A second aspect of the present disclosure includes a method of making a computer language for representing any positive number using the values and numbers 0, 1, 2, $2^{nth}$ exponential power, 3, and $3^{nth}$ exponential power and/or a sum of two or more of these values and numbers.

A third aspect of the present disclosure includes a method of making a computer language for representing and communicating values or numbers, each of the values or numbers including a base portion consisting of one or more of the following 0, 1, 2, 3, 4, 5, 6, 7, 8, 9, and an exponent portion, the base portion being represented and communicated by a wave form having a first frequency and wavelength, said exponent portion being represented by a second wave form having a second frequency and wavelength, wherein a difference exists in time and/or space between the start of the first wave form and the second wave form, and the second wave form is substantially identical in amplitude and shape to the first wave form, and the second wave form is phase shifted relative to the first wave form, and the amount to which the second wave form is phase shifted in time and/or space represents and communicates the exponent, whereby said values or numbers can be represented and communicated.

Optionally, the first wave form and the second wave form comprise square waves.

Optionally, the first wave form and the second wave form comprise sine waves.

Optionally, the first wave form and the second wave form have different frequencies and wavelengths.

A fourth aspect of the present disclosure includes a method of making a computer language for representing and communicating a value or number in a known base number system, the value or number having a base portion equal to the known base number in the known base number system and an exponent portion having a value obtained from a list in a table of algorithms, the known base number in the known base number system and the exponent portion being configured to be manipulated by a mathematical function by which a resultant wave form having a specific wavelength is derived to represent and communicate the value or number.

Optionally, the base number in the known base number system is the number 10 in the base 10 number system.

Optionally, the base number in the known base number system is the natural logarithm value e.

A fifth aspect of the present disclosure includes an optical keyboard configured to communicate data and information using visible light and/or infrared light.

A sixth aspect of the present disclosure includes an optical game controller configured to communicate data and information using visible light and/or infrared light.

A seventh aspect of the present disclosure includes a computer keyboard including means for producing an output including photons and a plurality of sine waves in the visible light spectrum and/or invisible portion of the infrared light spectrum, the output including representations of a plurality of alphabetical letters and/or words and/or numbers and/or symbols and/or commands and/or functions and/or operations, the output being communicated by fiber optic cable to a computer selected from the group of computers consisting of an electronic computer, an optical computer, an electro-optical computer, and a quantum computer.

An eighth aspect of the present disclosure includes a method of communicating a computer language including providing a dictionary including a list including a plurality of member alphabetical letters and/or words and/or numbers and/or symbols, each of the plurality of member alphabetical letters and/or words and/or numbers and/or symbols being represented by a corresponding wave form having a specific frequency and wavelength.

A ninth aspect of the present disclosure includes a computer language including a dictionary including a list of a plurality of member alphabetical letters and/or words and/or numbers and/or symbols, each of the plurality of member alphabetical letters and/or words and/or numbers and/or symbols being represented by a corresponding wave form having a specific frequency and wavelength.

A tenth aspect of the present disclosure includes a method of making a computer language including selecting a value or number X in a base number system consonant with a logarithmic function and expression $Log_b{}^n = X$, where b is the base portion of a number in the base number system, and where n is the exponent portion of the number in the base number system to which b is raised to produce the value or number X, taking and using n as a first factor, and multiplying n by at least a second factor to yield a specific frequency and associated wavelength in a portion of the electromagnetic spectrum.

An eleventh aspect of the present disclosure includes a method of making a computer language including selecting a value or number X in a base number system consonant with a logarithmic function and expression $Log_b{}^n=X$, where b is the base portion of a number in the base number system, and where n is the exponent portion of the number in the base number system to which b is raised to produce the value or number X, taking and using n as a first factor, and randomly generating a third factor, and multiplying n as the first factor by a second factor and the third factor to yield a specific frequency and associated wavelength in a portion of the electromagnetic spectrum. Further, the portion of the electromagnetic spectrum can be a portion of the visible light spectrum and/or infrared light spectrum.

A twelfth aspect of the present disclosure includes a method of making a computer language including selecting a plurality of wave forms corresponding to specific frequencies and associated wavelengths in the visible light spectrum and/or invisible portion of the infrared light spectrum, and combining at least two of the plurality of wave forms corresponding to specific frequencies and wavelengths to create a coding point. Alternatively, at least four of the plurality of wave forms can be combined to create a coding point. In this regard, a coding point can be used to represent at least one of an alphabetical letter, a word, a number, a symbol, a command, a function, and an operation. Further, at least two of the plurality of wave forms can be combined to form a plurality of sets, and the plurality of sets can be disposed in series and/or in parallel to provide a plurality of coding points. In addition, the number of permutations of the plurality of coding points can correspond to the formula: Permutations=(Number of Sets)!/(Number of Sets-2)!, and the number of combinations of the coding points can correspond to the formula: Combinations=(Number of Sets)!/2!×(Number of Sets-2)!

DETAILED DESCRIPTION

Figure 1:
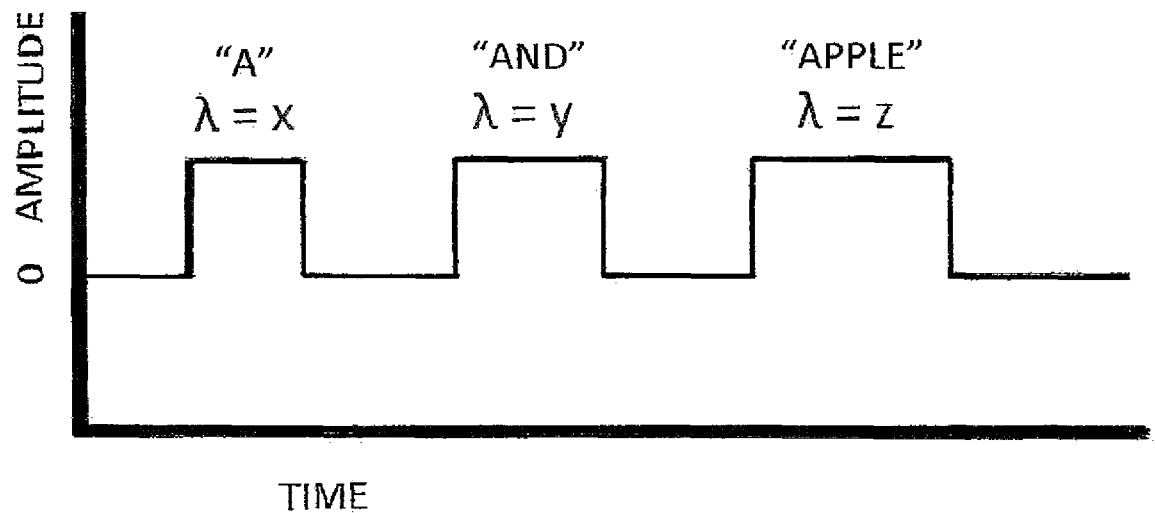
FIG. 1 shows a representation of the screen of an oscilloscope showing square waves representing an alphabetical letter and two words.

When using the binary system in digital communication each letter of the alphabet, as well as other numbers, symbols, and operations, are each identified using at least 8 bits made of zeros (0's) and ones (1's) which is also known as one byte of information. Accordingly, to reproduce and communicate the simple phrase "Run Tag Run" requires at least 72 bits or 9 bytes of digital information. This digital information is most often communicated in the form of a series of square waves with the top of a square wave which corresponds to its maximum amplitude being used to represent the number 1, whereas a portion having less amplitude or resting at zero is used to represent the value 0. As a result, the use of the binary system in digital communication can result in a long string or series of bits which are communicated sequentially and this can consume substantial memory.

Morse Code is an example of a different binary system which uses only 5 bits to represent numbers between 1-10 as shown below:

1 .----
2 ..---
3 ...--
4 ....-
5 .....
6 -....
7 --...
8 ---.
9 ----.
10 -----

Morse code is a different binary system than the one which is typically being used today in digital communication which uses ones (1's) and zeros (0's). However, it is possible to send morse code using visible light or invisible light in the infrared portion or other invisible portion of the electromagnetic spectrum to a computer using fiber optical cable by using a single sine wave or a short burst and transmission of sine waves to represent a dot, and either a longer burst and transmission of sine waves or no burst and transmission of light to represent a dash, or vice-versa. Alternatively, when using a conventional electronic computer, morse code can be sent using wires and a digital system to a computer by using a single square wave or a short burst and transmission of square waves to represent a dot, and either a longer burst or no burst of square waves to represent a dash. This method of communication resembles sending morse code by using a flashlight and turning it on and off for different durations of time.

Further, it is possible to send morse code using visible light or invisible light in the infrared portion or other invisible portion of the electromagnetic spectrum to a computer using fiber optical cable by using a sine wave having greater amplitude or intensity to represent a dot, and a sine wave having the same frequency and wavelength, but having less amplitude or intensity to represent a dash, or vice-versa. Alternatively, when using a conventional electronic computer, morse code can be sent using wires and the digital system to a computer by using a single square wave or a short burst and transmission of square waves having greater amplitude or intensity to represent a dot, and a square wave or a short burst and transmission of square waves having the same frequency and wavelength, but having less amplitude or intensity to represent a dash, or vice-versa. This method of communication would resemble sending morse code using two flashlights with one being noticeably brighter than the other, or using one flashlight which has two different brightness settings.

In addition, it is possible to send morse code using visible light or invisible light in the infrared portion or other invisible portion of the electromagnetic spectrum to a computer using fiber optical cable by using a sine wave having a specific frequency and wavelength of light to represent and communicate a dot, and a different sine wave having a different specific frequency and wavelength of light to represent and communicate a dash. Alternatively, when using a conventional electronic computer, morse code can be sent using wires and the digital system to a computer by using a single square wave or a short burst and transmission of square waves having one frequency and wavelength to represent a dot, and a different square wave or a short burst and transmission of square waves having a different frequency and wavelength to represent a dash, or vice-versa. This method of communication would resemble using two flashlights having two different colors.

Generally similar methods to those just described with reference to morse code can also be used to communicate the ones (1's) and zeros (0's) associated with the binary number system which is typically being used in digital communication. In this regard, it is possible send digital information using visible light or invisible light in the infrared portion or other invisible portion of the electromagnetic spectrum to a computer using fiber optical cable by using a single sine wave or a short burst and transmission of sine waves and light to represent a one (1), and either a longer burst and transmission of light or no burst and transmission of sine waves to represent a zero (0), or vice-versa. Alternatively, when using a conventional electronic computer, digital information can be sent using wires to a computer by using a single square wave or a short burst and transmission of square waves to represent a one (1), and either a longer burst or no burst of square waves to represent a zero (0). This method resembles sending digital information by using a flashlight and turning it on and off for different durations of time.

Further, it is possible to send digital information using visible light or invisible light in the infrared portion or other invisible portion of the electromagnetic spectrum to a computer using fiber optical cable by using a sine wave having greater amplitude or intensity to represent a one (1), and a sine wave having the same frequency and wavelength, but having less amplitude or intensity to represent a zero (0), or vice-versa. Alternatively, when using a conventional electronic computer, digital information can be sent using wires to a computer by using a single square wave or a short burst and transmission of square waves having greater amplitude or intensity to represent a one (1), and a square wave or a short burst and transmission of square waves having the same frequency and wavelength, but having less amplitude or intensity to represent a zero (0), or vice-versa. This method of communication would resemble sending digital information using two flashlights with one being noticeably brighter than the other, or using one flashlight which has two different brightness settings.

In addition, it is possible to send digital information using visible light or invisible light in the infrared portion or other invisible portion of the electromagnetic spectrum to a computer using fiber optical cable by using a sine wave having a specific frequency and wavelength of light to represent and communicate a one (1), and a different sine wave having a different specific frequency and wavelength of light to represent and communicate a zero (0). Alternatively, when using a conventional electronic computer, digital information can be sent using metal wires to a computer by using a single square wave or a short burst and transmission of square waves having one frequency and wavelength to represent a one (1), and a different square wave or a short burst and transmission of square waves having a different the frequency and wavelength to represent a zero (0), or vice-versa. This method of communication would resemble using two flashlights having two different colors.

If and when values or conditions other than 1 or 0 are desired or required when using digital communication, it can be possible to use three or more square waves having different positive amplitudes to represent those different values or conditions. For example, 1=yes or true can be communicated by a square wave having an amplitude "a", and 0=no or false can be communicated by a flat line having no amplitude resting at 0 or other amplitude "b", and maybe and the expression and/or can be communicated by a square wave having a different amplitude "c." However, this method would take more time and energy for a computer to process. Alternatively, it is possible to communicate 1, 0, and maybe and/or by using sine waves having different amplitudes and/or different frequencies and wavelengths using photons and light in the visible light spectrum and/or the infrared light spectrum, or other portion of the invisible electromagnetic light spectrum, as discussed below.

Instead of flashlights, LED lights and lasers are typically used to communicate information over fiber optical cables in modern digital communication. In this regard, there are three basic ways of modulating binary data including ones (1's) and zeros (0's), namely, amplitude shift keying (ASK), phase shift keying (PSK), and frequency shift keying (FSK). As discussed in the article entitled "Understanding Modern Digital Modulation Techniques," by Lou Frenzel, published Jul. 14, 2021 on the ElectronicDesign website: https://www.electronicdesign.com/technologies/communications/article/21798737/understanding-modern-digital-modulation-techniques, and also the article "Coherent Binary Modulation techniques" published online by an unknown author, date unknown, on the website: https://ee/en-g.usm.my/eeacad/mandeep/EEE436/Chp%204.pdf, with reference to radio frequency communication and digital communication, there are two types of amplitude modulation, namely on-off keying (OOK) which is like turning a flashlight on and off to communicate morse code, and in this case ones (1's) and zeros (0's) associated with the binary number system, and amplitude shift keying (ASK) which resembles sending digital information using two flashlights with one being noticeably brighter than the other or using one flashlight which has two different brightness settings. The latter kind of modulation is sometimes called intensity modulation or amplitude modulation (AM).

Another form of digital communication is frequency shift keying (FSK) and a popular version of this is called minimum shift keying (MSK) in which a higher frequency is used to indicate and represent what is called a mark which could identify a one (1), and another lower frequency is used to indicate and represent what is called a space which can be used to identify a zero (0). The use of Gaussian low pass filters with (MSK) which is sometimes indicated as (GMSK) has been used to improve the spectral efficiency of communication on cell phones.

Other methods of digital modulation include binary phase shifting keying (BPSK) which shifts the carrier wave 180 degrees for each change in the binary state when indicating ones (1's) and zeros (0's) so that the starting and ending points of the different values begin and end at zero on the reference line, and differential (BPSK) or (DPSK) which compares the phase of the received bit of information with the phase of the previously received one. Alternatively, a variation of BPSK known as quadrature PSK (QPSK) produces two carrier signals orientated 90 degrees apart, and the binary data then modulates each phase to produce four sine signals shifted by 45 degrees from one another. This permits twice as much data to be transmitted.

Quadrature amplitude modulation (QAM) uses four carrier phases and two amplitude levels, and there exist 16QAM, 64QAM, and 256QAM variations which can transmit more bits per symbol by using a mix of different amplitudes and phases. In this regard, see the document entitled: "Lesson 21, Digital Modulation U.S. Naval Academy," published by an unknown author, date unknown, on the website: http://www.usna.edu/ECE/ec312/Lessons/wireless/EC312_Lesson_21_Digital_Modulation_Course_Notes.pdf, which provides a discussion and illustrations showing the different basic ways of modulating binary data including ones (1's) and zeros (0's) in modern digital communication. The QAM method has been used with regards to cable television, and also with wireless communication such as cell phones. A hybrid form of PSK and QAM known as amplitude phase shift keying (APSK) which uses two different amplitudes and 16 different phase positions has been used in satellite communication. Orthogonal frequency division multiplexing (OFDM) is a combination of modulation and also multiplexing which creates many different sub-channels which are orientated in an orthogonal configuration within a given transmission channel, and this is one of the most widely used forms of digital communication being used today in digital subscriber line (DSL) and 4G cellular systems.

Representing Letters and Words

The current Webster's dictionary includes about 470,000 words, and the concise Oxford dictionary includes between about 171,476 words. However, it has been estimated that most individuals only have knowledge of about 15,000-20,000 word families which are called lemmas in their native language, and individuals seldom have knowledge of more than 2,000-3,000 word families in a foreign language. Accordingly, a concise dictionary for use with a computer language can include less than 20,000 lemmas, and even less than 5,000 lemmas. If even only 1,000 or 2,000 and certainly less than 3,000-5,000 alphabetical letters, words, symbols, and numbers are each individually assigned and coded in order to be represented and communicated in the form of a square wave or a sine wave having a specific frequency and wavelength, then the amount of data in bits, waves, vibes, qubits, or whatever name or form would be given to the data and information, can possibly be decreased by over 75%. The following two websites having 1000 and 3000 word lists include the most commonly used words in English: https://gonaturalenglish.com; and, http://basicenglishspeaking.com. According to the website http:/lbasicenglishspeaking.com: "If you know these 3000 most common words, you can understand at least 95% of all conversations, e-mails, newspapers, and books." This is one way to create faster computers which do not consume as much time and energy as they do today, that is, if the desire is to make computers 20 times faster, then one way to accomplish this is to make a new computer language which uses a lot less data in order to communicate the same information.

The following word classes exist in the English language: noun, verb, adjective, adverb, pronoun, preposition, conjunction, determiner, and exclamation. In this regard, a list of words which can be subdivided into these subclasses can be selected, and also a list of symbols, a list of numbers, and a list of key words or terms relating to computer programming language and operations can be selected, listed, and compiled for making the computer language. In this regard, a formal computer language can include and/or be used to create a construction language, a command language, a configuration language, a programming language, a query language, a transformation language, a data exchange language, a markup language, a modeling language, an architecture description language, a hardware description language, a printed page language, a simulation language, a specification language, a sheet style language, a domain-specific language, a general-purpose language, a natural language processing language.

In the Java computer programming language, the following words are keywords which have a special meaning: abstract, assert, Boolean, break, byte, case, char, class, const, continue, default, do, double, else, enum, extends, false, final, finally, float, for, goto, if, implements, import, instanceof, int, interface, long, native, new, null, package, synchronized, this, throw, throws, transient, true, try, void, volatile, while, and these and other keywords and terms can be coded in order to be represented by individual square or sine wave forms having a specific frequency and wavelength. Further, in the JAVA computer programming language the following operators are used to perform arithmetic, assign values, and compare values: +, −,*, /, %, ++, −, +, +=, −=,*=, /=, %=, ==, =, >, >=, <, =, and these and other operators can be coded in order to be represented by individual square or sine wave forms having a specific frequency and wavelength.

The present disclosure is directed to a computer language for software application development which is not dependent or necessarily based on the binary system that is now commonly being used in electronic digital communication. The computer language which is being disclosed can be communicated with the use of photons and sine waves in the visible and/or invisible portion of the electromagnetic light spectrum. Alternatively, the computer language can be communicated with the use of electrons and in an electronic form using square waves, or other wave forms. Alternatively, the computer language can be communicated in a hybrid form with the use of photons and sine waves in the visible and/or invisible portion of the electromagnetic light spectrum, and in combination with electrons using electronic square waves, or other wave forms.

When the amplitude of a wave is being modulated using square or sine waves it can be thought of as a form of amplitude modulation (AM), that is, even though the signal may not be broadcast using radio waves which is the most common association that most people would have with the term amplitude modulation. It is possible to communicate capital letters and the other symbols on a keyboard which are normally made with the use of the shift, alt, ctrl, and function keys by using amplitude modulation, and to have this method and process match to the character map and ROM, RAM, and/or Flash memory, Solid State Drive (SSD) memory, or other means of persisting data and information associated with the integrated circuit present on a keyboard and/or computer.

Figure 2:
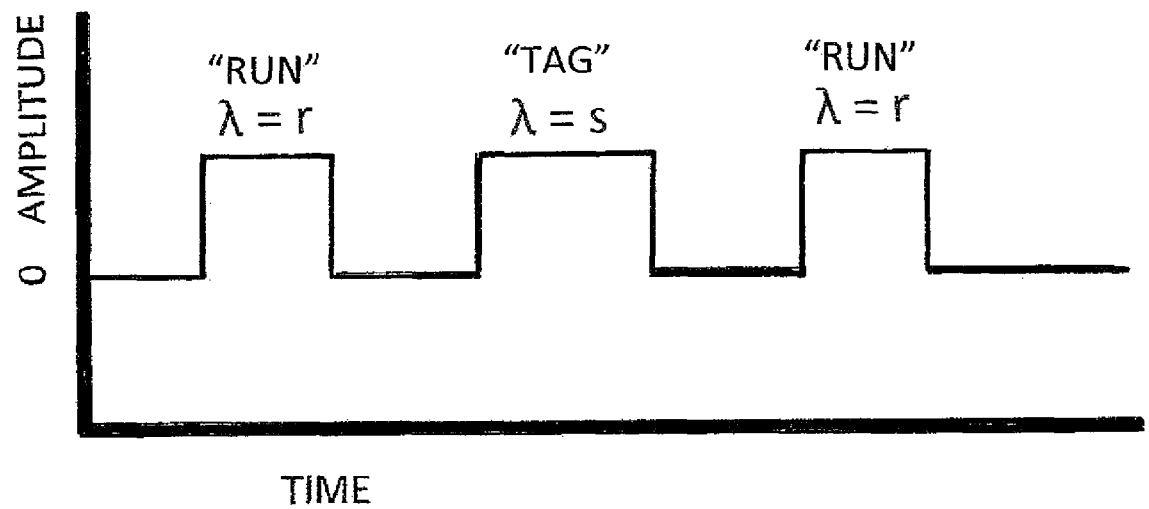
FIG. 2 shows a representation of the screen of an oscilloscope showing square waves representing three words.
Figure 4:
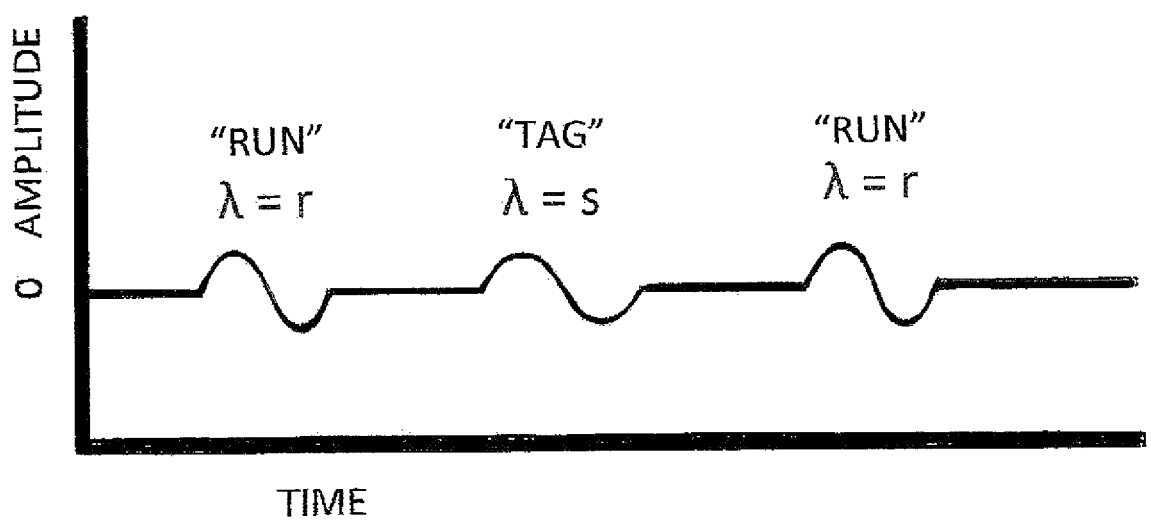
FIG. 4 shows a representation of the screen of an oscilloscope showing sine waves representing three words.

Again, the simple phrase "Run Tag Run" requires at least 72 bits or 9 bytes of digital information using conventional 0's and 1's. However, the letter "r" can be alternatively be represented using a square wave or sine wave having an amplitude and a specific frequency and wavelength. In this regard, the same amplitude of a square wave or sine wave can be used to represent all of the letters, capital letters, symbols, numbers, and operations normally provided on a keyboard, but the frequency and wavelength of the wave can be varied to represent and identify the specific letter, capital letter, symbol, number, or operation. Moreover, frequency modulation can not only be used to identify letters, capital, letters, symbols, numbers, and operations, but also entire words. An entire word can be communicated by a single square or sine wave. As shown in FIGS. 2 and 4, two square waves having wavelengths "r" and "s" are used to represent the words "run tag run." Accordingly, a single square or sine wave can possibly be used to identify an entire word, or larger groups of words, phrases, sentences, paragraphs, documents, and images.

If the desire is to operate at high speeds in the MHz, GHz, or THz range, or even faster, the frequency and wavelength of the square wave or sine wave to be used is configured to provide information within the desired frequency range and the intended or desired speed of communication. For example, the letter "a" can be identified and encoded by a square or sine wave having a frequency of 1 MHz. All of the words included in a selected dictionary which is listed in the associated software program that would start with the letter "a" can also be assigned square or sine waves having different frequencies between 2 and let's say 200 hundred MHz. Alternatively, a different range could be used to include however many words will be included in the dictionary which begin with the letter "a." The same thing can also be done for every other letter and word in the dictionaryB-Z. Alternatively, the listing, assignment and encoding of alphabetical letters, words, symbols, numbers, and operations, can be done at higher frequencies and shorter wavelengths in the GHz or THz range. When using photons in the visible or invisible light spectrum to communicate data and information and possibly then also perform optical and quantum computing, the typical frequencies for use can be in the GHz and THz range.

When one square wave is being used to communicate one piece of information using a digital process it is normally called one bit of information. Alternatively, when a photon and sine wave corresponding to the visible light spectrum or an invisible portion of the infrared light spectrum in the larger electromagnetic spectrum is being used to communicate data or information, it can possibly be called a wave, a vibe, or a qubit of information. As a result, the three words or phrase "run tag run" could then only require 3 waves, vibes, or qubits to be communicated instead of at least 72 bits of information. The ratio 3/72=X/100, and solving for X equals 4.16%. Accordingly, the amount of data being communicated could be reduced by about 95%. This can result in faster communication speeds, less heat production during operation which is something often associated with the fatigue and failure of electronic components, and also less energy use.

The speed of communication can also be increased by recognizing that certain letters and words are typically used more frequently than others. For example, the letters q, j, z, and x are used relatively infrequently in the English language. Letters, words, or symbols which are used less frequently can be assigned to square or sine waves having lower frequencies withing the range of frequencies and wavelengths being used for communication relative to other letters or words which are more often used. This can be related to a form of data compression which is known as Huffman Coding. In this regard, a Huffman Coding like algorithm can be made and used with letters of the alphabet, words, and also numbers. For example, the following list which was derived from an analysis of letters occurring in the main entries of the "Concise Oxford Dictionary," $9^{th}$ Edition, 1995 which can be found on the website: https://www3.nd.edu/~busiforc/handouts/cryptography/letterfrequencies.html, ranks the frequency of use of the individual letters of the alphabet from most frequent to least frequent use: E, A, R, I, O, T, N, S, L, C, U, D, P, M, H, G, B, F, Y, W, K, V, X, Z, J, and Q. However, other rankings of alphabetical letters are possible and could be more suitable in view of the nature of the subject matter which is expected to be communicated and most common letter and word usage of a given population of users.

In the making of the associated computer software, the desired letters, words, numbers, symbols, and operations which are to be included can be provided in lists which can be included in the software application and/or the data and information and lists can be embedded or otherwise included in RAM, ROM, Flash-memory, Solid State Drive (SSD) memory, optical memory, or other form of memory in which the information can be persisted, and then be readily accessed by a computer or other data storage and communication device and user.

It is possible to communicate data and information using electronic input devices which use metal wire and digital electronic signals which are connected to a typical silicon based CPU and memory chip in a conventional electronic computer. In this regard, an oscillator circuit such as a 555 or 955 timer circuit, a quartz crystal integrated circuit, a vacuum tube oscillator, or other oscillator can be used to generate a baseline or carrier signal in the desired frequency range, and each of the possible keystrokes on a keyword or other input device can be routed to a capacitor, resistor, or other electronic component that is in communication with the oscillator circuit and which can change the frequency and wavelength of its baseline output to communicate the specific frequency and wavelength which has been assigned, coded, and mapped to the specific letter, word, number, symbol, operation or function, and then communicate this data and information to the silicon based CPU and memory chip of a conventional electronic computer which includes one or more software applications including necessary and sufficient programs, commands, and algorithms to communicate and process the data and information for a user. However, photonic and optical forms of communication, and optical, electro-optical, and/or quantum computers are capable of performing more complex computations and at faster speeds. In this regard, photons in the visible portion of the light spectrum and/or infrared light in the invisible portion of the electromagnetic spectrum can be used to communicate letters, words, symbols, numbers, operations, and functions.

Visible light falls in the range of the electromagnetic spectrum between ultraviolet and infrared light. Visible light frequencies are between about $4 \times 10^{14}$ and $8 \times 10^{14}$ cycles per second (Hz) or about 430-750 trillion Herz (THz), wavelengths in the range between approximately 380-740 nm. One cycle of visible light associated with wavelengths between 400-700 nm corresponds to durations in time in the range between about 1.3 and 2.3 femtoseconds. The ultraviolet light spectrum includes wavelengths in the range between approximately 10 nm and 400 nm which corresponds to frequencies in the range between approximately 30 PHz-750 THz. The infrared light spectrum includes wavelengths in the range between approximately 700 nm-1 mm and corresponds to frequencies in the range between approximately 430 THz-300 GHz. In this regard, it is known that there can be some overlap as between the visible light spectrum and the infrared and ultraviolet light spectrums. The invisible portion of the infrared light spectrum which includes near infrared has a wavelength between approximately 0.75-1.4 micrometers, short infrared has a wavelength between approximately 1.4-3 micrometers, mid-length infrared has a wavelength between approximately 3-8 micrometers, long wavelength infrared has a wavelength between approximately 8-15 micrometers, and far infrared has a wavelength between approximately 15-1,000 micrometers.

LED diodes and laser diodes can be used as a source of photons and light in the visible light spectrum and/or invisible portion of the infrared light spectrum or other invisible portion of the electromagnetic spectrum such as the ultraviolet spectrum. LED diodes emit light by spontaneous emission can be made from a semiconductor compound, e.g., gallium arsenide phosphide which can provide infrared radiation having a wavelength of approximately 850 nm. Other semiconductor compounds can be used in making LED diodes which can provide photons and light in other portions of the visible light and/or infrared light spectrums. LED diodes are available from https://www.mouser.com. Laser diodes emit light by stimulated emission and are also available in different wavelengths in the ultraviolet, visible, and infrared light spectrums. In this regard, see https://www.thorlabs.com which is the website for Thorlabs which makes many laser diodes having different wavelengths in the range between 375-2000 nm.

Lasers can be used as a source of photons and light in the visible light spectrum and/or invisible portion of the infrared light spectrum or other invisible portion of the electromagnetic spectrum. For example, so-called ultrafast lasers, femtosecond lasers, picosecond lasers, mode-locked lasers, mode-locked fiber lasers, mode-locked diode lasers, and titanium-sapphire lasers can possibly be used as a source of photons and light, and some of these lasers are capable of generating photon and light pulses which have a duration of less than five femtoseconds. In the field of optics, femtosecond pulse shaping is used to manipulate and configure the temporal domain of an ultra-short laser pulse, and/or the frequency domain of an ultra-short laser pulse the latter being obtained using the Fast Fourier Transform (FFT). In this regard, a Michelson interferometer is one example of a direct space to time pulse shaper which uses a moving mirror. Femtosecond pulse shapers can be collinear or transverse and either static or programmable. Collinear static shapers typically use a chirped mirror, whereas programmable collinear shapers use an Acousto-optic programmable dispersive filter (AOPDF). Static transverse pulse shapers typically use a stretcher/compressor, whereas programmable transverse pulse shapers use a spatial light modulator. Another method and technique for manipulating and configuring an ultrashort laser pulse is called a multiphoton intrapulse interference phase scan which can use a liquid crystal, a diffractive grating, and a spatial light modulator (SLM).

One cycle of visible light associated with wavelengths between 400-700 nm corresponds to durations in time which are the range between about 1.3 and 2.3 femtoseconds. Accordingly, some of the aforementioned lasers can possibly generate between one to four complete cycles of visible light in less than 5 femtoseconds depending of the specific visible light wavelengths. There are numerous types of lasers being used today for fiber optic transmitters, e.g., Vertical-Cavity Surface-Emitting Lasers (VCSEls), Fabry-Perot (FP) lasers, and Distributed Feedback (DFP) lasers. In this regard, diode pumped solid state which include fibers doped with dysprosium, erbium, holmium, neodymium, praseodymium, thulium, and ytterbium can be used. For manufacturers of lasers for optical communications, see, e.g., https://www.TeraXion.com, https://www.Quantifiphotonics.com, https://www.modulight.com, and, https://www.Vitextech.com.

As previously discussed, a portion of the invisible infrared light spectrum is being used today by members of the telecom industry to transmit signals through optical fiber cable. Fiber optical cable can transmit about 100 terabytes (Tb)/second in C and L bands: the C band is between 1530-1565 nm; the L band is between 1565-1625 nm; the O band is between 1260-1360 nm, the E band is between 1360-1460 nm, the S band is between 1460-1530 nm, and the U band is between 1625-1675 nm. Digital to optical converters, and optical to digital converters, and what are often called optical transceivers are used in order to convert binary digital data into light and back again. Optical transceivers use a plurality of lasers having different specific wavelengths to convert digital signals from data switches to optical signals which can be transmitted used fiber optic cables and typically using the wavelengths between 1260-1675 nm which is an invisible portion of the infrared light spectrum.

Different types of optical transceivers which are made in different forms in accordance with the multisource agreement include, e.g., Gbic, SFP, SFP+, CFP, CFP2, CFP4, and QSFP28. In brief, there are two main kinds of optical transceivers, namely, grey or standard transceivers which are single channel devices, and single fiber bi-directional transceivers which use two different wavelength channels one to transmit and the other to receive data and information over a single optical fiber strand. Grey transceivers come in different types: short range (SR) 850 nm, long range (LR) 1310 nm, extended range 1550 nm, and further extended reach (ZR) also 1550 nm. Single fiber bi-directional transceivers typically have two channels at 1310 nm and 1550 nm, but for long distance transmission typically the two channels are at 1510 nm and 1570 nm.

The ultraviolet light spectrum is approximately between 10-400 nm. In this regard, UV-A is between 315-400 nm, UV-B is between 280-315 nm, UV-C is between 100-280 nm, near ultraviolet (N-UV) is between 300-400, middle ultraviolet (M-UV) is between 200-300 nm, far ultraviolet (F-UV) is between 122-200 nm, hydrogen Lyman-alpha is between 121-122 nm, extreme ultraviolet (E-UV) is between 10-121 nm, and vacuum ultraviolet (G) is between 10-200 nm. It is possible to use a portion of the ultraviolet spectrum to communicate data and information.

When making a computer language for use with a conventional electronic computer, an optical computer, a hybrid optical/electronic computer, and/or a quantum computer, the letters of the alphabet, words, symbols and at least some numbers can be coded and assigned different specific frequencies and wavelengths. Whether the signal is an electronic one and includes square waves, or the signal is made using sine waves which are being communicated in the visible light spectrum, invisible infrared light spectrum, or other portion of the electromagnetic spectrum, the different wave forms can be made distinguishable and separated by one or more nanometers in wavelength, picoseconds, femtoseconds, MHz, GHz, THz, PHz, or other detectable difference in waveform, amplitude, phase, frequency and wavelength, and/or speed so they can be detected with desired accuracy. It is possible to detect a single photon. Further, differences in color which correspond to differences in frequency and wavelength can be easily detected with an accuracy between 5-10 nanometers (nm), and even differences of a single nanometer (nm) can be detected using a light sensor and/or spectrometer. In this regard, the difference in frequency and wavelength which can be detected with a required or desired level of accuracy will here be called the desired detectable wavelength difference and be indicated in the drawing figures as (DAD). Alternately, the difference in frequency and wavelength which can be detected with a required or desired level of accuracy could also be called the desired detectable difference in frequency DDF. The desired separation in space and/or time between the end and start of different alphabetical letters, words, symbols, numbers, or commands which can be detected with a required or desired level of accuracy will here be called the desired detectable separation and be indicated in the drawing figures as (DS), and the desired difference in amplitude which can be detected with a required or desired level of accuracy will here be called the desired detectable amplitude and be indicated in the drawing figures as (DA). Communication of different letters of the alphabet, words, symbols, and numbers in the form of photons and sine waves can be made using fiber optic cables which are known to have little or no impedance.

As previously discussed, there are many different forms and means of frequency modulation which have been used with radio communication and/or digital communication including, but not limited to the following: Slope detection; Ratio detection; Foster-Seeley FM discriminator; Phased Locked-Loop demodulator (PLL); Quadrature detector/demodulator; Minimum Shift Keying Modulation (MSK); and, Gaussian Minimum Shift Keying (GMSK). RF frequency synthesizers are widely used in radio communications and these include but are not limited to: Direct Analogue frequency synthesizers; Direct Digital frequency synthesizers (DDS); Indirect Analogue frequency synthesizers (analogue PPL frequency synthesis); Indirect Digital frequency synthesizers (digital PPL frequency synthesis); and Multiloop PLL Frequency Synthesizers. Some of these methods, techniques, and devices can be applied to photonic communication using the visible light spectrum and/or invisible infrared light spectrum, or other invisible portion of the electromagnetic spectrum.

FIG. 1 shows a representation of the screen of an oscilloscope showing square waves representing the alphabetical letter "a" and the two words "and" and "apple." As shown, the letter "a" is represented by a square wave having a wavelength (A) "x," whereas the word "and" is represented by a square wave having a wavelength "y," and the word "apple" is represented by a square wave having a wavelength "z." As shown, the square waves can be associated with an electronic form of communication which is not based solely on detecting differences in amplitude, but rather on detecting differences in the frequency and wavelength of the square waves. Alternatively, other forms of waves can be used, such as triangular or sawtooth waves.

In brief, instead of using the amplitude of square waves to communicate binary digital data and information in the form of a series of 0's and 1's, the frequency and wavelength of square waves or other wave forms are being changed and/or modulated to communicate data and information. It is possible to detect the start or rise and end or fall of a square wave or other wave form, e.g., using an oscilloscope which can include an adjustable trigger threshold, and so the length of any given wave form can be detected and known. At this time, there are a number of software applications for oscilloscopes which can be installed and used on Windows PCs, e.g., "Winscope," "Soundcard Oscilloscope," "Oscilloscope," "Real-Time Spectrum," "VisualAnalyser," "Analog Discovery 2," and "Frequency Analyser," which are reviewed in the article entitled: "7 Best Oscilloscope Software for Windows," by Ivan.Jenic, published Apr. 15, 2020, on the website: https://windowsreport.com/oscilloscope-software-pc-laptop. Other forms of frequency modulation have been used with radio communication, and similar techniques can be applied to the detection of electronic wave forms and/or photonic or optical wave forms which can be used to communicate data and information in a computer environment. Note: For the sake of simplicity, the negative portion of the square waves which could possibly appear on or below what is called the 0 and/or reference line are not shown in the drawing figures which are provided and discussed in this disclosure.

FIG. 2 shows a representation of the screen of an oscilloscope showing square waves representing the three words "run tag run." The word "run" is represented by a square wave having a wavelength "r" and the word "tag" is represented by a square wave having a wavelength "s." As shown, the square waves can be associated with an electronic form of communication which is not based solely on detecting differences in amplitude, but rather on detecting differences in the frequency and wavelength of the square waves. Alternatively, other forms of waves can be used, such as triangular or sawtooth waves.

Figure 3:
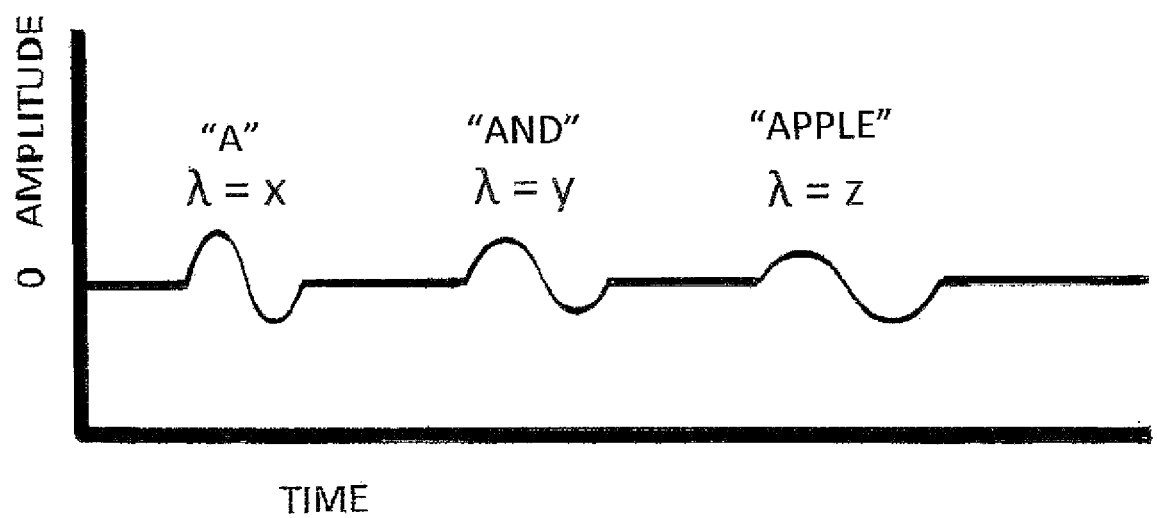
FIG. 3 shows a representation of the screen of an oscilloscope showing sine waves representing an alphabetical letter and two words.

FIG. 3 shows a representation of the screen of an oscilloscope showing sine waves representing an alphabetical letter "a" and the two words "and" and "apple." As shown, the letter "a" is represented by a sine wave having a wavelength "x," whereas the word "and" is represented by a sine wave having a wavelength "y," and the word "apple" is represented by a sine wave having a wavelength "z." The use of the term "sine wave" in this disclosure shall be used to broadly refer to any sine wave form such a sine wave, a cosine wave, or analog wave form which is smooth and continuous, whereas square waves are stepping, square, and discrete. Sine waves can be associated with a form of sound or audio communication and/or a form of photonic and optical communication. In this regard, it is possible for sound or audio communication to be converted to photonic or optical communication, and vice-versa. Perhaps, the first example of such a device is taught in U.S. 235,199 by Alexander Graham Bell, and this patent is hereby incorporated by reference herein. Further, the sound track of feature films is optically embedded in the film substrate, and in the past this process was synchronized using a movieola device. The sound track(s) on feature films is later converted into audio output with the use of optical-electrical converters included in the film projectors used in movie theaters so that it can be heard.

FIG. 4 shows a representation of the screen of an oscilloscope showing sine waves representing the three words "run tag run." The word "run" is represented by a sine wave having a wavelength "r" and the word "tag" is represented by a sine wave having a wavelength "s." As shown, the sine waves can be associated with an electronic form of communication which is not based solely on detecting differences in amplitude, but rather on detecting differences in the frequency and wavelength of the sine waves.

Representing Numbers

The use of the binary number system and digital communication for representing numbers and operations in computer languages can result in certain inaccuracies, and also consume substantial memory. When using the binary number system with a computer each number between 1-10 requires 8 bits or one byte of information. Most individuals do not use many large numbers in their daily communications, but scientists often do so and computers now use the binary system and digital methods in order to communicate numbers and perform calculations. In order to improve the speed of transmission and processing of the large numbers of bits which are typically used in digital communication, various means and methods of bit-rate reduction and/or data compression have been created and used. For example, Lempel-Ziv-Welch (LZW), MP3, discrete cosine transform (DCT), JPEG, Blue Ray, and Dolby True HD are some examples of communication formats which use different forms of data compression.

It is possible to assign to each commonly used value or number in a given base number system a specific frequency and wavelength which can then serve as its code to represent and communicate the individual value or number. Most individuals do not often use numbers having a value greater than one million, and numbers having a value less than 1,000 are the most commonly used. Accordingly, for some software applications and user populations encoding a relatively small and finite number of values and numbers can be efficacious. However, because there are infinite numbers in the mathematical universe, assigning to each number a specific frequency and wavelength of a square or sine wave in order to identify and code a number could be impractical or impossible, that is, depending on how many numbers are to be represented and encoded. Accordingly, there is a need for other efficient ways to represent and communicate numbers.

Before modern electronic calculators and computers were made available to the general public in the 1970's, slide rule devices, and logarithms which were first developed by John Napier in 1614 were commonly used to simplify mathematical calculations. In brief, a logarithm is the inverse function to exponentiation. The logarithm of a number x is the exponent to which another number which is known as the base must be raised to produce that number x. For example, the notation $\log_2 8=3$ which is $2 \times 2 \times 2$ or $2^3=8$ is an example of a binary logarithm. The logarithm which uses base number 10 is called the decimal or common logarithm and is often used in science and engineering. The so-called natural logarithm uses the base number e=2.718 and it is often used in the fields of mathematics and physics. Many calculations can be simplified by using logarithms. For example, the multiplication or product of $\log_b (xy) = \log_b x + \log_b y$; the division or quotient of $\log_b x/y = \log_b x - \log_b y$; the power of $\log_b x^p = p \log_b x$; and the root of $\log_b \sqrt[p]{x} = \log_b x/p$. Tables of logarithms were created by Henry Biggs in 1617, and then were later greatly expanded. Logarithms, and various mathematical equations and operations using them, as well as large tables of logarithms can be written and placed into a computer language, code, and related algorithms. As discussed earlier in the background section, the speed and efficiency of modern computer chips and computers is beginning to encounter certain limitations. Accordingly, the use of exponential and/or logarithm representation of numbers and also simple mathematical operations such as addition, subtraction, multiplication, and division can help to provide for the development of methods and processes for reducing the amount of data which is presently required and commonly being used to represent and communicate numbers.

In number theory, the decomposition of a composite number into a product of smaller integers is called integer factorization. If and when these factors are restricted to prime numbers the process is called prime factorization. When the numbers being factored are sufficiently large, there is currently no known efficient algorithm which can run on a classical computer in order to calculate these factors in polynomial time, that is, in a timely manner. In order to introduce this subject and disclose an alternative method of compressing data and representing numbers, here are some values and/or numbers between 0-100: 0; 1; and there exist 26 prime numbers between 0-100, namely, 2, 3, 5, 7, 11, 13, 17, 19, 23, 29, 31, 37, 41, 43, 47, 53, 59, 61, 67, 71, 73, 79, 83, 89, and 97. All of the rest of the numbers between 0-100 are composite numbers. In this regard, the composite numbers between 0-100 can be expressed by 14 prime numbers, namely, 2, 3, 5, 7, 11, 13, 17, 19, 23, 29, 37, 41, 43, and 47, as discussed and shown below. In brief, besides the values or numbers 0 and 1 only 24 prime numbers are required to express all values and numbers between 0-100, which is a total of 26 values and/or numbers. This can be used to perform what is here called prime number data compression. 101 values or numbers minus 26 values or numbers equals a reduction of 75 values or numbers which is approximately 75%. Accordingly, it is possible to use a form of prime factorization to reduce what can be seen as the redundancy associated with having to express each individual composite number. While classical computers have lacked the computing power and speed to perform integer and/or prime factorization in polynomial time, something which is typically calculated using what is called Big O Notation, quantum computers which can use Peter Shor's Algorithm created in 1994 are capable of performing such tasks, e.g., see the article "How Peter Shor's Algorithm Dooms RSA Encryption To Failure," by. John Loeffler, published May 2, 2019, on the website: https://interestingengineering.com/how-peter-shors-algorithm-dooms-rsa-encrytion-to-failure. In this regard, the numbers 2 and 3 are the most often used prime number factors when expressing composite numbers up to 100. For example, here are some of the possible factors that can be used to represent and produce composite numbers up to 100.

Prime Number Data Compression

| | |
|---|---|
| 2 × 2 = 4 | $2^2 = 4$ |
| 2 × 3 = 6 | |
| 2 × 2 × 2 = 8 | $2^3 = 8$ |
| 3 × 3 = 9 | $3^3 = 9$ |
| 2 × 5 = 10 | |
| 2 × 2 × 3 = 12 | $2^2 \times 3 = 12$ |
| 2 × 7 = 14 | |
| 3 × 5 = 15 | |
| 2 × 2 × 2 × 2 = 16 | $2^4 = 16$ |
| 2 × 3 × 3 = 18 | $2 \times 3^2 = 18$ |
| 2 × 2 × 5 = 20 | $2^2 \times 5 = 20$ |
| 3 × 7 = 21 | |
| 2 × 11 = 22 | |
| 2 × 2 × 2 × 3 = 24 | $2^3 \times 3 = 24$ |
| 5 × 5 = 25 | $5^2 = 25$ |
| 2 × 13 = 26 | |
| 3 × 3 × 3 = 27 | $3^3 = 27$ |

| | |
|---|---|
| $2 \times 2 \times 7 = 28$ | $2^2 \times 7 = 28$ |
| $2 \times 3 \times 5 = 30$ | |
| $2 \times 2 \times 2 \times 2 \times 2 = 32$ | $2^5 = 32$ |
| $3 \times 11 = 33$ | |
| $2 \times 17 = 34$ | |
| $2 \times 2 \times 3 \times 3 = 36$ | $2^2 \times 3^2 = 36$ |
| $2 \times 19 = 38$ | |
| $2 \times 2 \times 2 \times 5 = 40$ | $2^3 \times 5 = 40$ |
| $2 \times 3 \times 7 = 42$ | |
| $2 \times 2 \times 11 = 44$ | $2^2 \times 11 = 44$ |
| $3 \times 3 \times 5 = 45$ | $3^2 \times 5 = 45$ |
| $2 \times 23 = 46$ | |
| $2 \times 2 \times 2 \times 2 \times 3 = 48$ | $2^4 \times 3 = 48$ |
| $2 \times 5 \times 5 = 50$ | $2 \times 5^2 = 50$ |
| $2 \times 2 \times 13 = 52$ | $2^2 \times 13 = 52$ |
| $2 \times 3 \times 3 \times 3 = 54$ | $2 \times 3^3 = 54$ |
| $5 \times 11 = 55$ | |
| $2 \times 2 \times 2 \times 7 = 56$ | $2^3 \times 7 = 56$ |
| $2 \times 29 = 58$ | |
| $2 \times 2 \times 3 \times 5 = 60$ | $2^2 \times 3 \times 5 = 60$ |
| $2 \times 31 = 62$ | |
| $3 \times 21 = 63$ | |
| $2 \times 2 \times 2 \times 2 \times 2 \times 2 = 64$ | $2^6 = 64$ |
| $5 \times 13 = 65$ | |
| $2 \times 3 \times 11 = 66$ | |
| $2 \times 2 \times 17 = 68$ | $2^2 \times 17 = 68$ |
| $3 \times 23 = 69$ | |
| $2 \times 5 \times 7 = 70$ | |
| $2 \times 2 \times 2 \times 3 \times 3 = 72$ | $2^3 \times 3^2 = 72$ |
| $2 \times 37 = 74$ | |
| $3 \times 5 \times 5 = 75$ | $3 \times 5^2 = 75$ |
| $2 \times 2 \times 19 = 76$ | $2^2 \times 19 = 76$ |
| $7 \times 11 = 77$ | |
| $2 \times 3 \times 13 = 78$ | |
| $2 \times 2 \times 2 \times 2 \times 5 = 80$ | $2^4 \times 5 = 80$ |
| $3 \times 3 \times 3 \times 3 = 81$ | $3^4 = 81$ |
| $2 \times 41 = 82$ | |
| $2 \times 2 \times 3 \times 7 = 84$ | $2^2 \times 3 \times 7 = 84$ |
| $5 \times 17 = 85$ | |
| $2 \times 43 = 86$ | |
| $3 \times 29 = 87$ | |
| $2 \times 2 \times 2 \times 11 = 88$ | $2^3 \times 11 = 88$ |
| $2 \times 3 \times 3 \times 5 = 90$ | $2 \times 3^2 \times 5 = 90$ |
| $7 \times 13 = 91$ | |
| $2 \times 2 \times 23 = 92$ | $2^2 \times 23 = 92$ |
| $3 \times 31 = 93$ | |
| $2 \times 47 = 94$ | |
| $5 \times 19 = 95$ | |
| $2 \times 2 \times 2 \times 2 \times 2 \times 3 = 96$ | $2^5 \times 3 = 96$ |
| $2 \times 7 \times 7 = 98$ | $2 \times 7^2 = 98$ |
| $3 \times 3 \times 11 = 99$ | $3^2 \times 11 = 99$ |
| $2 \times 2 \times 5 \times 5 = 100$ | $2^2 \times 5^2 = 100$ |

Even if and when the desire is to express composite numbers in the binary base 2 number system, that is, instead of the decimal base 10 number system, this same method of data compression can be used.

Data Compression Using the Values and/or Numbers: 0, 1, 2, $2^n$, 3, $3^n$

All of the values and numbers between 0-100 can be expressed by the following: 0, 1, 2, $2^2$, $2^3$, $2^4$, $2^5$, $2^6$, 3, $3^2$, $3^3$, $3^4$, and the use of addition. Here are the values and numbers between 0-100 showing some of the possible prime number combinations which provide solutions:

0
1
2
3
$4 = 2^2$
$5 = 2 + 3$
$6 = 2^2 + 2$
$7 = 2^2 + 3$
$8 = 2^3$
$9 = 3^2$
$10 = 2^3 + 2$
$11 = 3^2 + 2$
$12 = 3^2 + 3$ or $2^3 + 2^3$
$13 = 3^2 + 2^2$
$14 = 3^2 + 3 + 2$ or $2^3 + 2^2 + 2$
$15 = 3^2 + 2^2 + 2$
$16 = 2^4$
$17 = 3^2 + 2^3$
$18 = 3^2 + 3^2$
$19 = 2^4 + 3$
$20 = 2^4 + 2^2$
$21 = 3^2 + 2^3 + 2^2$
$22 = 2^3 + 2^2 + 2$
$23 = 2^3 + 2^2 + 3$
$24 = 2^4 + 2^3$
$25 = 3^2 + 2^4$ or $5^2$
$26 = 3^2 + 3^2 + 2^3$
$27 = 3^3$
$28 = 2^4 + 2^3 + 2^2$
$29 = 3^3 + 2$
$30 = 3^3 + 3$
$31 = 3^3 + 2^2$
$32 = 2^5$
$33 = 3^2 + 2^4 + 2^3$
$34 = 3^2 + 3^2 + 2^4$
$35 = 3^3 + 2^3$
$36 = 2^5 + 2^2$
$37 = 3^2 + 2^4 + 2^3$
$38 = 3^3 + 2^3 + 3$
$39 = 3^3 + 2^4 + 2^2$
$40 = 2^5 + 2^3$
$41 = 3^2 + 2^5$
$42 = 3^2 + 3^2 + 2^4 + 2^3$ or $2^5 + 2^3 + 2$
$43 = 3^3 + 2^4$
$44 = 2^5 + 2^3 + 2^2$
$45 = 3^2 + 2^5 + 2^2$
$46 = 2^5 + 2^3 + 2^2 + 2$
$47 = 3^3 + 2^4 + 2^2$
$48 = 2^5 + 2^4$
$49 = 3^2 + 2^5 + 2^3$
$50 = 3^2 + 3^2 + 2^5$
$51 = 3^3 + 2^3 + 2^4$
$52 = 2^5 + 2^4 + 2^2$
$53 = 3^2 + 2^5 + 2^3 + 2^2$
$54 = 3^3 + 3^3$
$55 = 3^3 + 2^4 + 2^3 + 2^2$
$56 = 2^5 + 2^4 + 2^3$
$57 = 3^2 + 2^5 + 2^4$
$58 = 3^3 + 3^2 + 2^2 + 2$
$59 = 3^3 + 2^5$
$60 = 2^5 + 2^4 + 2^3 + 2^2$
$61 = 3^3 + 2^5 + 2$ or $3^2 + 2^5 + 2^4 + 2^2$
$62 = 3^3 + 3^3 + 2^3$
$63 = 3^3 + 2^5 + 2^2$
$64 = 2^6$
$65 = 3^2 + 2^5 + 2^4 + 2^3$
$66 = 2^6 + 2$
$67 = 2^6 + 3$ or $3^3 + 3^3 + 3^2 + 2^2$
$68 = 2^6 + 2^2$
$69 = 2^6 + 3 + 2$
$70 = 2^6 + 2^2 + 2$
$71 = 3^3 + 3^2 + 2^5 + 3$
$72 = 2^6 + 2^3$
$73 = 3^2 + 2^6$
$74 = 3^3 + 3^2 + 2^5 + 2^4$
$75 = 3^3 + 2^5 + 2^4$ or $5^3$
$76 = 3^3 + 3^2 + 2^5 + 2^3$
$77 = 3^2 + 2^6 + 2^2$
$78 = 3^3 + 3^3 + 2^5 + 2$
$79 = 3^3 + 2^5 + 2^4 + 2^2$
$80 = 2^6 + 2^4$
$81 = 3^4$
$82 = 3^2 + 3^2 + 2^6$
$83 = 3^4 + 2$
$84 = 2^6 + 2^4 + 2^2$
$85 = 3^4 + 2^2$
$86 = 3^4 + 2 + 3$
$87 = 3^4 + 2^2 + 2$
$88 = 2^6 + 2^4 + 2^3$

-continued $$89 = 3^4 + 2^3$$
$$90 = 3^4 + 3^2$$
$$91 = 3^3 + 2^6$$
$$92 = 2^6 + 2^4 + 2^3 + 2^2$$
$$93 = 3^2 + 2^6 + 2^4 + 2^2$$
$$94 = 3^4 + 3^2 + 2^2$$
$$95 = 3^3 + 2^6 + 2^2$$
$$96 = 2^6 + 2^5$$
$$97 = 3^4 + 2^4$$
$$98 = 3^3 + 2^6 + 2^2 + 3$$
$$99 = 2^6 + 2^5 + 3$$
$$100 = 3^4 + 2^4 + 3$$

In fact, all positive whole numbers can be expressed by the values and numbers 0, 1, 2, $2''$, 3, $3''$, and the use of addition. For example, here is the number $678=3^5+3^3+2^8+2^7+2^4+2^3$. The number 678 can be represented by 6 sine waves, vibes, or qubits, plus 5 more for the plus signs for a total of 11 waves, vibes, or qubits. However, when it would be understood and/or programmed with computer software that the series of numbers or values would be added then only 6 waves, vibes, or qubits would be required, whereas the same number in binary is 01010100110 which is 11 bits. It is common to represent very large numbers by indicating their nth exponential power in base 10, e.g., one million=1× $10^6$. The above discussion and the provided examples show that it is possible to represent a positive number in some combination of the values or numbers 0, 1, 2, $2''$, 3, $3''$. For example, in order to represent all numbers between 0-678, only the values and/or numbers 0, 1, 2, $2^2$ $2^3$, $2^4$, $2^5$, $2^6$, $2^7$, $2^8$, 3, $3^2$, $3^3$, $3^4$ (and perhaps a few more exponential powers of 2 and 3) would be required, thus a total of only about 14 different values and numbers. Accordingly, it is possible to use 0, 1, 2, $2''$, 3, $3''$ in order to represent positive numbers and the number of bits and amount of processing time and memory normally required to do so can sometimes then be reduced relative to the current at least 8 bit per number method that is being widely used today.

$2^{10}=1,024$
$3^{10}=59,049$
$3^{20}=3,486,784,401$

In binary language, this last number 3,486,784,401 is: 011001111111010100000110111001001 which is 34 bits. Each of these values and/or numbers can be communicated using either a square wave having a specific frequency and wavelength which is conducive to digital communication, and/or a sine wave having a specific frequency and wavelength which is conducive to optical communication and also optical and quantum computing. In either case, only 1 or 2 photonic or optical waves, vibes, or qubits would be required to represent $3^{20}$ which is equal to 3,486,784,401 and coded as 011001111111010100000110111001001 in binary notation. Instead of only using the values and numbers 0, 1, 2, $2''$, 3, $3''$, the prime number 5, $5''$, or other larger numbers could also be used in order to reduce the number of bits required to express larger numbers.

$5^{10}=9,765,625$
$5^{20}=95,367,431,600,000$

Accordingly, it is possible to represent very large numbers without using exponents which have values greater than 20. The numbers 0, 1, 2, $2''$, 3, $3''$, 5, $5''$ with n up to the $20^{th}$ power can be placed into ROM, RAM, Flash, Solid State Drive (SSD) and/or optical memory, or other means of persisting data and information. This does not require the listing or storage of many different values and numbers. Obviously, other prime numbers and their exponential forms can be used to represent large numbers. Accordingly, the present disclosure relates to the development of a language and code for software development to perform mathematical computations on a conventional CPU logic chip, an optical CPU logic chip, a hybrid CPU logic and memory chip, a hybrid optical CPU logic and memory optical chip, or a hybrid CPU logic chip and optical memory chip, or vice-versa, using a form of data compression. As a result, the length of resulting digital and/or optical communications and the power required to make calculations can be reduced and processing speed increased. In this regard, one example of a hybrid and combined logic and memory chip is now being called a processing in memory (PIM) circuit or chip which uses neural networks and resistive random access memory (RRAM-PIM) to process and persist data and information, as discussed in the article "Research Brings Analog Computers Just One Step From Digital," by Brandie Jefferson published by Techxplore.com on Dec. 8, 2021: htts-/techxolore.com/news/2021-12-analog-digital.html.

Figure 32:
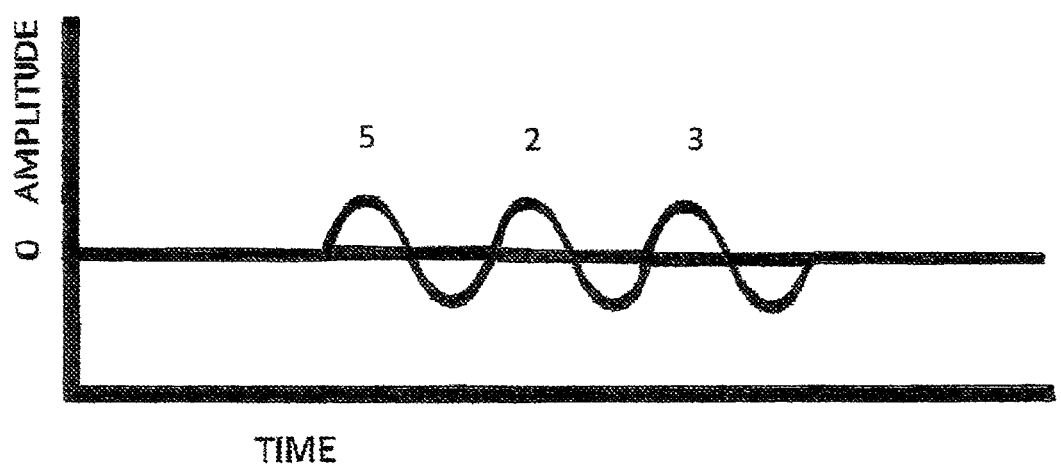
FIG. 32 shows a representation of the screen of an oscilloscope showing three different resultant wave forms which are each derived from a base number portion in a known base number system and an exponent portion and which have been manipulated by a mathematical function to derive the three different resultant wave forms each having a specific wavelength which represents and communicates a value or number.
Figure 33:
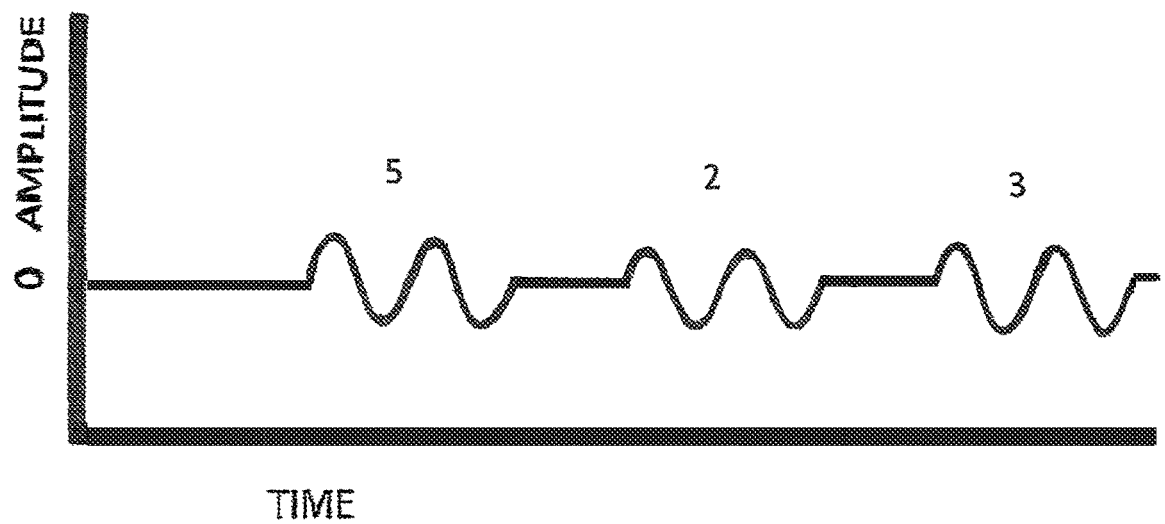
FIG. 33 shows a representation of the screen of an oscilloscope showing two cycles of each of three different resultant wave forms which are each derived from a base number portion in a known base number system and an exponent portion and which have been manipulated by a mathematical function to derive the three different resultant wave forms each having a specific wavelength which represents and communicates a value or number.

Square waves or sine waves can be used to represent both the base portion of a number and also the exponent portion. In drawing FIGS. 5-12, 15, and 16, for the sake of simplicity and in order to facilitate understanding and comprehension for the readers of this disclosure the base portion and the exponent portions of various numbers are shown on two separate lines which resemble two different signal channels as could be seen on an oscilloscope. It can be readily understood that if the wave forms shown in FIGS. 5-12, 15, and 16 on the two lines would be added and combined there would instead be one or more resultant wave forms shown on a single line. Drawing FIGS. 13-14, 25, and 26 show sine waves representing the base portion and exponent portions of various numbers individually on a single line. It can be readily understood that if the sine waves showing the base portions and exponent portions in FIGS. 13-14, 25, and 26 would be added and combined then one or more larger resultant sine waves could then be derived and shown on a single line. Drawing FIGS. 32-33 show the numbers 5, 2, 3 represented as individual sine waves on a single line. It can be readily understood that if the three numbers 5, 2, 3 would be summed together and/or communicated at the same time then one or more larger resultant sine wave could be derived and shown on a single line.

When multiple individual wave forms are combined to derive and create a resultant wave form the frequencies of the individual wave forms can nevertheless be known, represented and communicated using the Fast Fourier Transform (FFT) Algorithm which computes the discrete Fourier Transform (DFT) of a sequence, or its inverse which is called the inverse discrete Fourier Transform (IDFT). The Faster Fourier Transform FFT is widely used in engineering, mathematics, music, and science, e.g., see https://en.wikipedia.org/wiki/Fast (Fourier Transform), https://youtu.be/h7apO7q16V0, and the Lecture Collection entitled "The Fourier Transforms and Its Applications," by Professor Brad Osgood of Stanford University which includes 30 lectures, the following Youtube links being to Lectures 1-5: https://youtu.be/gZNm7L96pfY, https://youtu.be/1rcqJI7Rs6ps, https://youtu.be/BjBb5llrNsQ, https://youtu.be/n5lBM7nn2eA, and https://youtu.be/X5qRpgfQld4. For information on using the Fast Fourier Transform FFT Algorithm with the Java computer language, see, e.g., the article "Fun With Java, Understanding the Fast Fourier Transform (FFT) Algorithm," by Richard G. Baldwin published Jan. 5, 2005, on the website, https://developer.com/java/fun-with-Java-understanding-the-fast-fourier-transform-fft-algo-rithm/; "FFT.java," published on the website, https://introcs.cs.princeton.edu/iava/97data/FFT.java.html, by Princeton University, author unknown, on Jan. 14, 2020; and, "FFT in Java," published on the website, https://www.imaging.utk.edu/research/inarvaez/ece572/reports/FFT_java%20tips.pdf, by Ingrid Narvaez, of the University of Tennessee.

Accordingly, data and information in wave form can be represented and communicated with the amplitude being shown on the vertical axis and time being shown on the horizontal axis of a graph, and the data and information can possibly include a plurality of individual wave forms which may overlap one another and then form one or more resultant wave forms, but with the use of the Fast Fourier Transform the data and information can be processed and represented to show amplitude on the x axis and frequency on the y axis of a graph, or another other tangible medium of expression in order to represent and show the individual frequencies of the plurality of individual wave forms which are included in the resultant wave forms. For example, see drawing FIGS. 34-36 and related discussion of this subject in greater detail below. In this regard, it is possible to communicate a plurality of letters, words, symbols, numbers, or commands, simultaneously, or nearly so, using photons and visible light and/or invisible infrared light, or other invisible light portions of the electromagnetic spectrum, and the individual wave forms and frequencies which have been assigned and coded to represent each letter, word, symbol, number, or command can be represented, identified, read and understood by a user of a computer or other data storage and processing device which includes a software application which includes a compilation of programs, codes, lists, algorithms, and commands for processing, manipulating, and storing data and information. While the use of an optical computer, electro-optical hybrid computer, or quantum computer can provide for higher processing speeds and/or the ability to perform more complex calculations and operations, the use of square waves and digital communication using the binary system can also be used to represent and process data and information in the temporal domain and the Fast Fourier Transform can then be used to show information in the frequency domain.

Figure 5:
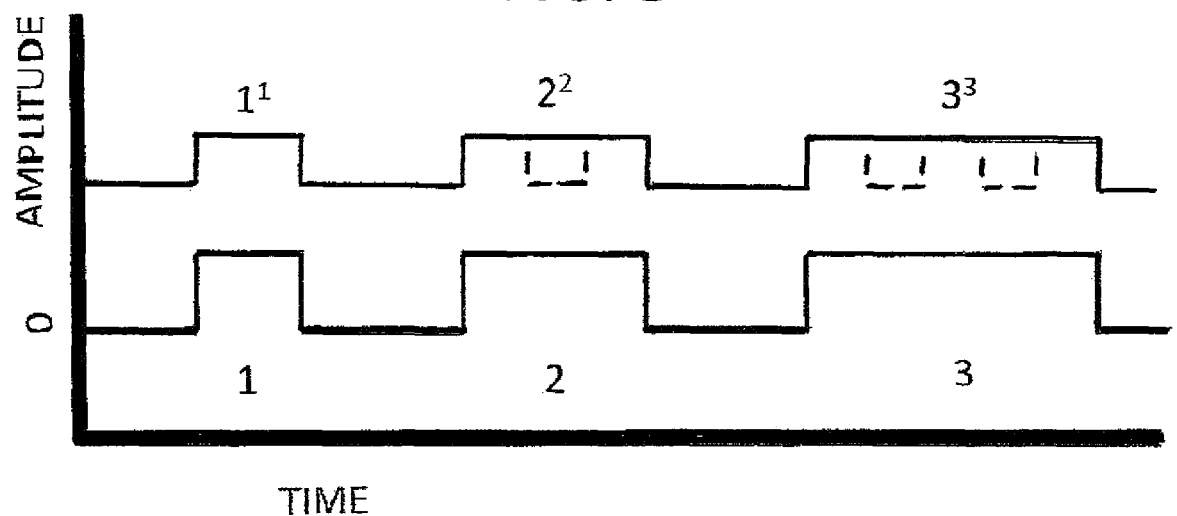
FIG. 5 shows a representation of the screen of an oscilloscope showing square waves representing the base portion of numbers 1, 2, and 3, and also square waves representing the exponent portion of the numbers.
Figure 6:
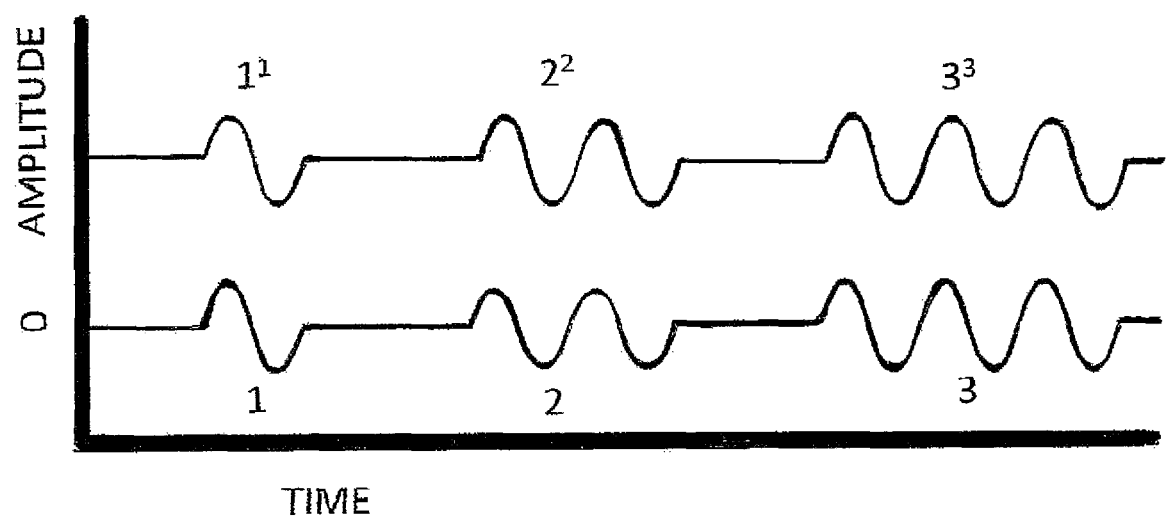
FIG. 6 shows a representation of the screen of an oscilloscope showing sine waves representing the base portion of the numbers 1, 2, and 3, and also sine waves representing the exponent portion of the numbers.

FIG. 5 shows a representation of the screen of an oscilloscope showing large square waves representing the base portion of numbers 1, 2, and 3, and small square waves representing the exponent portion of the numbers. As shown, the value of the exponent portion can be communicated in a single block or multiple portions which are shown in phantom dashed lines. FIG. 6 shows a representation of the screen of an oscilloscope showing large sine waves representing the base portion of numbers 1, 2, and 3, and small sine waves representing the exponent portion of the numbers.

Figure 7:
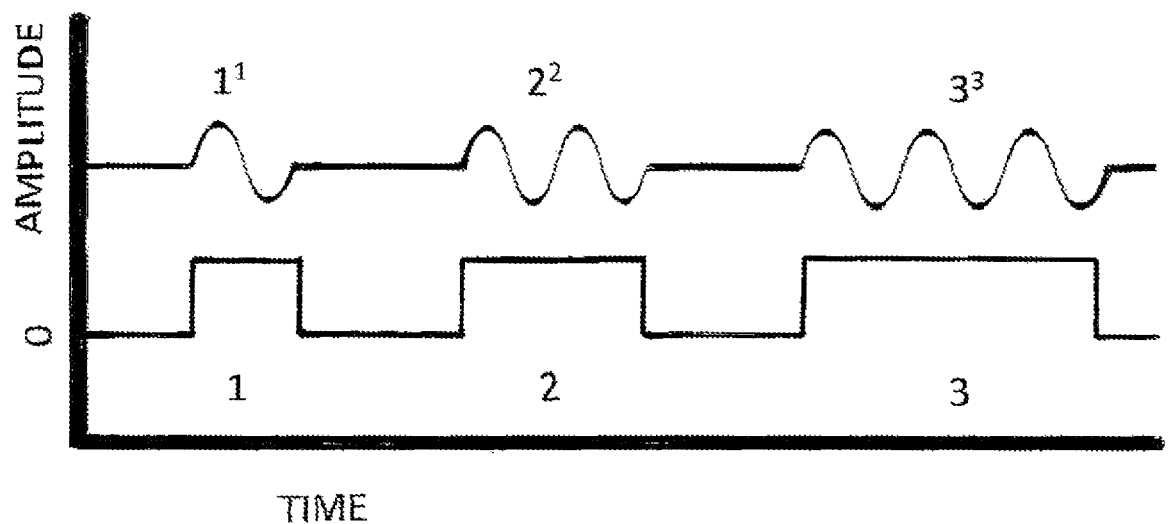
FIG. 7 shows a representation of the screen of an oscilloscope showing square waves representing the base portion of numbers 1, 2, and 3, and also sine waves representing the exponent portion of the numbers.
Figure 8:
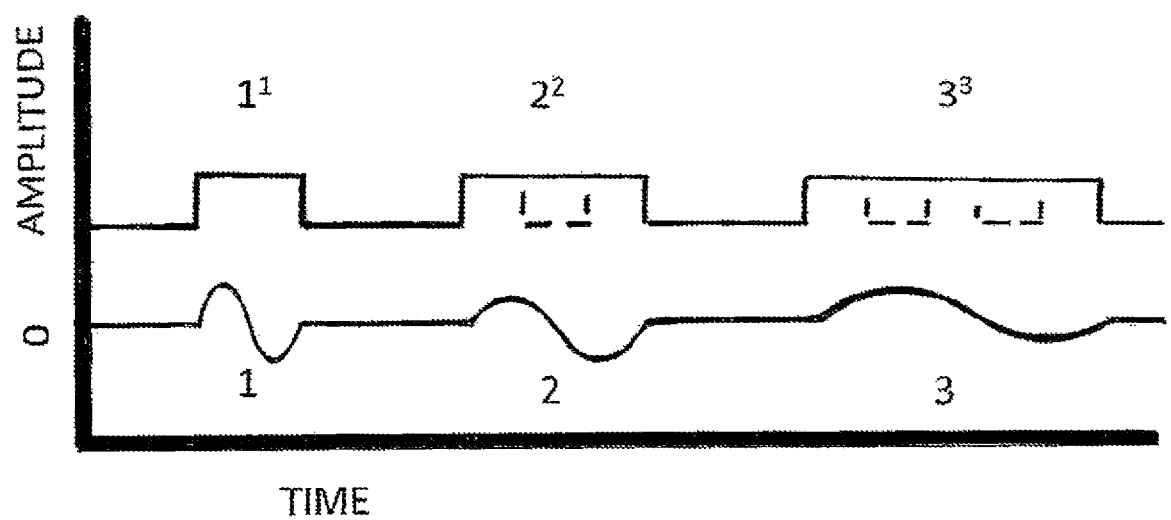
FIG. 8 shows a representation of the screen of an oscilloscope showing sine waves representing the base portion of numbers 1, 2, and 3, and also square waves representing the exponent portion of the numbers.

Alternatively, it is possible to combine both a square wave and sine wave in communication and then use, e.g., a sine wave to represent the base portion of a number and a square wave to represent the exponent portion, or vice-versa. In this regard, FIG. 7 shows a representation of the screen of an oscilloscope showing large square waves representing the base portion of numbers 1, 2, and 3, and sine waves representing the exponent portion of the numbers. FIG. 8 shows a representation of the screen of an oscilloscope showing sine waves representing the base portion of numbers 1, 2, and 3, and square waves representing the exponent portion of the numbers.

As shown in FIG. 5, a square wave having an amplitude and wavelength can be used to represent the base portion of the number 1 and a smaller square wave can be used to represent its exponent portion 1, thus the value of the number in view of its exponent is 1. Further, a square wave having a different wavelength can be used to represent the base portion of the number 2 and either one or two smaller square waves can be used to represent its exponent 2, thus the value of the number in view of the exponent is 4. In addition, a square wave having a different wavelength can be used to represent the base portion of the number 3, and either one or three smaller square waves can be used to represent its exponent 3, thus the value of the number in view the exponent is 27: $1^1=1$, and $2^2$ 4 and $3^3=27$, and so a sum of these three numbers would be 32. In this example, it can be seen that the frequency and wavelength of the square waves representing the base portion of the numbers 1, 2, and 3 are proportional, but this need not be the case.

As shown in FIG. 6, a sine wave having an amplitude and wavelength can be used to represent the base portion of the number 1 and a smaller sine wave can be used to represent its exponent 1, thus the value of the number in view of its exponent is 1. Further, a sine wave having a different wavelength can be used to represent the base portion of the number 2 and two smaller sine waves can be used to represent its exponent 2, thus the value of the number in view of the exponent is 4. In addition, a sine wave having a different wavelength can be used to represent the base portion of the number 3, and three smaller sine waves can be used to represent the exponent 3: $1^1=1$, and $2^2=4$, and $3^3=27$, and so the sum of these three numbers would be 32. In this example, it can be seen that the frequency and wavelength of the sine waves representing the base portion of the numbers 1, 2, and 3 are proportional, but this need not be the case.

As shown in FIG. 7, the same kind of thing can be done using square waves to represent the base and sine waves to represent the exponent of a number: $1^1=1$, and $2^2=4$, and $3^3=27$. If and when desired, the sum of these three numbers would be 32. In this example, it can be seen that the frequency and wavelength of the sine waves representing the base portion of the numbers 1, 2, and 3 are proportional, but this need not be the case. Further, it would not typically be the case that a digital square wave would be used to communicate one portion of the value of a number, and then a sine wave be used to represent another portion of the value of a number, at least not unless the information was being processed in series or parallel and then possibly by hybrid chip that would be capable of both a digital and optical processing capability. Alternatively, it can be readily understood that if the sine waves having values $1^1=1$, and $2^2=4$, and $3^3$ would instead be changed to have the values 1, 2, and 3 in this drawing figure, then drawing FIG. 7 could be used to show a possible conversion of data and information from a digital format which uses square waves to an analog one which uses sine waves.

As shown in FIG. 8, the same kind of thing can be done using sine waves to represent the base and square waves to represent the exponent: $1^1=1$, and $2^2=4$, and $3^3=27$. If and when desired the sum of these three numbers would be 32. In this example, it can be seen that the frequency and wavelength of the sine waves representing the base portion of the numbers 1, 2, and 3 are proportional, but this need not be the case. Once again, it would not typically be the case that a digital square wave would be used to communicate one portion of the value of a number, and then a sine wave be used to represent another portion of the value of a number, at least not unless the information was being processed in series or parallel and then possibly by hybrid chip that would be capable of both a digital and optical processing capability. Alternatively, it can be readily understood that if the values $1^1=1$, and $2^2=4$, and $3^3$ would be changed to 1, 2, and 3 in this drawing figure, then drawing FIG. 8 could be used to represent a possible conversion of data and information from a digital format which uses square waves to an analog one which uses sine waves.

Again, $3^{20}=3,486,784,401$. In binary, this number is coded and represented as: 0110011111110101000001101110010001 which is 34 bits. However, a sine wave having a specific frequency and wavelength could be used to represent and communicate the base number 3 in $3^{20}$, and a different sine wave having a specific frequency and wavelength which can be communicated nearly or actually simultaneously could be used to represent the exponent $10^{20}$. This would only require one or two waves, vibes or qubits of information, as opposed to the 34 bits of information required when using the binary system.

Figure 9:
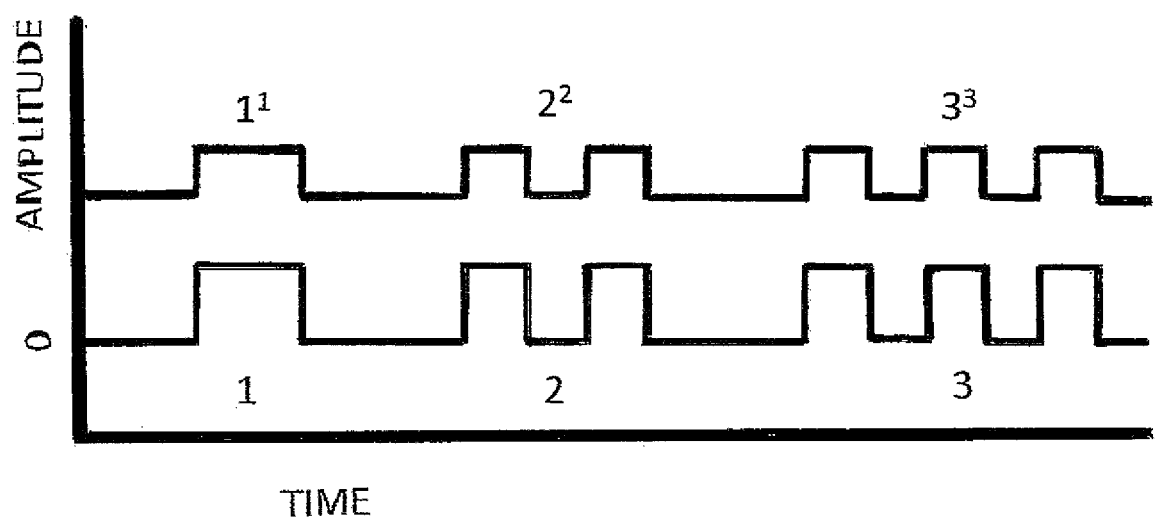
FIG. 9 shows a representation of the screen of an oscilloscope showing multiple square waves representing the base portion of numbers 1, 2, and 3, and also square waves representing the exponent portion of the numbers.

FIG. 9 shows a representation of the screen of an oscilloscope showing multiple square waves representing the base portion of numbers 1, 2, and 3, and also small square waves representing the exponent portion of the numbers. In this case, the number of cycles of the base portion of the number represent the value of the base number, and the number of cycles of the exponent representing the exponent portion of the number represent the value of the exponent. The base and exponent sine waves are nearly or actually coincident in time, and: $1^1=1$, and $2^2=4$, and $3^3=27$. If and when desired, the sum of these three numbers would be 32.

Figure 10:
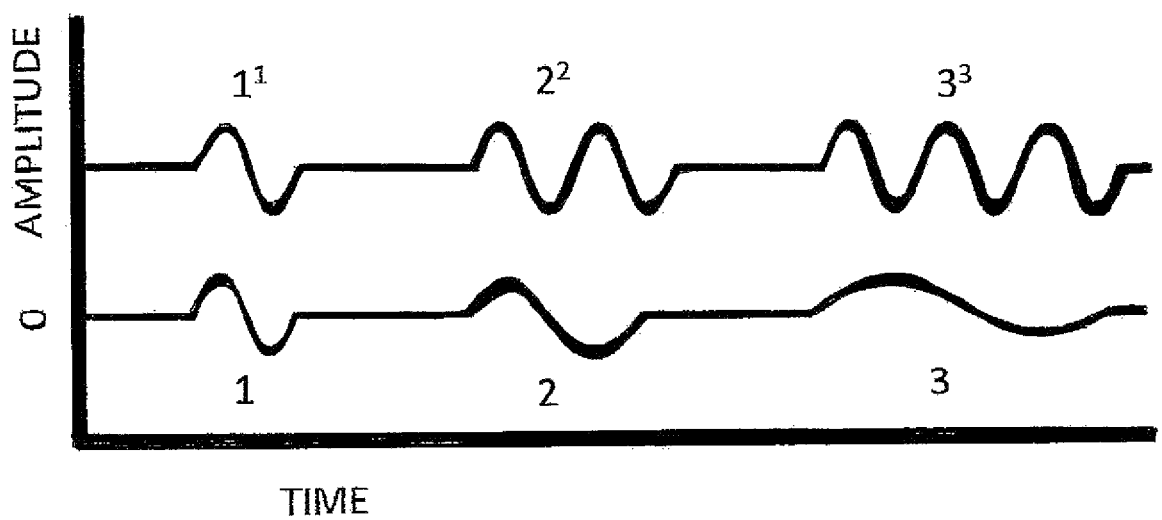
FIG. 10 shows a representation of the screen of an oscilloscope showing multiple sine waves representing the base portion of numbers 1, 2, and 3, and also sine waves representing the exponent portion of the numbers.

FIG. 10 shows a representation of the screen of an oscilloscope showing sine waves representing the base portion of numbers 1, 2, and 3, and also small sine waves representing the exponent portion of the numbers. In this case, the number of cycles of the exponent represent the value of the exponent and the base and exponent sine waves are also nearly or actually coincident in time: $1^1=1$, and $2^2=4$ and $3^3=27$. If and when desired, the sum of these three numbers would be 32.

Figure 11:
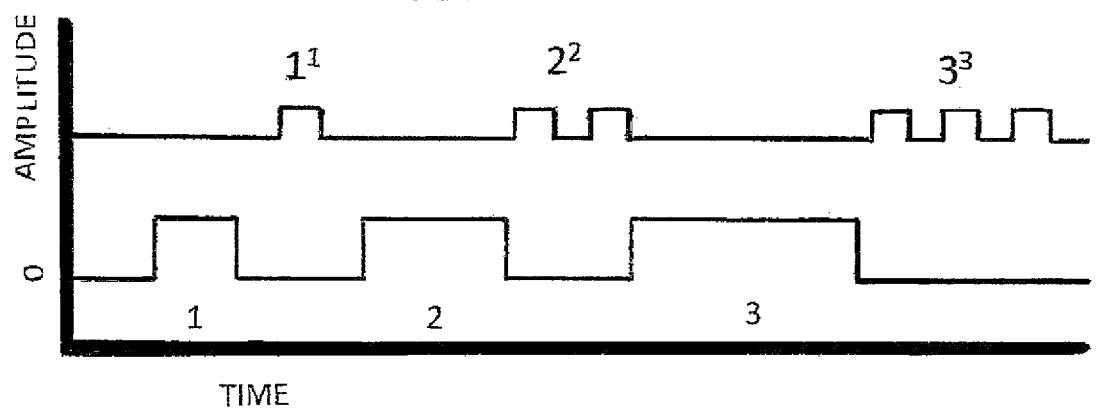
FIG. 11 shows a representation of the screen of an oscilloscope showing square waves representing the base portion of numbers 1, 2, and 3, and also square waves representing the exponent portion of the numbers which are offset in time.

FIG. 11 shows a representation of the screen of an oscilloscope showing a first line including large square waves representing the base portion of numbers 1, 2, and 3, and a second line at a different amplitude including small square waves representing the exponent portion of the base numbers and which are offset in time. In this case, the wavelength of the base portion of the number represents the value of the base number, and the number of cycles of the exponent represents the value of the exponent: $1^1=1$, and $2^2=4$, and $3^3=27$. If and when desired, the sum of these three numbers would be 32.

Figure 12:
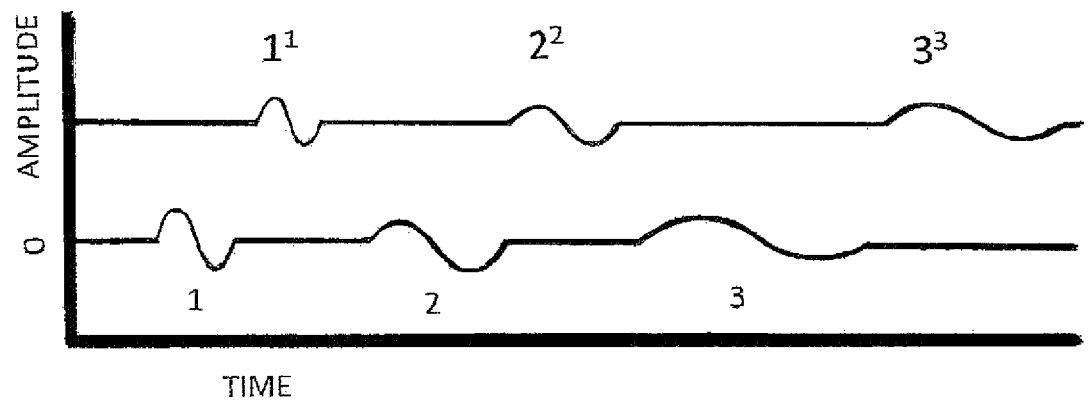
FIG. 12 shows a representation of the screen of an oscilloscope showing sine waves representing the base portion of numbers 1, 2, and 3, and also sine waves representing the exponent portion of the numbers which are offset in time.

FIG. 12 shows a representation of the screen of an oscilloscope showing a first line including large sine waves representing the base portion of numbers 1, 2, and 3, and a second line at a different amplitude including small sine waves representing the exponent portion of the base numbers and which are offset in time. In this case, the wavelength of the base portion of the number represents the value of the base number, and the number of cycles of the exponent represents the value of the exponent: $1^1=1$, and $2^2=4$, and $3^3=27$. If and when desired, the sum of these three numbers would be 32.

Figure 13:
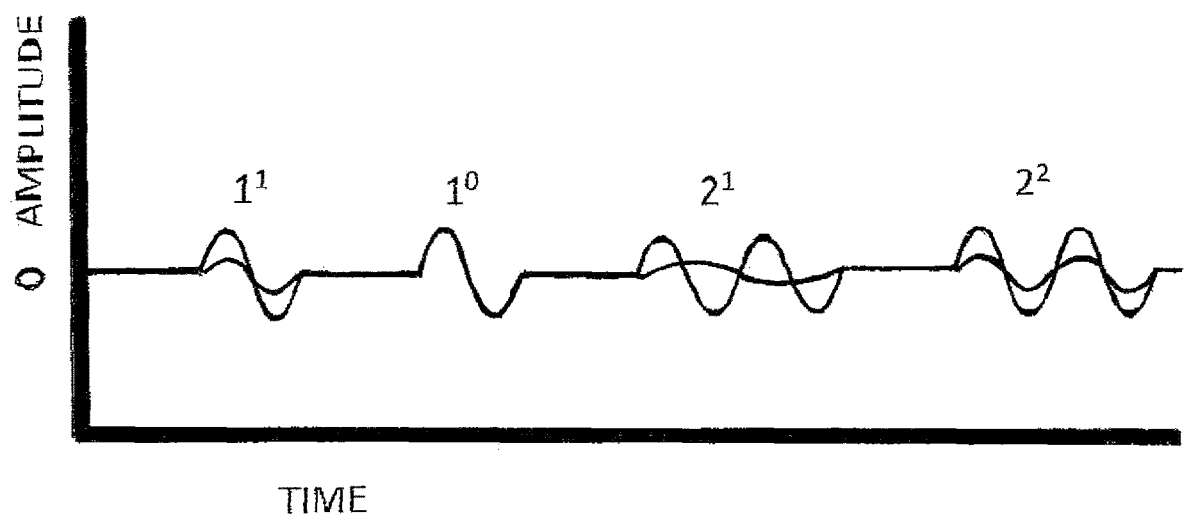
FIG. 13 shows a representation of the screen of an oscilloscope showing sine waves representing the base portion of numbers 1 and 2, and also sine waves representing the exponent portion of the numbers and which are disposed on the same 0 axis.

FIG. 13 shows a representation of the screen of an oscilloscope showing large sine waves having greater amplitude representing the base portion of the numbers or values 1 and 2, and also small sine waves having lesser amplitude representing the exponent portion of the number disposed on and about the same 0 axis and reference line: $1^1=1$, and $1^0=1$, and $2^1=2$, and $2^2=4$. If and when desired, the sum of these four numbers would be 8. Alternatively, large square waves could be used to represent the base portion of the numbers 1 and 2, and small square waves could be used to represent their corresponding exponents. It can be readily understood that the possible overlapping and summation of a plurality sine waves on a single reference line or graph can derive and result in one or more resultant waves being created in which the individual contributing sine wave forms may or may not be discernable to the human eye, but nevertheless be detectible using the Fast Fourier Transform Algorithm which is discussed in greater detail below.

Figure 14:
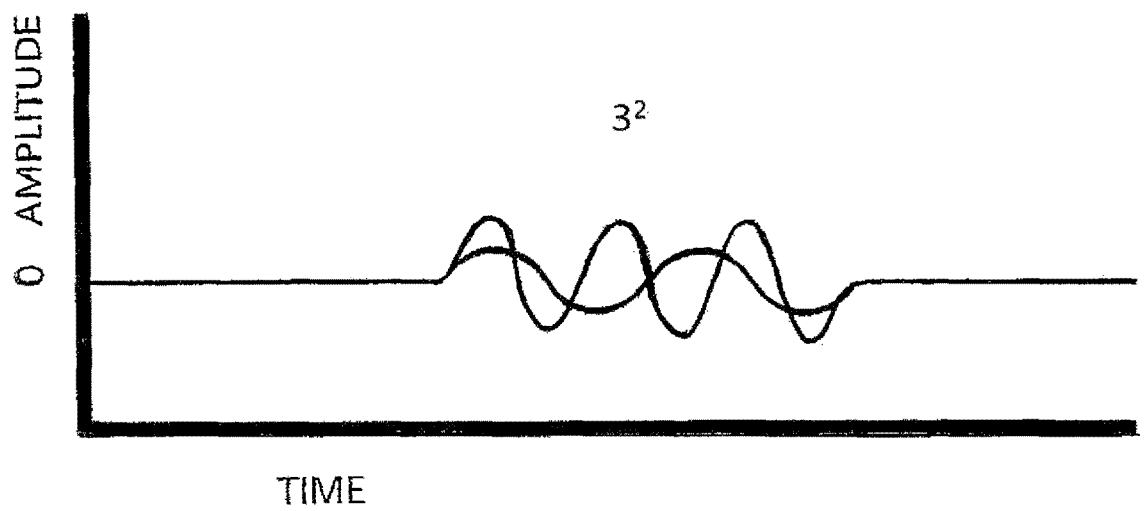
FIG. 14 shows a representation of the screen of an oscilloscope showing sine waves representing the base portion of number 3, and also sine waves representing 2 which is the exponent portion of the number 3 and which are disposed on the same 0 axis.

FIG. 14 shows a representation of the screen of an oscilloscope showing three large sine waves having greater amplitude representing the base portion of number 3, and also two small sine waves having lesser amplitude representing 2 which is the exponent portion of the number 3 disposed on the same 0 axis: $3^2=9$. Alternatively, large square waves could be used to represent the base portion of the number 3, and two small square waves could be used to represent its exponent 2. Again, it can be readily understood that the possible overlapping and summation of a plurality sine waves on a single reference line or graph can derive and result in one or more resultant waves being created in which the individual contributing sine wave forms may or may not be discernable to the human eye, but nevertheless be detectible using the Fast Fourier Transform Algorithm which is discussed in greater detail below.

Figure 15:
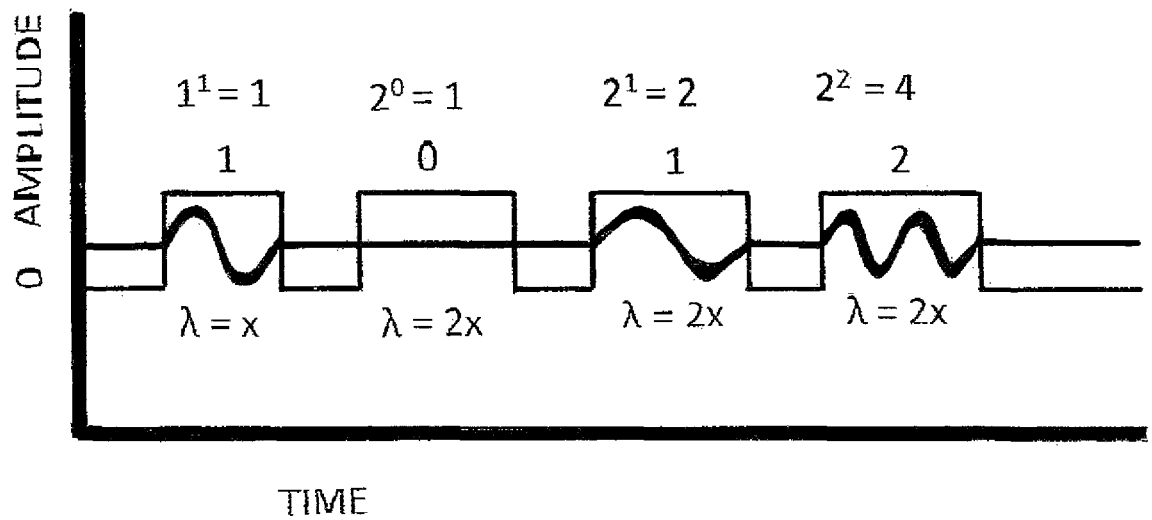
FIG. 15 shows a representation of the screen of an oscilloscope showing square waves representing the base portion of numbers 1 and 2, and also sine waves representing the exponent portion of the numbers and which are disposed on nearly the same axis.

FIG. 15 shows a representation of the screen of an oscilloscope showing large square waves representing the base portion of numbers 1 and 2, and small sine waves disposed on nearly the same axis representing the exponent portion of the numbers. It can be seen the $1^1=1$, and $2^0=1$ and so it can be used to represent 1, and $2^1=2$, and $2^2=4$. If and when desired, the sum of these four numbers would be 8. However, it would not typically be the case that a digital square wave would be used to communicate one portion of the value of a number, and then a sine wave be used to represent another portion of the value of a number, at least not unless the information was being processed in series or parallel and then possibly by hybrid chip that would be capable of both a digital and optical processing capability.

Figure 16:
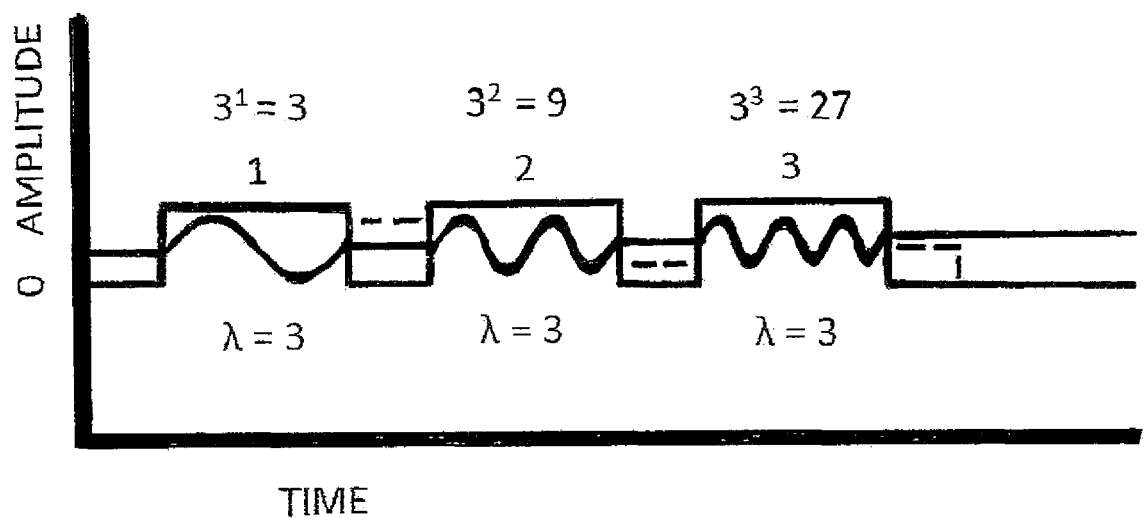
FIG. 16 shows a representation of the screen of an oscilloscope showing square waves representing the base portion of number 3, and also sine waves representing the exponent portion of the numbers and which are disposed on nearly the same axis.

FIG. 16 shows a representation of the screen of an oscilloscope showing large square waves representing the base portion of number 3, and small sine waves disposed on nearly the same axis representing the exponent portion of the numbers. $3^1=3$, and $3^2=9$, and $3^3=27$. If and when desired, the sum of these three numbers would be 39. Also shown in FIG. 16 using dashed phantom lines, the space between the number $3^1=3$ and $3^2=9$ can have a positive amplitude elevated above the 0 axis and this can be used to represent addition, and the space between the number $3^2=9$ and $3^3=27$ can have a different positive amplitude above the 0 axis and this can be used to represent subtraction, and the space after the square wave representing the number $3^3=27$ can have a different positive amplitude above the 0 axis and this can be used to represent division. Other structures, forms, and ways of representing and communicating mathematical calculations and operations can be used. Again, it would not typically be the case that a digital square wave would be used to represent and communicate one portion of the value of a number, and then a sine wave be used to represent another portion of the value of a number, at least not unless the information was being processed in series or parallel and then possibly by hybrid chip that would be capable of both a digital and optical processing capability. FIG. 15 and FIG. 16 have shown square waves being used to represent the base portion of the numbers, and sine waves to represent the exponent portions. Alternatively, the base portion of the numbers included in FIGS. 15 and 16 could be represented in sine waves, as has been shown in FIG. 10, FIG. 13, and FIG. 14.

Figure 17:
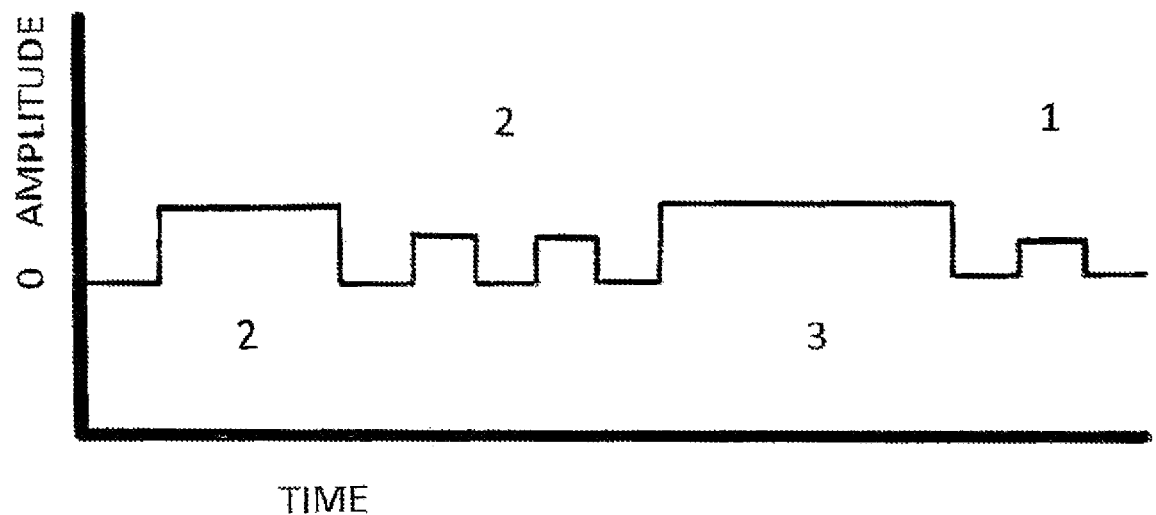
FIG. 17 shows a representation of the screen of an oscilloscope showing large square waves representing the base portion of the numbers 2 and 3, and also small and sometimes multiple square waves having about half the amplitude representing the exponent portion following the base portion of the numbers and which are disposed on the same axis.

FIG. 17 shows a representation of the screen of an oscilloscope showing large square waves representing the base portion of the numbers 2 and 3, and small and sometimes multiple square waves having about half the amplitude representing the exponent portion following the base portion of the numbers and disposed on the same axis. In this way, the information concerning the value of the base number and exponent can be communicated in a digital signal having a single data stream.

Figure 18:
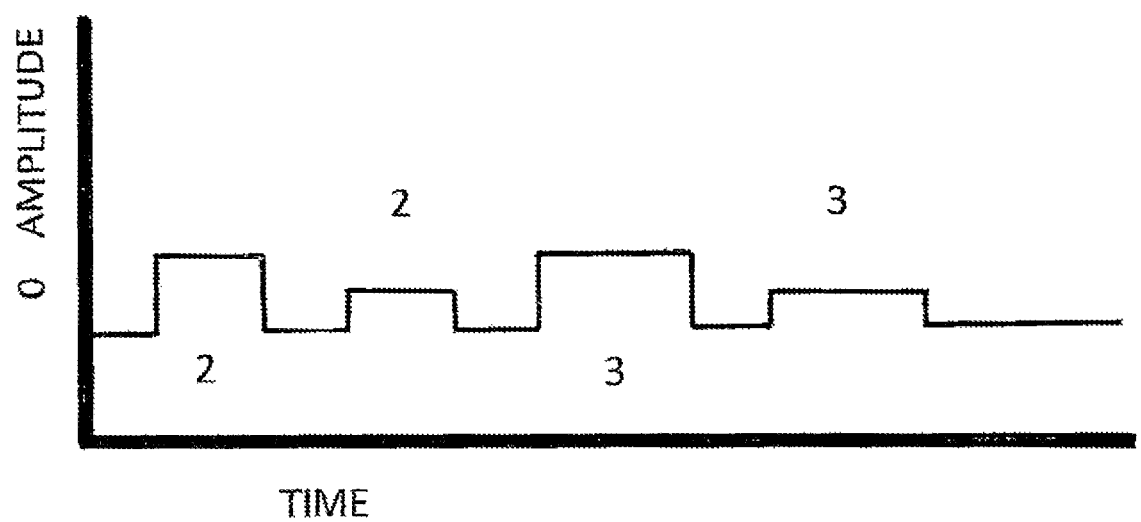
FIG. 18 shows a representation of the screen of an oscilloscope showing large square waves representing the base portion of the numbers 2 and 3, and also small single square waves having about half the amplitude representing the exponent portion following the base portion of the numbers and which are disposed on the same axis.

FIG. 18 shows a representation of the screen of an oscilloscope showing large square waves representing the base portion of the numbers 2 and 3, and also small single square waves having about half the amplitude representing the exponent portion following the base portion of the numbers which are disposed on the same axis. In this way, the information concerning the value of the base number and exponent can be communicated in a digital signal having a single data stream, and only single square waves are used to represent the exponents of the base numbers.

Figure 19:
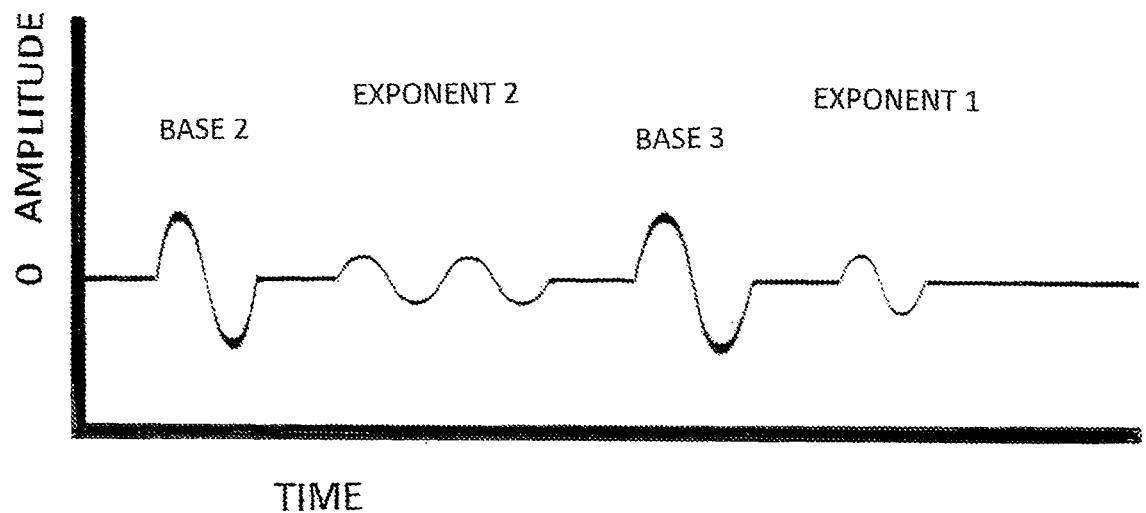
FIG. 19 shows a representation of the screen of an oscilloscope showing large sine waves representing the base portion of the numbers 2 and 3, and also small and sometimes multiple sine waves having less than half the amplitude representing the exponent portion following the base portion of the numbers and which are disposed on the same axis.

FIG. 19 shows a representation of the screen of an oscilloscope showing large sine waves representing the base portion of the numbers 2 and 3, and small and sometimes multiple sine waves having less than half the amplitude representing the exponent portion following the base portion of the numbers which are disposed on the same axis. In this way, the information concerning the value of the base number and exponent can be communicated in an analog signal having a single data stream.

Figure 20:
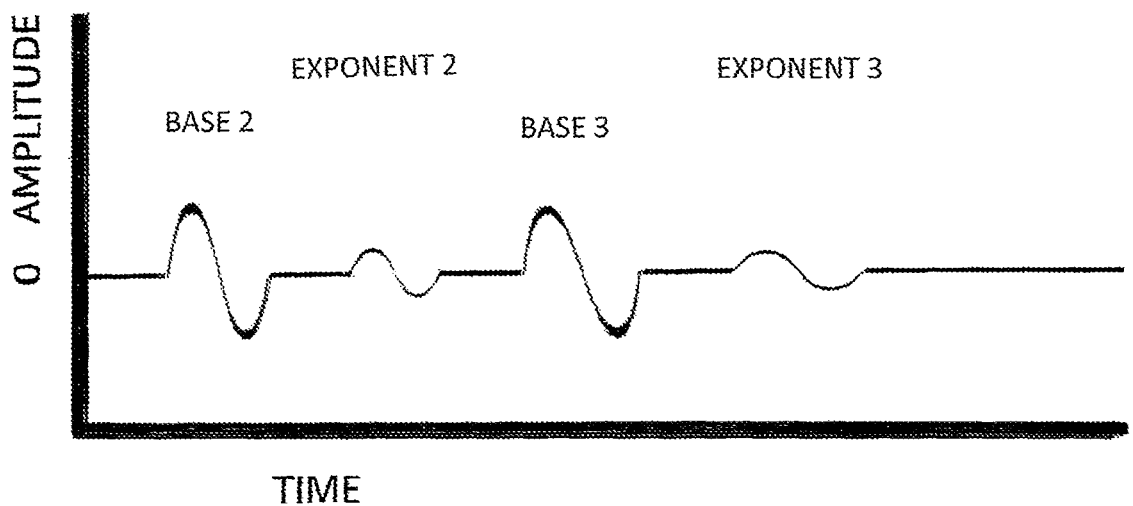
FIG. 20 shows a representation of the screen of an oscilloscope showing large sine waves representing the base portion of the numbers 2 and 3, and also small single sine waves having less than half the amplitude representing the exponent portion following the base portion of the numbers and which are disposed on the same axis.

FIG. 20 shows a representation of the screen of an oscilloscope showing large sine waves representing the base portion of the numbers 2 and 3, and small single sine waves having less than half the amplitude representing the exponent portion following the base portion of the numbers which are disposed on the same axis. In this way, the information concerning the value of the base number and exponent can be communicated in an analog signal having a single data stream, and only single sine waves are used to represent the exponents of the base numbers.

Figure 21:
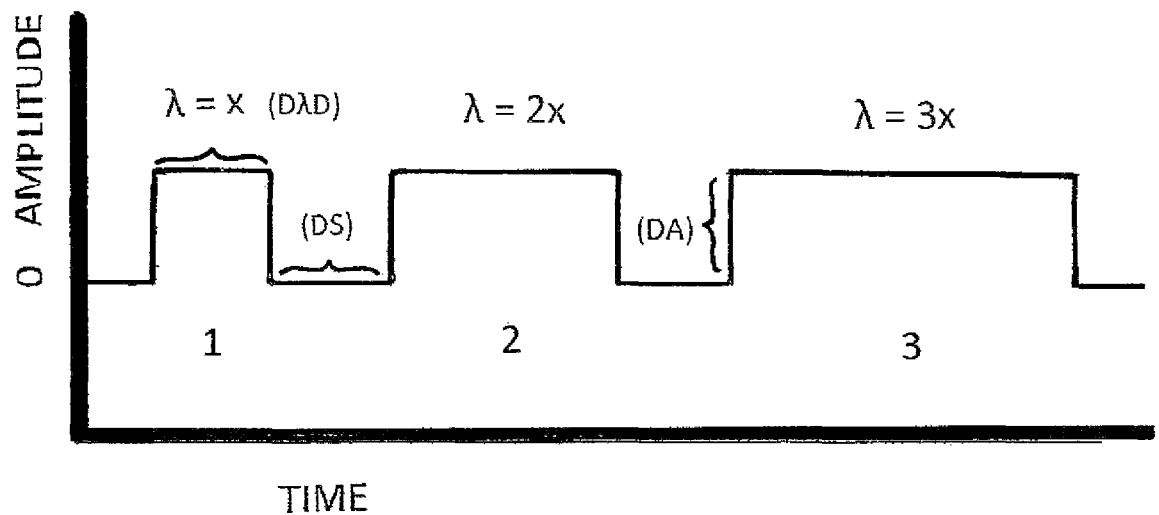
FIG. 21 shows a representation of the screen of an oscilloscope showing a series of large square waves representing the base portion of the numbers 1, 2 and 3 which are disposed on the same axis.

FIG. 21 shows a representation of the screen of an oscilloscope showing a series of single large square waves representing the base portion and exponent portion of the numbers 1, 2, and 3, which could also be used to represent other numbers or values such as 1, $2^2$ and $3^2$, and which are disposed on the same axis. The square waves are spaced apart in time by a desired detectable separation in time for accuracy indicated as (DS), and have a desired detectable amplitude (DA), and a desired detectable wavelength ($\lambda$) difference (D$\lambda$D)=x, and/or multiples thereof.

Figure 22:
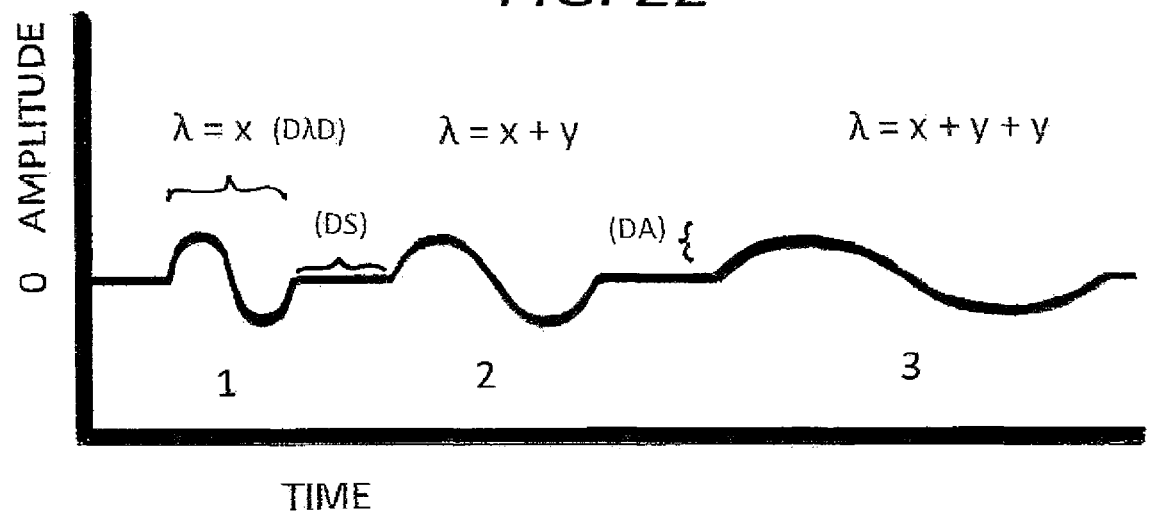
FIG. 22 shows a representation of the screen of an oscilloscope showing a series of single large sine waves representing the base portion of the numbers 1, 2 and 3 which are disposed on the same axis.

FIG. 22 shows a representation of the screen of an oscilloscope showing a series of single large sine waves representing the base portion and exponent portion of the numbers 1, 2, and 3, which could also be used to represent other numbers or values such as 1, $2^2$ and $3^2$, and which are disposed on the same axis. The sine waves are spaced apart in time by a desired separation in time for accuracy (DS). Further, the length of the wavelengths of the sine waves are different from one another by a desired detectable wavelength difference (D$\lambda$D)=x. As shown, if the number 1 is represented by a sine wave having length x, then the number 2 can be represented by a sine wave having length x+y, that is, which exceeds the desired detectable wavelength difference x by a detectable difference y, and the number 3 can be represented by x+y+y. Other desired separations in time (DS) and desired detectable wavelength differences (D$\lambda$D), and desired detectable differences in amplitude (DA) can be used. It can be readily understood that various desired separations in time (DS) and desired detectable wavelength differences (D$\lambda$D), and also desired detectable differences in amplitude (DA) can be used and applied to all of the drawing figures and examples discussed in this disclosure, and that a software application which includes suitable programs which can include codes, commands, and algorithms can read and communicate such data and information and execute commands and run programs to perform calculations and operations using this information.

Algorithms, data structures, and other methods and techniques used in computer science include but are not limited to the following: Aho Corasick String Matching; Algebraic-Group Factorization Algorithms; Algorithm to Detect Cycle; Articulation Points in a Graph; AKS Primality Test; Bach's Algorithm; Backpropagation Through A Neural Network; Beam Search Algorithm; Bell Ford Algorithm; Big O Notation; Binary Search Algorithm; Binary Indexed Tree or Fenwick Tree; Binary Search Trees; Boyer-Moore Majority Vote Algorithm; Breadth First Search Algorithm; Bridges in a Graph; Bubble Sort Algorithm; Bucket Sort Algorithm; Buchberger's Algorithm; Canonical Representation OF A Positive Number; Catalan Numbers; Convex Hull/Jarvis's Algorithm; Compression; Continued Fraction Factorization (CFRAC); Counting Inversions; Counting Sort Algorithm; Data Compression; Depth First Search Algorithm; Diffie-Hellman Key Exchange; Dijkstra's Algorithm; Dinic's Algorithm; Discrete Differentiation; Disjoint-Set Data Structure; Distance-Vector Routine Protocol Algorithm (DVRPA); Dixon's Algorithm; Dynamic Programming; Euclid's Algorithm; Euler's Factorization Method; Euler's Totient Function; Expectation-Maximization Algorithm; Factorial Calculation; Factorization; Fermat's Factorization Method; Ferrers Diagrams; Finite Automata Algorithm for Pattern Searching; Flood Fill Algorithm; Fast Fourier Transform (FFT) Aigorithm; Floyd's Cycle Detection Aigorithm; Floyd Warshall Algorithm; Ford-Fulkerson Algorithm; Gaussian Elimination to Solve Linear Equations; General Number Field Sieve (GNFS); Graham Scan; Gradient Decent Aigorithm; Graphs; Graph Search Aigorithm; Hashing; Heap Sort Algorithm; Hopcroft-Karp Algorithm for Maximum Matching; Huffman Coding Compression Algorithm; Hungarian Algorithm; Insertion Sort Algorithm; Interval Tree; Introsort Algorithm; Johnson's Algorithm; Kadane's Algorithm; Karatsuba Multiplication; Kahn's Topological Sort Algorithm; K Dimensional Tree; Key Exchange Encryption Algorithm; KMP Algorithm; Kraitchik Family Algorithm; Kruskal's Algorithm; Lee Algorithm; Lenstra Elliptical Curve Factorization; Link Cut; Linked List; Link-State Routing Protocol Algorithm (LSRPA); Logarithmic Exponentiation; Lowest Common Ancestor; LLL Algorithm; Matrix Exponentiation; Matrix Rank; Merge Sort Algorithm; Minimum Spanning Tree Algorithms; Modular Exponentiation; Modular Multiplicative Inverse; Mo's Algorithm; Multiplicative Partition; Newton's Method; Order Statistics; PageRank Algorithm, P-ADIC Order; Partition In Number Theory; Pollard's P-1 Algorithm; Pollard's Rho Algorithm; Primality Testing Algorithms such as the Sieve of Eratosthenes, the Fermat Primality Test and the Miller-Rabin Primality Test; Prime Factorization; Q Learning; Quadratic Sieve Algorithm; Queues; Quick Select Algorithm; Quick Sort Algorithm; Rabin Karp Algorithm; Random Sample Consensus Algorithm; Range Minimum Query; Rational Sieve; Recursion Functions; Regular Expression; RSA Algorithm; Schonhage-Strassen Algorithm; Segmented Sieve; Segment Tree; Selection Sort Algorithm; Shank's Square Forms Factorization (SQUFOF); Shor's Algorithm; Simplex Algorithm; Singular Value Decomposition (SVD); Solving a System of Linear Equations; Square Root of an Integer; Stacks; String Matching and Parsing; Transmission Control Protocol/Internet Protocol (TCP/IP) Algorithms; Trial Division Factorization Method; Trie; Trees; Topological Sort Algorithm; Union Find Algorithm; Viterbi Algorithm; Wheel Factorization; William's p+1 Algorithm; Wilson's Theorem; Young Diagrams; and, Z's Algorithm, and these and other algorithms, data structures, and methods and techniques used in computer science can be used in the development of software applications which can represent and communicate alphabetical letters, words, numbers, symbols, operations, and other processes including the communication of data and information and the use of computers and other devices for processing, manipulating, and storing data and information.

Representation of Numbers in Base 10

It is also possible to use and represent the common values and numbers associated with base 10, namely, 0, 1, 2, 3, 4, 5, 6, 7, 8, 9, 10, by representing the base portion of these value or numbers with a square or sine wave, and also the exponent portion of these and other numbers with another square or sine wave. For example, it is possible to represent the base portion of values or numbers and the exponent portion of those values or numbers using photons and sine waves in the visible light spectrum and/or visible or invisible portion of the infrared light spectrum, or other invisible portion of the electromagnetic spectrum.

For example:

Given the number 124:

$4 \times 10^0 = 4$ which is in the ones column;

$2 \times 10^1 = 20$ which is in the tens column; and, $1 \times 10^2 = 100$ which is in the hundreds column.

The number 124 in base 10 can be thought of as being a compressed expression with there being 1 of 10 in the hundreds column, 2 of 10 in the tens column, and 4 of 10 in the ones column, which are added together to represent and provide the value and number 124. In order to represent 124, a first sine wave having a specific frequency and a wavelength to communicate the base number 1 can be communicated nearly or actually simultaneously with a second sine wave having a specific frequency and wavelength to communicate the exponent for representing $10^2$ to represent the value and number 100, a third sine wave having a different specific frequency and wavelength can communicate the base number 2 nearly or actually simultaneously with a fourth sine wave having a different frequency and wavelength to communicate the exponent $10^1$ and represent the value and number 20, and a fifth sine wave having a different frequency and wavelength to communicate the base number $4=2^2$ nearly or actually simultaneously can be communicated with a sixth sine wave having a different frequency and wavelength to communicate the exponent $10^0$ to represent the value and number 4. All of the sine waves to represent the number 124 can be communicated nearly or actually simultaneously when photons and sine waves in the visible spectrum and/or infrared electromagnetic light spectrum are used.

With the use of optical means of communication and optical logic and memory chips and/or other photonic devices the number 124 can then require only 3 or 6 waves, vibes, or qubits which can be communicated and processed nearly or actually simultaneously instead of using the binary representation of 124 which is 1111100 and requires 7 bits of information which are processed sequentially and also considerably slower by electrons moving in wire and conventional silicon CPU and memory chips. In this regard, it is possible for a conductive wire and also optical fiber cable to communicate hundreds or thousands of signals, but optical fiber cable can communicate faster at THz speeds without a significant amount of impedance, and also uses less energy. In contrast, the use of the binary system and its relatively narrow and slow stream of digital 0's and 1's can be like trying to drink a river with a straw.

Again, one of the ways to communicate and process more information at higher speeds is to decrease the number of bits, waves, vibes, or qubits that are required to communicate a phrase like "Run Tag Run" from 72 bits to 3 waves, vibes, or qubits, or depending on the software application can program being run, perhaps it would be 5 waves, vibes, or qubits counting the spaces between the words. In this regard, fiber optic cable can be used to carry photons and sine waves in the visible light spectrum, and the visible and/or invisible portion of the infrared electromagnetic light spectrum to communicate alphabetical letters, words, symbols, and the base portion and also the exponent portion of a value or number in base 10, or any other number system. If desired, optical fiber cable can communicate a plurality of alphabetical letters, words, paragraphs, and documents nearly or actually simultaneously in the range of THz speeds. Accordingly, optical fiber cable and optical computing can potentially provide faster communication and processing speeds than can conventional electronic digital communication and computing because of its ability to nearly or actually simultaneously communicate data and information and also because photons and light can typically travel about 20 times faster in optical cable and optical chips than digital electronic signals can travel in metal wire and conventional computer chips made of silicon. Once again, the number 3,486,784,401 expressed in binary form is 011001111111010100000110111001001 which is 34 bits. However, the above discussion shows that 3,486,784,401 could be represented in base 10 in 10-20 waves, vibes, or qubits that could be communicated nearly or actually simultaneously as though only one bit was somehow alternatively being communicated digitally. The previous discussion also shows that 3,486,784,401 can be represented as $3^{20}$ which could require the use of only one or two waves, vibes, or qubits. While the introduction of abbreviations and specialized vocabulary can make computer languages harder for individuals to learn and communicate in different spoken languages, the abbreviation or representation of 3,486,784,401 by using $3^{20}$ is not problematic because the use of base 10 is widely accepted and understood. Accordingly, the use of photons and sine waves to communicate data and information and optical computers which can facilitate quantum computing has the potential to surpass the performance of conventional electronic computers for many tasks and purposes.

Figure 23:
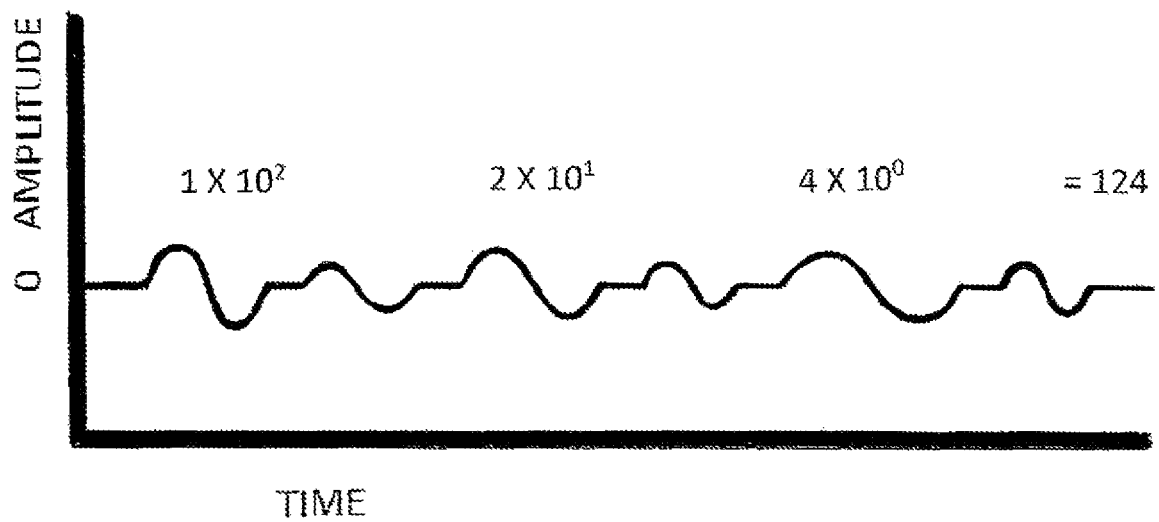
FIG. 23 shows a representation of the screen of an oscilloscope showing a series of sine waves representing the base portions and also the exponent portions of several individual numbers which can be used to represent and communicate the number 124.

FIG. 23 shows a representation of the screen of an oscilloscope showing a series of sine waves representing the base portions and also the exponent portions of the individual numbers which can be used to represent and communicate the numbers 124. In this regard, $1 \times 10^2 + 2 \times 10^1 + 4 \times 10^0 = 124$. The base numbers 1, 2, and 4 are represented by sine waves having the same amplitude, but different frequencies and wavelengths. The exponent portions $10^2$, $10^1$, and $10^0$ are represented using sine waves having smaller amplitude than the base portion, and also different frequencies and wavelengths. As shown, for the sake of clarity in this disclosure, there is a short separation in time as between the base portion of each number and its corresponding exponent, but this need not be the case.

Figure 24:
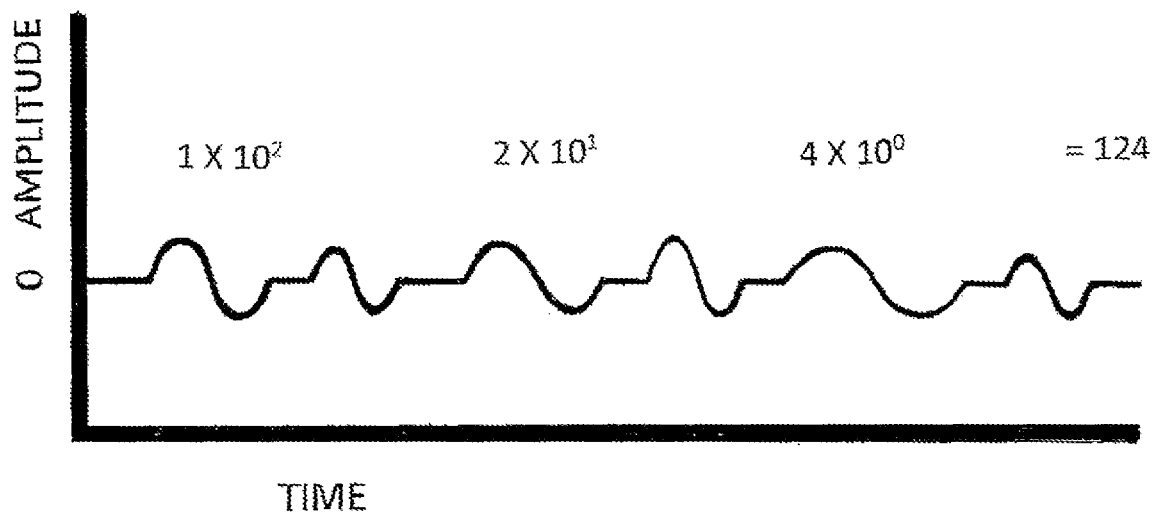
FIG. 24 shows a representation of the screen of an oscilloscope showing a series of sine waves representing the base portions and also the exponent portions of several individual numbers which can be used to represent and communicate the number 124.

FIG. 24 shows a representation of the screen of an oscilloscope showing a series of sine waves representing the base portions and also the exponent portions of the individual numbers which can be used to represent and communicate the number 124. In this regard, $1\times10^2+2\times10^1+4\times10^0=124$. The base numbers 1, 2, and 4 are represented by sine waves having the same amplitude, but different frequencies and wavelengths. The exponent portions $10^2$, $10^1$, and $10^0$ are represented using sine waves having different amplitudes from one another, but the same frequencies and wavelengths. As shown, for the sake of clarity in this disclosure, there is a short separation in time as between the base portion of each number and its corresponding exponent, but this need not be the case.

Figure 25:
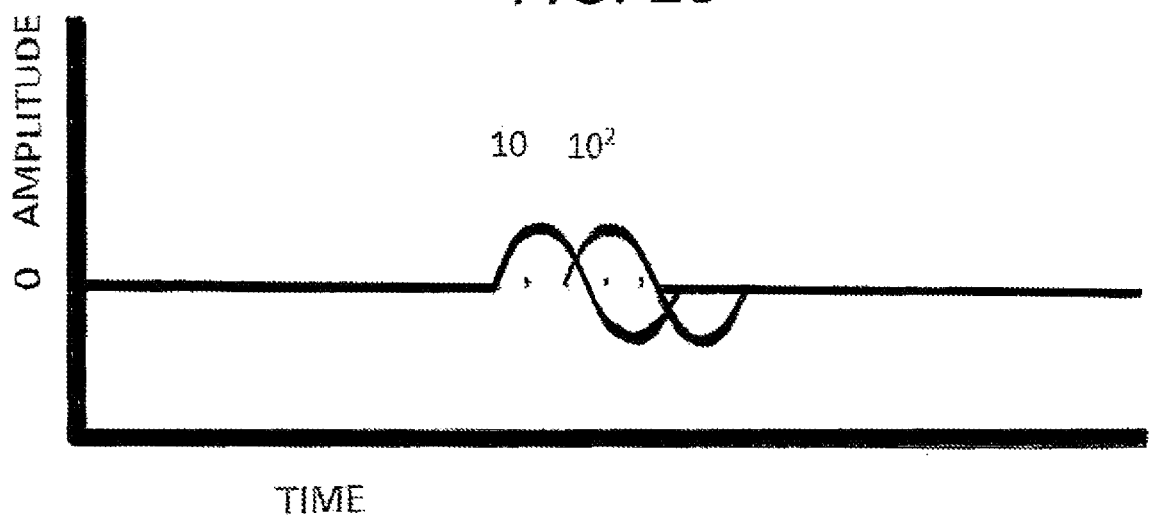
FIG. 25 shows a representation of the screen of an oscilloscope showing two sine waves which are phase shifted relative to one another and which represent the base portion 10 and also the exponent 2 portion to represent $10^2$ which can be used to represent and communicate the number 100.

FIG. 25 shows a representation of the screen of an oscilloscope showing two sine waves which are phase shifted relative to one another. The first sine wave on the left represents the base portion of a number and has the value 10, and the second sine wave on the right which can have the same amplitude and general shape can represent the exponent portion of the number and has the value 2, and so the base portion and exponent portion can represent and communicate $10^2$ which is the number 100. In this regard, a portion of the center reference line which rests at 0 has been deleted in order to better illustrate four points in time. In this example, each point indicates and represents a potential phase shift of the second sine wave and represents a corresponding change in its numerical value. The first point to the right of the first sign wave corresponds to the exponent 1 and represents $10^1$, the second point to the exponent 2 and represents $10^2$, and so the second sign wave begins on that second point in this example. The amount of phase shifting can possibly be made very small and even be in picoseconds (PS) which is 0.000000000001/second, or femtoseconds (FS) which is 0.000000000000001/second. This example shows how different numbers or other values can be represented by sine waves which are phase shifted and then used to communicate data and information to optical, hybrid electro-optical, and/or quantum computers. A software application including a compilation of programs, commands, and algorithms can be configured to identify and communicate the value 100 which is being represented and communicated in FIG. 25. It can be readily understood that the possible overlapping and summation of a plurality sine waves on a single reference line or graph can be used to derive and result in one or more resultant waves being created in which the individual contributing sine wave forms may or may not be discernable to the human eye, but they can nevertheless be detectible using the Fast Fourier Transform Algorithm which is discussed in greater detail below.

Moreover, it is possible for many different values and numbers to be represented and communicated by using the base 10 number system or a different base number system as the base portion of a number and using values or numbers derived from a logarithm table as the exponent portion of the number. For example, the first sine wave shown on the left in FIG. 25 can once again be used to represent and communicate the base portion of a number in base 10 having the value 10, but instead of the position of the second sine wave shown on the right in FIG. 25 being used to represent an exponent having the value 2, the amount to which the second sine wave is phase shifted can be used to represent a different exponent taken from a logarithm table such as 0.301029996, thus the value of the number which could be represented by $\log_{10} x=0.301029996$ would be 2. In FIG. 25, the value 0.301029996 would then be located between the start of the first sine wave and the first indicated point to the right of the start of the first sine wave, and the second sine wave representing the exponent would then start in that location. Alternatively, if the value of the exponent taken from a logarithm table would be 0.698970004 the number which could be represented by $\log_{10} x=0.698970004$ would be 5. In FIG. 25, the value 0.698970004 would then be also be located between the start of the first sine wave and the first indicated point to the right of the start of the first sine wave, and the second sine wave representing the exponent would then start in that location. Alternatively, if the value of the exponent taken from a logarithm table would be 2.093411685, the value of the number which could be represented by $\log_{10} x=2.093411685$ would be 124. In FIG. 25, the value 2.093411685 would then be located between the second and third points indicated to the right of the start of the first sine wave, and the second sine wave representing the exponent would then start in that location. In this regard, a base portion of a number and an exponent portion can be used to represent and communicate positive numbers, and also other kinds of numbers. The values of the exponents provided in some logarithm tables can be on the order of $1\times10^{12}$, but since the amount of phase shifting can possibly be made very small and even be in picoseconds (PS) which is 0.000000000001/second, or femtoseconds (FS) which is 0.000000000000001/second, and visible light wavelengths as well as ultraviolet and infrared wavelengths are on the order of about 2 femtoseconds (FS), it is possible to represent and communicate exponents which are on the order of $1\times10^{-12}$ by using phase shifting, and other forms of modulation. Alternatively, the described methods and techniques including phase shifting could be used with at least two square waves, or other wave forms to represent and communicate data and information.

Figure 26:
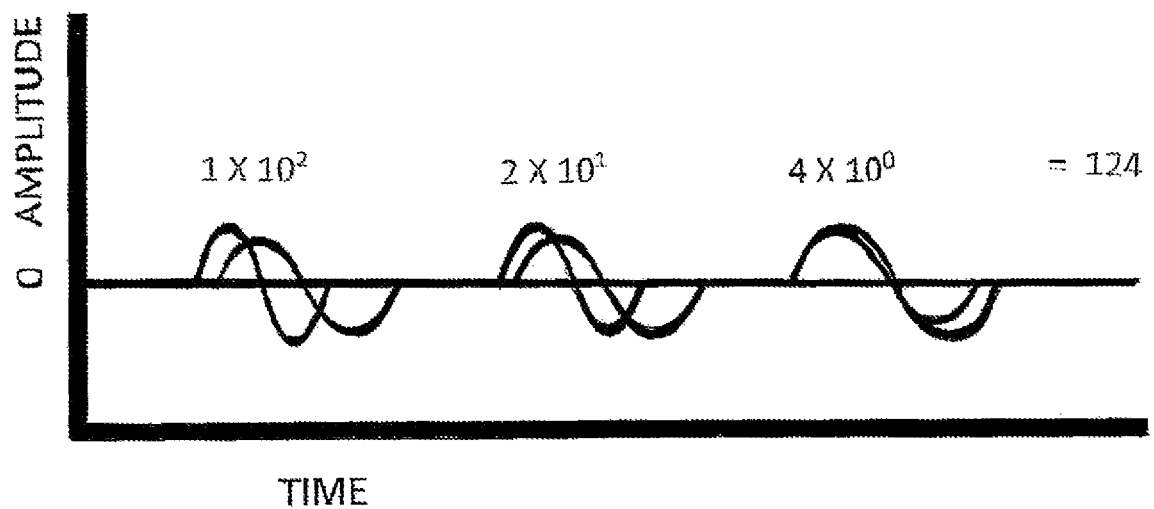
FIG. 26 shows a representation of the screen of an oscilloscope showing a plurality of sine waves which are phase shifted relative to one another and which represent the base portion and also the exponent portion of three numbers which can be used to represent and communicate the number 124.

FIG. 26 shows a representation of the screen of an oscilloscope showing a plurality of sine waves which are phase shifted relative to one another and which represent the base portion and also the exponent portion of three numbers which can be used to represent and communicate the number 124. The first sine wave on the left represents the base portion of the number 1, and the second sine wave which can possibly have a different amplitude and general shape can represent its exponent 2 in base 10 and be phase shifted as previously discussed to represent and communicate $10^2$. The third sine wave from the left represents the base portion of the number 2, and the fourth sine wave which represents its exponent 1 in base 10 is phase shifted in time to represent and communicate $10^1$. The fifth sine wave from the left represents the base portion of the number 4, and the sixth sine wave which represents its exponent 0 in base 10 is phase shifted in time by 0 to represent and communicate $10^0$. Accordingly, a software application including a compilation of programs, commands, and algorithms can be configured to add the three numbers, that is, 100+20+4=124, to yield the sum 124 which is then being represented and communicated in FIG. 26. As shown, for the sake of clarity in this disclosure, the three pairs of sine waves are separated by breaks as would occur when the numbers would be entered and communicated using a keyboard, but this would not need to be the case if and when the numbers would be part of a data and information communication or stream that would be communicated, e.g., over fiber optical cables, and also possibly then be processed using an optical CPU and memory chip in an optical and/or quantum computer. In this regard, the individual sine waves associated with the values and numbers $1\times10^2$, $2\times10^1$, and $4\times10^0$ which indicate and represent the sum and number 124 could also be nearly or actually communicated simultaneously, and then near or at the speed of light. Again, when a series of numbers is entered using a keyboard or other device, a software application can include programs, commands, and algorithms which cause those numbers to be added to derive and represent a number or value in base 10. Alternatively, mathematic operators such as add +, minus −, multiply x, divide /, and other operations and functions can be indicated and represented by using corresponding sine waves having individually coded and assigned frequencies and wavelengths which indicate and represent desired operations and/or functions. Other number systems besides the binary and decimal number systems can be similarly represented and encoded, and so can other types of numbers such negative numbers, imaginary numbers, and complex numbers. Moreover, the methods and processes disclosed with reference to drawing FIGS. 25 and 26 and their discussion can also be applied to the use of electrons and square waves or other wave forms to represent and communicate data and information in electronic communication, e.g., a first square wave can be used to represent the base portion of a number in base 10, or other base number system, and a second square wave of the same or different amplitude and/or wave form can be phase shifted or otherwise be modulated to represent the exponent portion of the number.

Figure 27:
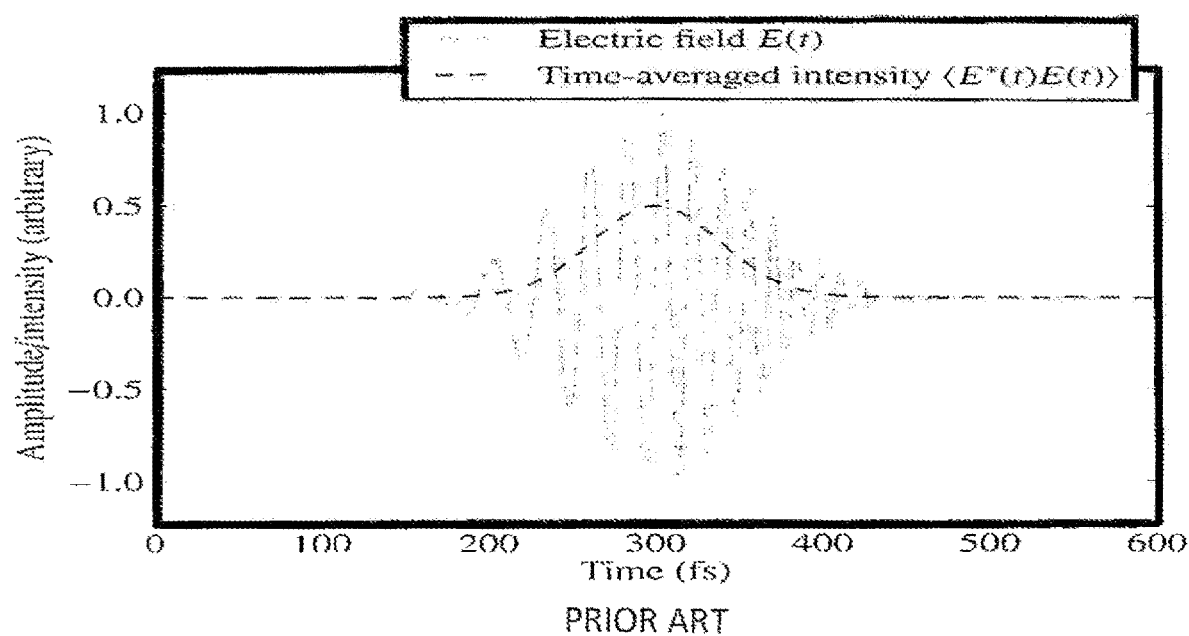
FIG. 27 is a prior art representation of an ultra short pulse which can be used to communicate information.

FIG. 27 is a prior art representation of an ultra short pulse which can be used to communicate information which has been reproduced from the website: https://en.wikipedia.org/wiki/Ultrashort_pulse. Shown is an ultra short pulse which corresponds to an electrical pulse which has a duration of about 200 femoseconds (fs). As previously discussed, the frequency and wavelength of visible light corresponds to only about 2 femoseconds. Accordingly, this drawing figure can be used to show how much faster photons and light can potentially communicate data and information relative to forms of electronic communication which use electrons in wires.

Figure 28:
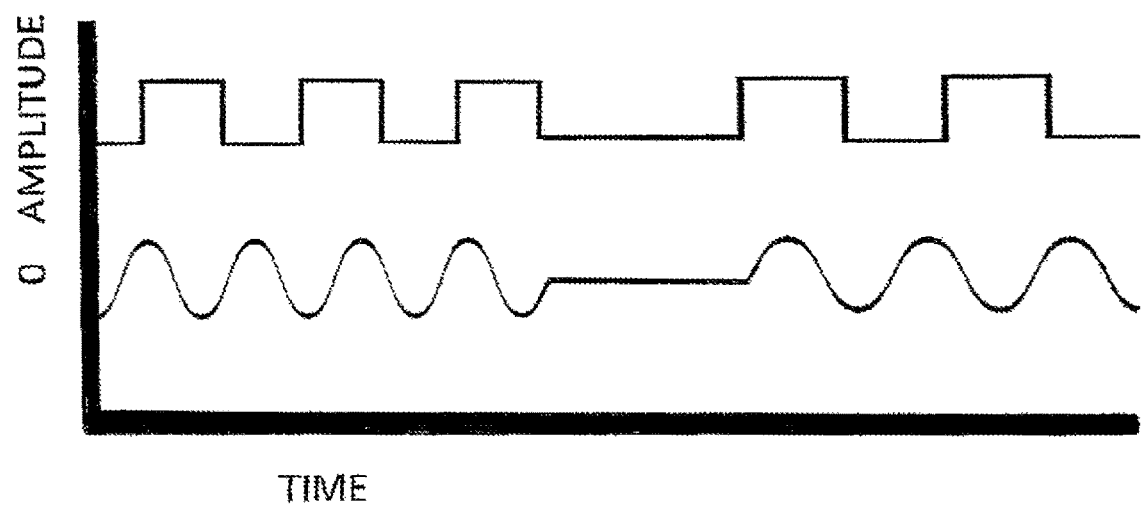
FIG. 28 is a representation showing two different sine waves and also two different square waves which are each separated by break.

In this regard, in FIG. 28 and also in other drawing figures such as FIGS. 7, 8, 15, and 16, where photonic sine waves and electronic square waves are represented together for illustrative purposes, the caveat here being made in this disclosure is that sine wave forms associated with photons and light would typically be so small and their frequency would also be so fast that they would typically not be easily seen when represented on the same amplitude and time scale as electronically generated square waves. For this reason, the representation of sine waves corresponding to photons and visible and/or invisible light have sometimes been enlarged and/or simplified so that individuals will be able to follow and understand the key points and teachings made in this disclosure. In addition, for the sake of clarity, many of the drawing figures associated with this disclosure have represented one cycle of a sine wave or square wave and/or a series of different individual sine waves or square waves having only one cycle, but this need not be the case. While it is possible to generate and detect a single photon and optical sine wave, in view of the high frequency and speed of light and also the possible need or desire for a certain redundancy in order to ensure accurate detection and communication, the generation and detection of multiple cycles of a given sine wave or square wave can sometimes be desired. In this regard, the production and transmission of a signal including a plurality of photons in optical computing or electrons in electronic computing having a characteristic frequency and wavelength can in some circumstances provide for a more robust signal and enhance the ability to detect and accurately interpret the communication of data and information.

FIG. 28 is a representation showing two different sine waves and also two different square waves which are each separated by break. This image has been provided to represent how data and information which is communicated by a keyboard could look when being communicated digitally using square waves, or optically with the use of sine waves. For example, when an individual depresses a key on a computer keyboard a continuous square or sine wave signal which communicates that keystroke can be generated, but when the keystroke ends the signal is discontinued. The pushing of a space bar after entering at least one letter or a series of alphabetical letters to indicate and represent a word, or a symbol to indicate and represent a command, function, or operation, or a number or a series of numbers to indicate and represent a larger number, can then communicate with the use of a software application including programs including suitable codes, commands and algorithms that a completed piece of data and information has been communicated which can and should be read and persisted by a computer or other data communication, storage, and manipulation device.

At this time, different models exist and are being used to communicate data in various telecommunications and computer networking environments. The Open Systems Interconnection Model (OSI model) includes seven layers and characterizes and attempts to standardize the communication of data and information. The OSI model was defined in ISO/IED 7498 which includes the following parts: ISO/IED 7498-1 which is the basic model; ISO/IED 7498-2 which relates to security architecture; ISO/IEC 7498-3 which relates to naming and addressing; and, ISO/IEC 7498-4 relating to management framework. However, various other designs and models for data and information communication have been developed such as the Internet Protocol Suite which includes four layers and is commonly known as the Transmission Control Protocol (TCP) and Internet Protocol (IP), or more simply, the TCP/IP protocols which are being widely used today. Lists of existing network protocols can be found on the website: https://wkipedia.org/wiki/Lists_of_network_protcols. When data is being communicated in telecommunications and computer networking, the data and other related information is typically configured in what is called a packet which is a formatted unit of data. A packet is sometimes also called a block, a cell, a datagram, or a frame, that is, depending on the data communication protocol which is being used. In this regard, the packet typically contains control information, and also user data and information which is called the payload. The control information is typically located in headers and footers or trailers and these portions can contain, e.g., the source and destination network addresses, error detection codes, and sequencing information. In this regard, error detection and correction can be performed at different layers of a protocol stack, and the packets can contain checksum, parity bits or cyclic redundance checks to detect for errors. One or more of the different models, methods, and processes which are being used to communicate data and information in various telecommunication and computer network environments can be configured and adapted to be used with one or more of the structures, methods, and processes discussed and shown in the present disclosure, and vice-versa, that is, the structures, methods, and processes relating to making a computer language and code for software application development, data compression, and use with conventional, optical, hybrid electro-optical and quantum computers can be configured and adapted to be used with one or more of the different models, methods, and processes which are being used to communicate data and information in various telecommunication and computer network environments.

Figure 29:
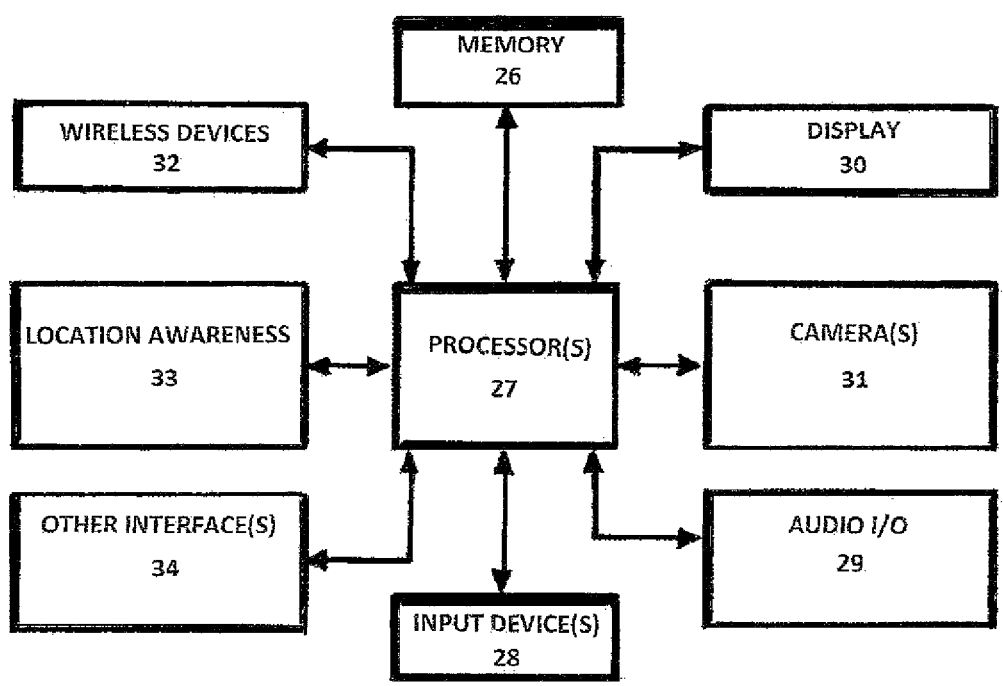
FIG. 29 shows a flow chart relating to a conventional computer, an optical computer, a hybrid electro-optical computer and/or quantum computer.
Figure 30:
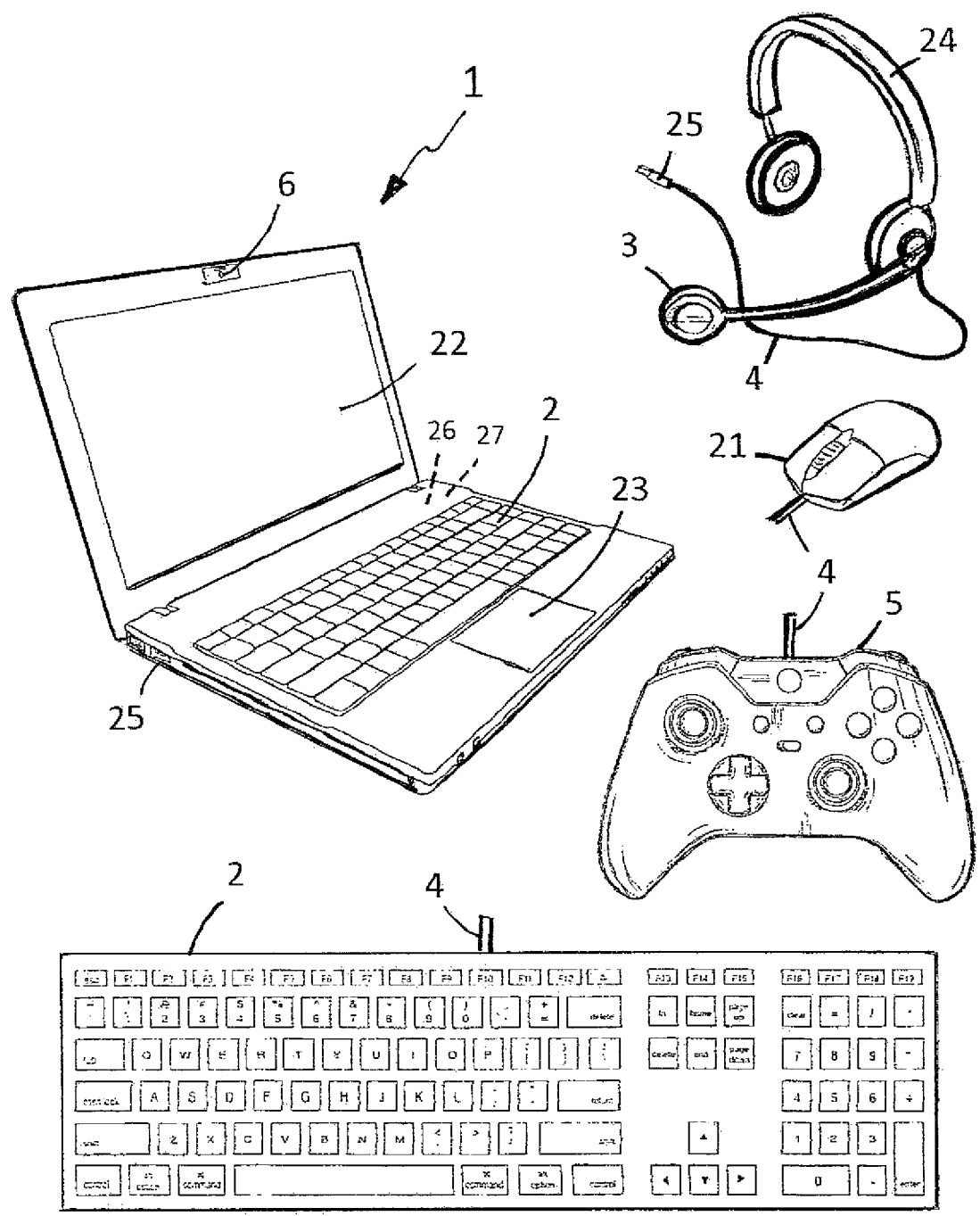
FIG. 30 shows a keyboard, a game controller, a mouse, and also a headset including a microphone for communicating data and information to a computer which has an integral keyboard and touch pad, and which can be a conventional computer, an optical computer, a hybrid electro-optical computer, and/or quantum computer.

FIG. 29 shows a flow chart which relates to a conventional computer, an optical computer, electro-optical hybrid computer, and/or a quantum computer which is generally similar to that shown in FIG. 30. The processor(s) can include one or more conventional silicon CPUs and/or optical microprocessor chips and other photonic devices which can enable quantum computing. The input device(s) 28 can include a keyboard 2, game controller 5, camera 6, mouse 21, headset 24 including a microphone 3, and other devices. The display 30 can include an integral display screen 6 and/or external display screen 6. The camera 6 can include an integral camera 6 of the computer 1 and/or an external camera 6. The audio I/O 29 can include speakers which are integral or external to the computer 1, and microphones 3 which are integral to the computer 1 and/or other audio devices which are external to the computer 1. This could include interfaces for recording musical instruments and mixing and editing music such as the Universal Audio Apollo x8p. The wireless devices 32 can include wireless devices such as cell phones, wireless communication systems, printers, Bluetooth and internet or other wi-fi connections which can communicate with the computer 1. The location awareness 33 can include any means or device which can provide the computer 1 and a user with the location of the computer and/or communicate the location of the computer 1 to an external GPS or other location tracking system or third party. The other interface(s) 34 can include any other interface which can be integral or external to the computer 1 for communication with external devices, networks, the internet, and other sources of data and information and communication.

With reference to FIGS. 29 and 30, and regarding a pure or complete optical computer, a signal including data and information can be produced and communicated using a keyboard 2, a mouse 21, a microphone or other voice recognition device 3, or a camera 6 which can use an electronic digital system and be connected by a wire cable 4 or a wireless system to the optical computer 1. Alternatively, the data and information can be provided or converted to photonic and optical form by one or more of the aforementioned devices and communicated to the optical computer 1 using a fiber optic cable 4. The photonic data and information can then be directed to an optical processor 27 located inside the computer 1 which is shown in FIG. 30 with dashed lines, which can send the data and information through logic gates which can be part of a neural network which can permit quantum entanglement and/or a quantum superposition capability. At least some of the data and information being processed can be sent to an optical memory chip 26 which is located inside the computer 1 and so is shown in FIG. 30 with dashed lines, or alternatively, to a different data and information storage means, where it can be saved and persisted. After the information is saved and if the program needs to use it, the program can then send a command to the optical processor 27 which can send a command to receive the information. The program can then receive the information and also sent a signal back to the optical processor 27 to tell it that the task is complete.

The detailed structures, methods, and processes associated with making and operating optical computers, hybrid electro-optical computers, and quantum computers are recited in the prior art patents that have been previously incorporated by reference herein above, and the recited documents speak for themselves. A brief discussion of just a few of the structures and methods recited in some of these patents is provided here for those individuals who may not be familiar with or have time to review the prior art. Lasers from III and V groups on the periodic table using indium phosphide and silicon nitride, or LED's can be used as light sources. One or more optical microresonators can be included on or near an optical chip to generate at least one microcomb which can squeeze photons into small circular loops about the size of a millimeter in order convert the photons from a single wavelength to many different wavelengths or modes and so facilitate multiplexing, quantum entanglement, superposition, and quantum computing. In order to make an optical computer chip, transistors which utilize constructive or destructive light interference can be used to create optical or digital/optical logic gates. In this regard, liquid crystal structures, or nano-crystals made, e.g., from diamond, germanium, quartz, ruby, salt, sapphire, silicon, or other crystalline materials which have desired lattice structures and other physical properties can be used to make logic gates which can be connected to neural networks. Prisms, filters, mirrors, diffraction gratings, and other structures can be used to manipulate and process photonic data and information. Some crystalline materials can be encoded by a laser, LED, or other light source to make holographic optical memory chips. The following articles provide information on optical CPU's and/or memory chips: "Light-Based Memory Chip Is the First To Permanently Store Data, by Robert F. Service, published on Sep. 25, 2015 on the website: https://www.science.org/content/article/light-based-memorv-chip-first-permanently-store-data; "Optical RAM And Integrated Optical Memories: A Survey/Light: Science & Applications," by Theoni Alexoudi, George Theodore Kanellos & Nikos Pleros, published on May 25, 2020 on the website: https://www.google.com/url?sa=t&source=web&rct=j&url=https://www.nature.com/articles/s41377-020-0325-9&ved-2ahUKEwjOx46w9af1AhUdk4kEHaxvBewQFnoECAUQAQ&usg=AOvVaw3AP8OD47MCuab0pvB2 Kkqr; and, "New Optical Memory Cell Achieves Record Data-Storage Density," published by the Oxford News Blog on Dec. 21, 2018 on the website: https://www.ox.ac.uk/news/science-blog/new-optical-memory-cell-achieves-record-data-storage-density-0. Optical computers can send and receive photonic and optical sine waves in multiple frequencies and wavelengths in order to communicate data and information in series or parallel and near or at the speed of light. Hybrid electro-optical computers can include one or more structures which require the conversion of information in an optical form to binary and digital form and/or vice-versa, and this requirement can reduce processing speeds and require more energy.

FIG. 30 shows a keyboard 2, a game controller 5, a mouse 21, and a headset 24 including a microphone 3 for communicating data and information to a computer 1 which has an integral keyboard 2 and touch pad 23 and can be an optical, hybrid electro-optical, and/or quantum computer. Many different types of keyboards exist, but most existing keyboards use mechanical switches. Capacitive keyboards also exist, as do virtual laser keyboards. Wireless keyboards exist. All of these and other types of keyboards can be adapted to communicate letters, words, symbols, numbers and operations using frequency modulation and/or amplitude modulation of electronic signals and/or optical signals. Some of the methods of representing letters of the alphabet, words, symbols, and numbers discussed herein can also be used with conventional computers which use the digital binary number system and wires connected to silicon based CPUs and memory storage systems. In this regard, an oscillator such as a 555 or 955 timer circuit can be used to send a carrier or baseline square wave signal. Alternatively, an oscillating quartz crystal circuit, a vacuum tube oscillator circuit, or other oscillator can be used to send a carrier baseline square wave or sine wave signal, but the wave form can then be changed in frequency and wavelength by individual keystrokes on a keyboard, or by using voice recognition equipment in order to communicate specific information. For example, when using a 555 or 955 timer circuit, changing the value of the main capacitor will change the oscillation rate of the circuit, and so can changing one or both of the two main resistors. Accordingly, each key on a keyboard can be linked to a capacitor having a different value that can be placed in a parallel with the main capacitor on the 555 or 955 timer circuit by a keystroke and the resulting output value of the two capacitors in combination will then change the frequency and wavelength of the baseline oscillation to one that specifically indicates and represents the letter, number, symbol, or operation associated with the particular keystroke. In this way, letters, words, symbols, numbers and operations can be communicated by what will here be called a string of different digital square waves having different specific and identifying frequencies and wavelengths. Alternatively, synthetic quartz crystals can be used to make oscillators or resonators having a frequency between 800 KHz and 300 MHz in a crystal oscillator circuit. Mode locked oscillators can produce short pulses in the range of picoseconds and femtoseconds. The Seiko Epson 56-8003 series provides an example of a modern programmable quartz crystal oscillator, e.g., the Epson SG-8003CG.

Keyboards and vocal means of data and information input are relatively slow processes, and so when these means would be used to input data and information using conventional digital devices and the binary number system, it would not greatly affect the processing speed of an optical computer, a hybrid electro-optical computer and/or quantum computer. However, somewhere in the chain of equipment and data and information flow those digital signals would need to be converted into analog photonic or optical signals. Digital to optical and also optical to digital converters exist, but converting data and information back and forth takes time, and it is also associated with the production of heat and use of energy.

An optical keyboard, microphone or other voice recognition device which can use fiber optical cables to communicate photons and sine waves in the visible light spectrum and/or invisible portion of the infrared electromagnetic light spectrum to an optical computer which uses an optical CPU and memory chip or other means of persisting data and information can be used to enable and facilitate quantum computing. Whether using a keyboard with mechanical switches or a capacitive keyboard, a keystroke can be linked to a circuit associated with a light source and which changes the light output from either no output or from a baseline output to a different output by changing, e.g., the resistance or capacitance of the relevant portion of the associated integrated circuit and/or by changing, e.g., the transmittance, absorbance, filtering, reflection, scattering and/or dispersion of the light source so that the frequency and wavelength of the photonic output can be selectively changed. Instead of using electrons and the binary digital number system to make and communicate a signal, a source of light photons such as one or more LEDs, liquid crystals, or lasers can be used to generate the optical signal. In this regard, light sources which can generate photons and light in the visible light spectrum and/or invisible portion of the infrared electromagnetic spectrum can be used.

A conventional keyboard having mechanical switches or a capacitive keyboard will typically have an integrated circuit including a character map which identifies each individual keystroke. These keyboards send the information, e.g., that the letter "a" has been actuated, by sending the data and information using the binary system of 0's and 1's which is then communicated digitally using a conductive metal wire to a computer. The following discussion will address how to make a keyboard which can be used to communicate information in the form of photons and sine waves having frequencies and wavelengths in the visible light spectrum and/or invisible portion of the infrared electromagnetic spectrum. In this regard, a discussion will be provided regarding how television screens produce and represent different colors.

Computer keyboard commands, functions, operations and/or shortcuts typically include, but are not limited to: Alt, Backspace, Caps Lock, Ctrl, Delete, End, Enter, Esc, Fn, Home, Insert, Num LK, Pgdn, Pgup, Pause Break, Prt SC SYSRQ, Scr Lk, Shift, Spacebar, Tab, Windows, Ctrl+A, Ctrl+C (or Ctrl+Insert), Ctrl+X, Ctrl+V (or Shift+Insert), Ctrl+Z, Ctrl+Y, Ctrl+Shift+N, Alt+F4, Ctrl+D (Del), Shift+Delete, Alt+Tab, PrtScn, Windows key+I, Windows key+E, Windows key+A, Windows key+D, Windows key+L, Windows key+V, Windows key+Period (.) or semicolon (;), Windows key+PrtScn, Windows key+Shift+S, Windows key+Left arrow key, Windows key+Right arrow key, Keyboard shortcut, Windows key (or Ctrl+Esc), Ctrl+Arrow keys, Ctrl+Shift+Esc, Ctrl+Shift, Alt+F4, Ctrl+F5 (or Ctrl+R), Ctrl+Alt+Tab, Ctrl+Arrow keys (to select)+Spacebar, Alt+Underlined letter, Alt+Tab, Alt+Left arrow key, Alt+Right arrow key, Alt+Page Up, Alt+Page Down, Alt+Esc, Alt+Spacebar, Alt+F8, Shift+Click app button, Ctrl+Shift+Click app button, Shift+Right-click app button, Ctrl+Click a grouped app button, Shift+Right-click grouped app button, Ctrl+Left arrow key, Ctrl+Right arrow key, Ctrl+Up arrow key, Ctrl+Down arrow key, Ctrl+Shift+Arrow key, Ctrl+Spacebar, Shift+F10, Shift+Arrow keys, Windows key+X, Windows key+Number (0-9), Windows key+T, Windows key+Alt+Number (0-9), Windows key+D, Windows key+M, Windows key+Shift+M, Windows key+Home, Windows key+Shift+Up arrow key, Windows key+Shift+Down arrow key, Windows key+Shift+Left arrow key, Windows key+Shift+Right arrow key, Windows key+Left arrow key, Windows key+Right arrow key, Windows key+S (or Q), Windows key+Alt+D, Windows key+Tab, Windows key+Ctrl+D, Windows key+Ctrl+F4, Windows key+Ctrl+Right arrow, Windows key+Ctrl+Left arrow, Windows key+P, Windows key+A, Windows key+I, Windows key+E, Alt+D, Ctrl+E (or F), Ctrl+N, Ctrl+W, Ctrl+F (or F3), Ctrl+Mouse scroll wheel, Ctrl+Shift+E, Ctrl+Shift+N, Ctrl+L, Ctrl+Shift+Number (1-8), Alt+P, Alt+Enter, Alt+Right arrow key, Alt+Left arrow key (or Backspace), Alt+Up arrow, F1, F2, F3, F4, F5, F6, F7, F8, F9, F10, F11, F12, Ctrl+Tab, Ctrl+Shift+Tab, Ctrl+number of tab, Tab, Shift+Tab, Alt+underline letter, Spacebar, Arrow keys, Ctrl+A, Ctrl+C (or Ctrl+Insert), Ctrl+V (or Shift+Insert), Ctrl+M, Ctrl+Up arrow key, Ctrl+Down arrow key, Ctrl+F, Left or right arrow keys, Up or down arrow keys, Page Up, Page Down, Ctrl+Home, Ctrl+End, Windows key, Windows key+A, Windows key+S (or Q), Windows key+D, Windows key+L, Windows key+M, Windows key+B, Windows key+C, Windows key+F, Windows key+G, Windows key+Y, Windows key+O, Windows key+T, Windows key+Z, Windows key+J, Windows key+H, Windows key+E, Windows key+I, Windows key+R, Windows key+K, Windows key+X, Windows key+V, Windows key+W, Windows key+U, Windows key+P, Windows key+Ctrl+Enter, Windows key+Plus (+), Windows key+Minus (−), Windows key+Esc, Windows key+Forward-slash (/), Windows key+Comma (,), Windows key+Up arrow key, Windows key+Down arrow key, Windows key+Home, Windows key+Shift+M, Windows key+Shift+Up arrow key, Windows key+Shift+Down arrow key, Windows key+Shift+Left arrow key, Windows key+Shift+Right arrow key, Windows key+Left arrow key, Windows key+Right arrow key, Windows key+Number (0-9), Windows key+Shift+Number (0-9), Windows key+Ctrl+Number (0-9), Windows key+Alt+Number (0-9), Windows key+Ctrl+Shift+Number (0-9), Windows key+Ctrl+Spacebar, Windows key+Spacebar, Windows key+Tab, Windows key+Ctrl+D, Windows key+Ctrl+F4, Windows key+Ctrl+Right arrow, Windows key+Ctrl+Left arrow, Windows key+Ctrl+Shift+B, Windows key+PrtScn, Windows key+Shift+S, Windows key+Shift+V, Windows key+Ctrl+F, Windows key+Ctrl+Q, Windows key+Alt+D, Windows key+Period (.) or semicolon (;), Windows key+Pause. All of these different commands, functions, operations, and/or shortcuts can be communicated using visible light and/or infrared light in the invisible portion of the electromagnetic spectrum.

Modern television screens include only blue, green, and red pixels. Depending on whether one or more of these three blue, green, and red color pixels are being provided with power, or how much relative electrical energy is being provided to the individual pixels, that is, the amplitude of the color pixels, it is possible to reproduce or render all of the colors in the visible light spectrum. A television set does not require thousands of individual pixels having different unique colors in order to provide color rendering. The human eye also has cones which can see blue, green, and red light, but we can nevertheless see thousands of different unique colors. Likewise, it is possible to use relatively few values and numbers to represent and communicate data whether the data consists of words, numbers, symbols, or operations.

In this regard, here is one example how different values and numbers can be represented using light. Number 0 can represent and be analogous to black on a television screen. In modern television screens, black is typically rendered with the use of a controllable second polarizer which absorbs all light. Number 1 can represent and be analogous to white on a television screen. In modern television screens, white is rendered by all three red, green, and blue light pixels being on. Number 2 can represent and be analogous to the color blue on a television screen. Number 3 can represent and be analogous to the color green on a television screen. Number 5 can represent and be analogous to the color red on a television screen. As previously discussed, using the values and numbers 0, 1, 2, 2″, 3, 3″, 5, and 5″ we can represent all positive numbers just as the modern television set can represent all colors by using only blue, green, and red pixels. Other types of numbers such as negative numbers, fractions, imaginary numbers, complex numbers, and mathematical operations besides addition, such as subtraction, multiplication, and division can be represented using a relatively small collection of colors.

The caveat with respect to this discussion being that while old cathode ray tube televisions use the excitement of different colored phosphors to generate blue, green, and red colors, the rendering of other colors was done using the RGB color model which is an additive process. For example, the RGB white point was often rendered by combining 464 nm blue with 549 nm green with 612 nm red. Many modern LED, liquid crystal, and plasma screens still use a generally similar RGB color model and additive process. As a result, humans may perceive, e.g., the color violet because of the addition of red and blue, but the screen may not be emitting light having the specific frequency and wavelength associated with the color violet. The web-safe color palette used with many early computer screens only included 63=216 colors, but now millions of colors are being supported by modern computers. However, when the desire is to communicate information using the visible light spectrum or invisible portion of the infrared light spectrum using a wide bandwidth it can be necessary to actually generate and use the frequencies and wavelengths of light in the desired bandwidth and not rely upon an additive process. As previously discussed, the different colors used to indicate and represent or encode data and information, that is, the different frequencies and wavelength can correspond to a portion of the visible light spectrum, and/or invisible portion of the infrared light spectrum, or other invisible portion of the electromagnetic spectrum.

FIG. 30 shows an optical, hybrid electro-optical, and/or quantum computer 1 which includes an integral keyboard 2, camera 6, screen 22, touch pad 23, and also a plurality of connectors 25 for coupling with a wire or fiber optical cable 4 which can be used to removably secure an accessory device. Also shown is an accessory keyboard 2, a game controller 5, a mouse 21, and a headset 24 including a microphone 3 and wire or fiber optical cable 4. The wire or fiber optical cables 4 on the mouse 21, game controller 5, and accessory keyboard 2 are shown with parts broken away in order to simply the drawing figure. One or more of the integral computer keyboard 2, the accessory keyboard 2, the game controller 5, the mouse 21, the headset 24 including a microphone 3, and the optical, hybrid electro-optical, and/or quantum computer 1 can include a light source for generating and communicating data and information using the visible light spectrum and/or invisible portion of the infrared light spectrum, or other invisible portion of the electromagnetic spectrum.

For example, a light source can be used to produce different colors of light for generating photons and sine waves in the visible and/or invisible portion of the electromagnetic light spectrum. The different colors and associated frequencies and wavelengths of light can be produced by LED's, liquid crystals, lasers, or other light sources. Again, visible light falls in the range of the electromagnetic spectrum between ultraviolet and infrared light. Visible light frequencies are between about $4\times10^{14}$ and $8\times10^{14}$ cycles per second (Hz) which is about 430-750 trillion Hz (THz) and have wavelengths in the range between approximately 380-740 nanometers (nm). The ultraviolet light spectrum includes wavelengths in the range between approximately 10 nm and 400 nm which corresponds to frequencies in the range between approximately 30 PHz-750 THz. The infrared light spectrum includes wavelengths in the range between approximately 700 nm-1 mm and corresponds to frequencies in the range between approximately 430 THz-300 GHz. In this regard, it is known that there can be some overlap as between the visible light spectrum and the infrared and ultraviolet light spectrums. Visible light frequencies and wavelengths correspond in duration of time to about 2 femtoseconds. The keyboard(s) or other input devices and/or the computer can possibly include an integrated circuit, a character map, a linear or circular light accelerator, a microcomb, a prism, a filter, a diffraction grating, an optical CPU, an optical memory chip or other means of data storage, a neural network, an interface, a compiler, and connections for coupling with fiber optical cable. In this regard, a laser or other light source can be scattered or dispersed with the use of a prism, a diffraction grating, a filter, a microcomb, and/or other photonic or optical devices. When a keystroke is made on a keyboard which either includes or is connected to the light source a specific frequency and wavelength of light can then be generated and communicated using fiber optical cable to an optical CPU and optical memory chip or other device which is capable of persisting data and information. In this regard, fiber optical cable can transmit about 100 terabytes (tb)/second in C and L bands: the C band is between 1530-1565 nm; the L band is between 1565-1625 nm; the O band is between 1260-1360 nm, the E band is between 1360-1460 nm, the S band is between 1460-1530 nm, and the rarely used U band is between 1625-1675 nm. These wavelengths fall into the invisible portion of the electromagnetic light spectrum. The visible portion of the light spectrum is between 380-740 nm or about 400-700 nm. Lasers which use sapphire can render between 670-1100 nm and are very efficient at around 800 nm, but other materials can be used in the making of lasers to generate other frequencies and wavelengths. Alternatively, the other semi-conductor materials which are typically used to make light emitting diodes (LEDs) are recited in the article: "Light-Emitting Diode Physics" on the website: https://en.wikipedia.org/wiki/Light-emitting_diode_physics.

When a prism is made from a crystalline material such as germanium, ruby, sapphire, diamond, quartz, salt, silicon, or other crystalline material, and in particular when the crystalline material is sensitive to a piezoelectric effect or can otherwise be caused to vibrate and change modes and so its optical and/or electrical properties, the prism can be adapted or tuned to communicate data using the electromagnetic light spectrum, that is, it is possible to make a tunable prism. Sapphire lasers are capable of providing between 670 nm-1100 nm, and is most efficient at about 800 nm in this range, and such lasers are sometimes used in spectroscopy. U.S. Pat. No. 2,212,845 by Alexander M. Nicolson discloses piezoelectric effects using Rochelle salt crystals. U.S. Pat. Nos. 1,450,246 and 1,472,583 by Walter Guyton Cady disclose crystal controlled oscillators, and these U.S. patents are hereby incorporated by reference herein. Quartz is silicon dioxide, and so-called AT cut quartz crystals can be used to make oscillators or resonators having a frequency between 800 KHz and 300 MHz. Synthetic quartz is made for this purpose, and it can be used in a crystal oscillator circuit. Mode locked oscillators can produce short pulses in the range of picoseconds and femtoseconds. The Seiko Epson 56-8003 series provides an example of a modern programmable quartz crystal oscillator, e.g., the Epson SG-8003CG. The aforementioned structures, devices, and methods of communicating data and information can be included in or used with one or more of the devices shown in FIG. 30.

FIG. 30 shows a game controller 5 which can possibly include a light source for communicating data to a computer or gaming platform using the visible light spectrum and/or invisible portion of the infrared light spectrum, and an optical fiber cable 4, as discussed above. Further, the game controller 5 can include the structures and features disclosed in U.S. Pat. No. 10,507,385 B2, U.S. Pat. No. 11,202,960 B2, and U.S. patent application Ser. No. 17/524,373 by Kieran S. Lyden, and all of these patents and the patent application are hereby incorporated by reference herein.

When information is sent wirelessly from a remote keyboard, mouse, game controller, or microphone to a computer using the binary system and digital communication, the electromagnetic signal can be received by the computer and processed by a digital to analog converter and then sent to an optical CPU and be stored in an optical memory chip, or alternatively, using other means of data storage such as ROM, RAM, Flash, Solid State Drive (SSD) memory, spintronics memory or DNA coding memory. Conversely, data and information that is processed and stored optically can be communicated by using an optical analog to digital converter to external devices which use electronic means and digital communication. For information on the subject of spintronics memory, see, e.g., the articles "Highly Efficient Spintronics Memory Offer High Speeds at Low Power," published Dec. 7, 2020, on the website: https://www.hpcwire.com/off-the-wire/lighly-efficient-spintronics-memory-offersohigh-speeds-at-low-power/; and, "Spintronic Devices: A Promising Alternative to CMOS Devices," by Prashanth Barla, Vinod Kumar Joshi, and Somashekara Bhat, published on Jan. 21, 2021 on the website: https://www.google.com/url?sa=t&source=web&rct=i&url=https:/link.springer.com/article/10.1007/s1 0825-020-01648-6&ved=2ahUKEw375bakKr1AhVxk4EHVfDtoQx7wDeg-QIBhAB&us=AOVaw0jCGYZC-CUXQ7cgBTSQsVO.

For information on DNA coding memory, see, e.g., the articles "DNA Digital Data Storage" published on the Wikipedia website: https://g.co/kas/sna3Fj; "DNA: The Ultimate Data-Storage Solution-Scientific American," by Latchesar Lonkov and Bradley Settlemyer, published on May 28, 2021 on the website: https://www.scientificamerican.com/article/dna-the-ultimate-data-storage-solution/?amp=true.

When a microphone 3 or one or more of the other devices shown in FIG. 30 include means for recording vocal and audio information, the words, sounds, or music can be recorded and placed into a digital or analog format and be stored in RAM, ROM, flash memory, Solid State Drive (SSD) or other memory on magnetic tape, CD, DVD, laser disc, or using means for persisting data and information. In this regard, vocal, sound, and music information can also be processed by a digital to analog optical converter or by other mechanical and/or electronic to photonic or optical conversion devices, and be stored in an optical memory chip or other data storage device. Again, the sound tracks of feature films are typically optically embedded in the film substrate and in the past the images and sound track were synchronized using a movieola device. The sound track(s) present on feature films are then later converted into audio output with the use of optical-electrical converters included in the film projectors used in movie theaters. Further, audio frequencies and wavelengths can also be used to communicate data and information not directly associated with vocal communication or music. In this regard, the audible portion of the sound spectrum is typically between 20-20,000 Hz. However, elephants can use and hear lower frequencies, and dogs can hear higher frequencies hence the use of a dog whistle. Whales and dolphins use sonar or bi-sonar. Bats use ultrasound and echo-location. Sound waves are typically sinusoidal and can be communicated using analog equipment, and they can also be readily converted to a photonic or optical form of data and information, and vice-versa, a photonic or optical form of data and information can be converted into sound and an audio form of communication.

Figure 31:
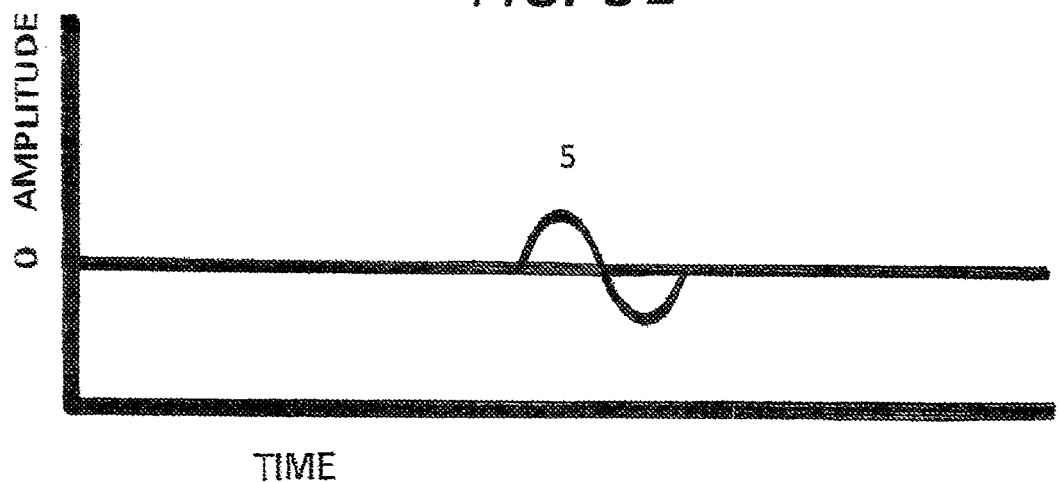
FIG. 31 shows a representation of the screen of an oscilloscope showing a resultant wave form which is derived from a base number portion in a known base number system and an exponent portion which have been manipulated by a mathematical function to derive the resultant wave form having a specific wavelength and which represents and communicates a value or number.

As shown in FIG. 31, a single sine wave can be used to represent and communicate a number having a base portion which has a value of "m" which equals 10 in the base ten number system, or a different value in a different base number system, and also an exponent portion of the number having a value of "n" which can be derived from a logarithm table. For example, $\log_{10} x = 0.698970004$ can be expressed as $10^{0.698970004}$ ("m''''") and this can represent and communicate the number x=5. The base portion value "m" and exponent portion value "n" can be configured to be manipulated by a mathematical function and/or algorithm by which a resultant wave form having a specific frequency and wavelength is derived to represent and communicate the value of the number "m''''" in a single sine wave. The resultant wavelength form which is assigned and coded to represent the value or number "m''''" in a single sine wave can be derived by a mathematical function and/or algorithm which can possibly include other operations, e.g., addition, subtraction, multiplication, division, and/or taking a square root.

In this regard, when integer factorization and prime factorization is made possible on a routine basis with the use of quantum computers which could then possibly use Shor's Algorithm, there will be a need for other means and methods besides the presently widely used Rivest-Shamir-Adleman (RSA) public-key cryptosystem for providing security to data communication. The RSA public-key cryptosytem is disclosed in U.S. Pat. No. 4,405,829 which was granted to Ronald L Rivest, Adi Shamir, and Leonard M. Adleman of the Massachusetts Institute of Technology on Sep. 20, 1983, and this patent is hereby incorporated by reference herein. When using "m''''" to represent and communicate a number such as 5 in the base 10 number system, the exponent "n" which in this case has the value 0.698970004 is a relatively small nine digit number. If and when a frequency and wavelength of light which is in the THz range is to be encoded to represent the number 5, it is possible to take the value "n" which is equal to 0.698970004 and use it as a first factor, and then multiply it by a second factor in order to derive the value of the frequency of the photonic sine wave which is to be encoded to represent the number 5. Alternatively, three or more factors could be used in order to derive the value of the frequency of the sine wave which would be encoded to represent the number 5. In this way, the ability to perform integer factorization and prime factorization would be flipped and instead of being used to break a code, it can be used to help create a code and then derive one or more factors which can serve as the key to arriving at a known numerical solution, and which in this case would correspond to the frequency of a sine wave. If and when the value of one or more of the factors would also be randomized then it would be even more difficult for a hacker or other unauthorized party or form of artificial intelligence to interpret and understand the data and information which would be contained in a communication.

The assignment and encoding of specific wavelengths to represent and communicate specific values, numbers, mathematical functions and operations can be stored in computer memory or other data and information, communication, manipulation and storage system. Other numerical values which are often used in the field of science, e.g., the speed of light which is 299,792,458 meters per second, Avogadro's number which is $6.022140857 \times 10^{23}$, and Planck's constant which is $6.62607004 \times 10^{-34}$ joule seconds can each be represented and communicated by different wave forms each having a different specific frequency and wavelength. As previously discussed, a software application can be used to access lists of numbers and other information which in the past have typically been included in hard copy tables of algorithms, but which can instead be stored in computer memory, and the software application can then execute and run programs which have been compiled which can include commands and algorithms to perform mathematical computations and other processes.

Visible light falls in the range of the electromagnetic spectrum between ultraviolet and infrared light. Visible light wavelengths have frequencies between approximately $4 \times 10^{14}$ and $8 \times 10^{14}$ cycles per second (Hz) which corresponds to frequencies in the range approximately between 405-790 THz and wavelengths in the range between approximately 380-740 nanometers (nm), and one cycle then has a period of about 2 femtoseconds (FS). The ultraviolet light spectrum includes wavelengths in the range between approximately 10 nm and 400 nm which corresponds to frequencies in the range between approximately 30 PHz-750 THz. The infrared light spectrum includes wavelengths in the range between approximately 700 nm-1 mm and corresponds to frequencies in the range between approximately 430 THz-300 GHz. In this regard, it is known that there can be some overlap as between the visible light spectrum and the infrared and ultraviolet light spectrums. Accordingly, in order to represent and communicate the number 5 shown in FIG. 3 and also the numbers 5, 2, and 3 shown in FIG. 32 and FIG. 33 using photons and visible and/or invisible light, the mathematical variables or numbers "m," "n," 5, 2, 3, or other mathematical variables or numbers can be manipulated by a mathematical function and/or algorithm which can derive a resultant frequency and wavelength which falls within the frequency and wavelength range associated with visible and/or invisible light. In this regard, the combined C, L, O, E and S bands used in optical fiber cable transmission are associated with infrared light in the range between approximately 1260-1625 nm. Subtracting 1260 nm from 1625 nm yields a difference of 365 nm which is about the same difference and result obtained when 380 nm is subtracted from 740 nm which yields 360 nm and this corresponds to the range of wavelengths associated with visible light.

FIG. 32 shows a representation of the screen of an oscilloscope showing three different resultant wave forms which are each derived from a base number portion in a known base number system and also an exponent portion and which have been manipulated by a mathematical function and/or algorithm to derive the three different resultant wave forms each having a specific wavelength which can represent and communicate a value or number. In FIG. 32, the three different resultant wave forms are shown to directly follow one another in a series and the changes between the three different resultant wave forms take place on the reference line and/or zero. Alternatively, the three resultant wave forms could be separated by a break or a different wave form which could be used to indicate a desired mathematical function and operation therebetween, e.g., addition, multiplication, subtraction, division. Alternatively, the changes in the resultant wave forms which each have a specific wavelength can take place at a position which is off the reference line and/or zero, e.g., the changes in the resultant wave forms could take place at the one quarter, one half, three quarter, or other portion of the cycle of one or more of the three resultant wave forms. In this regard, the various forms of detection used in frequency modulation which have been previously discussed, such as slope detection, can be used to read and identify a specific frequency and wavelength from a portion of wave form.

In FIG. 32, the base portion "m" of all three of the different resultant wave forms could have the value 10 in the base 10 number system. However, the first resultant wave form could be associated with a base 10 number having an exponent portion "n" equal to 0.698970004 and $\log_{10}$ x=0.698970004 can be expressed as $10^{0.698970004}$ which yields the value and number x=5, and the first resultant wave form can be suitably manipulated by a mathematical function and/or algorithm using the values or numbers associated with the variables "m" and "n", e.g., by addition, multiplication, subtraction, division, or other function, to derive a specific wavelength which can be used to represent and communicate the number 5. The second resultant wave form could be associated with a base 10 number having an exponent portion "n" equal to 0.301029996 and $\log_{10}$ x=0.301029996 can be expressed as $10^{0.301029996}$ which yields the value and number x=2, and the second resultant wave form can be suitably manipulated by a mathematical function and/or algorithm using the values or numbers associated with the variables "m" and "n", e.g., by addition, multiplication, subtraction, division, or other function, to derive a specific wavelength which can be used to represent and communicate the number 2. The third resultant wave form could be associated with a base 10 number having an exponent portion "n" equal to 0.477121255 and $\log_{10}$ x=0.477121255 can be expressed as $10^{0.477121255}$ which yields the value and number x=3, and the third resultant wave form can be suitably manipulated by a mathematical function and/or algorithm using the values or numbers associated with the variables "m" and "n", e.g., by addition, multiplication, subtraction, division, or other function, to derive a specific wavelength which can be used to represent and communicate the number 3. Accordingly, the three resultant wave forms can represent and communicate the numbers 5, 2, and 3. Depending upon the software application being used and its included and compiled programs, commands and algorithms, the numbers 5, 2, 3 could be read and understood as simply being 5, 2, 3, or alternatively, e.g., the numbers could be used in a mathematical function such as addition and/or subtraction and then 5+2+3=10, or alternatively, e.g., the numbers could be used in a mathematical function such as multiplication and then 5×2×3=30. In order to represent and communicate the number 523, the exponent "n" associated with the first resultant wave form could be changed from 0.698970004 to 2.698970004 and $\log_{10}$ x=2.698970004 can be expressed as $10^{2.698970004}$ which yields the value and number x=500, the exponent "n" associated with the second resultant wave form could be changed from 0.301029996 to 1.301029996 and $\log_{10}$ x=1.301029996 can be expressed as $10^{1.301029996}$ which yields the value and number x=20, and the exponent "n" associated with the third resultant wave form could remain the same 0.477121255 and $\log_{10}$ x=0.477121255 can be expressed as $10^{0.477121255}$ which yields the value and number x=3, and so this can be used represent and communicate the three numbers 500, 20, and 3. A software application including a compilation of programs including commands and algorithms can then use these numbers in a mathematic function, such as addition to derive and represent and communicate the number 523. Alternatively, the number 523 can be represented by a plurality of wave forms which represent $5\times10^2=500$, $2\times10^1=20$, and $3^1=3$, and a software application including a compilation of programs including commands and algorithms can use these numbers in a mathematic function such as addition to derive and represent and communicate the number 523. Alternatively, other ways and means of using mathematical operations to derive and code wave forms having a specific frequency and wavelength to represent and communicate numbers can be used.

FIG. 33 shows a representation of the screen of an oscilloscope showing two cycles of each of the three different resultant wave forms which are each derived from a base number portion in a known base number system and an exponent portion and which have been manipulated by a mathematical function and/or algorithm to derive the three different resultant wave forms each having a specific wavelength which can be used to represent and communicate a value or number. In this regard, the base portion "m" of all three of the three different resultant wave forms could have the value 10 in the base 10 number system. However, the first resultant wave form could be associated with a number in base 10 having an exponent portion "n" equal to 0.698970004 and $\log_{10}$ x=0.698970004 can be expressed as $10^{0.698970004}$ which yields the value and number x=5, and the first wave form can be suitably manipulated by a mathematical function and/or algorithm using the values or numbers associated with the variables "m" and "n", e.g., by addition, multiplication, subtraction, division, or other function, to derive a specific wavelength which can be used to represent and communicate the number 5. The second resultant wave form could be associated with a number in base 10 having an exponent portion "n" equal to 0.301029996 and $\log_{10}$ x=0.301029996 can be expressed as $10^{0.301029996}$ which yields the value and number x=2, and the second wave form can be suitably manipulated by a mathematical function and/or algorithm using the values or numbers associated with the variables "m" and "n", e.g., by addition, multiplication, subtraction, division, or other function, to derive a specific wavelength which can be used to represent and communicate the number 2. The third resultant wave form could be associated with a number I base 10 having an exponent portion "n" equal to 0.477121255 and $\log_{10}$ x=0.477121255 can be expressed as $10^{0.477121255}$ which yields the value and number x=3, and the third wave form can be suitably manipulated by a mathematical function and/or algorithm using the values or numbers associated with the variables "m" and "n", e.g., by addition, multiplication, subtraction, division, or other function, to derive a specific wavelength which can be used to represent and communicate the number 3. Accordingly, the three resultant wave forms can represent and communicate the numbers 5, 2, and 3. Depending upon the software application and its compilation of programs, commands, and algorithms, the numbers 5, 2, 3 could be read and understood as simply being 5, 2, 3, or alternatively, e.g., the numbers could be used in a mathematic function such as addition and/or subtraction and then 5+2+3=10, or alternatively, e.g., the numbers could be used in a mathematic function such as multiplication and then 5×2×3=30. In order to represent and communicate the number 523, the exponent "n" associated with the first resultant wave form could be changed from 0.698970004 to 2.698970004 and $\log_{10}$ x=2.698970004 can be expressed as $10^{2698970004}$ which yields the value and number x=500, the exponent "n" associated with the second resultant wave form could be changed from 0.301029996 to 1.301029996 and $\log_{10}$ x=1.301029996 can be expressed as $10^{1.301029996}$ which yields the value and number x=20, and the exponent "n" associated with the third resultant wave form could remain the same 0.477121255 and $\log_{10}$ x=0.477121255 can be expressed as $10^{0.477121255}$ which yields the value and number x=3, and so this can be used to represent and communicate the three numbers 500, 20, and 3, and a software application including a compilation of programs including commands and algorithms can use these numbers in a mathematic function such as addition to derive and represent and communicate the number 523. Alternatively, the number 523 can be represented by a plurality of wave forms which represent $5\times10^2=500$, $2\times10^1=20$, and $3^1=3$, and a software application including a compilation of programs including commands and algorithms can use these numbers in a mathematic function such as addition to derive and represent and communicate the number 523. Alternatively, other ways and means of using mathematical operations to derive and code wave forms having a specific frequency and wavelength to represent and communicate numbers can be used.

In FIG. 33, the two cycles of each of the three different resultant wave forms are shown to follow one another in a series after a break and the changes in their different respective wave forms take place on the reference line and/or zero. Alternatively, the three resultant wave forms could be separated by break or other wave form which could be used to indicate a mathematical function and/or operation therebetween. Alternatively, the changes in the resultant wave forms could take place at a position which is off the reference line and/or zero, e.g., the changes in the resultant wave forms could take place at the one quarter, one half, three quarter, or other portion of the cycle of one or more of the three resultant wave forms. In this regard, the various forms of detection which have been used in frequency modulation and discussed previously, such as slope detection, can be used to read and identify a specific frequency and wavelength from a portion of wave form.

Figure 34:
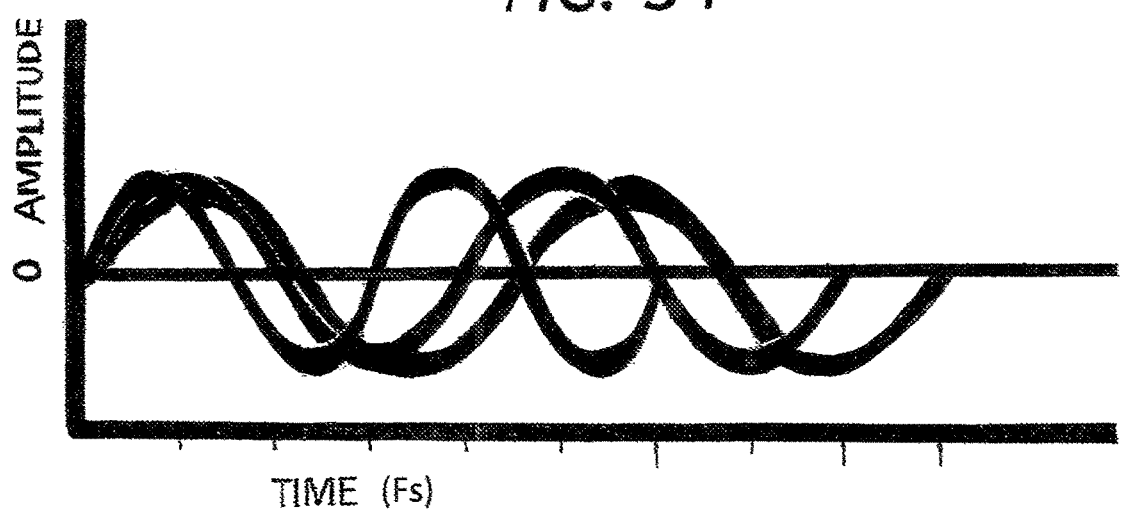
FIG. 34 shows a representation of the screen of an oscilloscope showing two cycles of three different sine waves corresponding to visible and/or invisible light having different frequencies and wavelengths.

FIG. 34 shows a representation of the screen of an oscilloscope showing two cycles of three different sine waves corresponding to visible and/or invisible light having different frequencies and wavelengths. For example: the sine wave having the shortest wavelength could correspond to the color violet in the visible light spectrum and have a wavelength of 450 nanometers (nm) which takes 1.5 Femtoseconds (Fs) to complete one cycle; the sine wave having the second shortest wavelength could correspond to the color yellow in the visible light spectrum and have a wavelength of 590 nm which takes 2.0 Fs to complete one cycle; and the since wave having the longest wavelength could correspond to the color red in the visible light spectrum and have a wavelength of 700 nm which takes 2.3 Fs to complete one cycle. Alternatively, the three different sine waves could correspond to three different frequencies in the visible and/or invisible light spectrum such as the invisible portion of the infrared light spectrum. In this regard, the combined C, L, O, E and S bands used in optical fiber cable transmission are associated with infrared light in the range between approximately 1260-1625 nm. Subtracting 1260 nm from 1625 nm yields a difference of 365 nm which is about the same difference and result obtained when 380 nm is subtracted from 740 nm which yields 360 nm and this corresponds to the range of wavelengths associated with visible light.

When is possible to detect differences in the frequency and wavelength of sine waves corresponding to 1 nanometer (nm) with desired accuracy, then there would be about 360 different possible frequencies and wavelengths in the visible light spectrum, and at least 360 more in the infrared spectrum to work with in order to perform encoding. Some of the following methods and techniques can be used in order to provide for more possible code points when using wave forms to represent and communicate data and information. A first wave form having a first specific frequency and wavelength can be combined with a second wave form having a different and second specific frequency and wavelength. In this regard, the first wave form can be followed by the second in a series. Alternatively, the first wave form and second wave form can be communicated in parallel simultaneously and share the same point of origin, and could then create a single resultant wave form. Alternatively, the first wave form and second wave form can be offset and phase shifted relative to one another. Further, the many different positions to which the two wave forms can be phase shifted can each provide for different code points. The amplitude of one, the other, or both of the first wave form and the second wave form can also be changed and otherwise manipulated. Moreover, there are other methods and techniques which can be used to provide a multiplicity of possible code points, as discussed below.

Human DNA is a long molecule held together in two strands known as polynucleotides which form a double helix coil around a plurality of base pairs which are each made of two of four possible nucleobases, namely, cytosine (C), guanine (G), adenine (A), and thymine (T). In this regard, cytosine always pairs with guanine and adenine always pairs with thymine, and the human genome is made of about 3.2 billion of these base pairs which are disposed in a series in a DNA molecule. Selecting two colors from the red, blue, and green portions of the visible light spectrum, or from the red, blue, green, and yellow portions of the visible light spectrum, or selecting other specific frequencies and wavelengths in a different portion of the visible or invisible light spectrum, and then combining them as pairs and placing them in series or in parallel is one method and technique which can emulate and approximate the data and information coding and storage ability of the DNA molecule. This method, technique, and process for representing, configuring and communicating data and information will here be referred to as color coding, and/or color coded. For example, if four colors are selected from the red, blue, green, and yellow portions of the visible light spectrum, and they can all be combined with one another, that is, unlike cytosine, guanine, adenine, and thymine in human DNA, then the potential for data and information coding and storage is possibly even greater than DNA. Furthermore, there are many more combinations and permutations which are possible using approximately 360 different frequencies and wavelengths of visible light, and at least that many more different frequencies and wavelengths of invisible light in the infrared spectrum. For example, the possible number of combinations and permutations of one color having a specific frequency and wavelength being combined with another color having a different specific frequency and wavelength selected from a list or group including at least 360 members can be calculated: Permutations nPr=360!/(360−2)!=129,240, and Combinations nCr=360!/2!×(360−2)!=64,620. The possible number of combinations and permutations of four colors which each have a different specific frequency and wavelength which can be combined with one another selected from a list or group including at least 360 members can be calculated as follows: Permutations nPr=360!/(360−4)!=16,517,647,440, and Combinations nCr=360!/4!×(360−4)!=688,235,310. While it may not be possible or practical to encode infinite numbers with a finite number of coding points, this method and technique can nevertheless provide for a substantial number of coding points. Moreover, if, e.g., eight colors having different frequencies and wavelengths are selected for use then the result would be: Permutations nPr=360!/(360−8)!=260,858, 210,442,628,246,400, and Combinations nCr=360!/8!×(360−8)!=6,469,697,679,132,645. As a point of reference, Unicode and ISO/IEC 10646 provide for about 1.1 million possible coding points.

As previously discussed, the current Webster's dictionary includes about 470,000 words, and the concise Oxford dictionary includes between about 171,476 words. However, it has been estimated that most individuals only have knowledge of about 15,000-20,000 word families which are called lemmas in their native language, and individuals seldom have knowledge of more than 2,000-3,000 word families in a foreign language. Accordingly, a concise dictionary for use with a computer language can include less than 20,000 lemmas, and even less than 5,000 lemmas. If even only 1,000 or 2,000 and certainly less than 3,000-5,000 alphabetical letters, words, symbols, and numbers are each individually assigned and coded in order to be represented and communicated in the form of a square wave or a sine wave having a specific frequency and wavelength, then the amount of data in bits, waves, vibes, qubits, or whatever name or form would be given to the data and information, can possibly be decreased by over 75%. The following two websites having 1000 and 3000 word lists include the most commonly used words in English: https://gonaturalenglish.com; and, http://basicenglishspeaking.com. According to the website http://basicenglishspeaking.com: "If you know these 3000 most common words, you can understand at least 95% of all conversations, e-mails, newspapers, and books." This is one way to create faster computers which do not consume as much time and energy as they do today, that is, if the desire is to make computers 20 times faster, then one way to accomplish this is to make a new computer language which uses a lot less data in order to communicate the same information. In view of the number of coding points which can be provided by using combinations of different wave forms in the visible light spectrum, and/or invisible portion of the infrared light spectrum, or other portion of the electromagnetic spectrum, it is be possible to encode all of the words, symbols, and functions which are presently being used, and to also encode those numbers which are used by a typical user population, or a specific target population of scientists, or other users of computers or other data and information communication, manipulation, and storage devices.

As previously discussed, a number of different models such as OSI and TCP/IP are being used to communicate data and information in telecommunications and computer network environments. The method and process of combining two or more colors in the visible light spectrum or invisible portion of the infrared light spectrum associated with specific frequencies and wavelengths to configure and make a set, and further configuring and making a plurality of sets which can then be configured in series and/or parallel, can be further configured to include and/or be communicated with one or more other specific frequencies and wavelengths associated with the configuration and making of a packet which can include control information typically included in a header or footer, and also information for the possible purpose of synchronization and error detection and correction. In order to provide a visual aid by making reference to the structure of a DNA molecule, one can imagine the control information as being mostly contained in the double helix portion of the molecule or signal, but perhaps with a few breaks and/or portions in the plurality of sets being used to include control information and also the purpose of synchronization and error detection and correction, but most or all of the sets including different combinations of specific wavelengths and frequencies then being used like the cytosine (C), guanine (G), adenine (A), and thymine (T) nucleobases in the DNA molecule to deliver the payload of data and information. In this regard, various means for persisting data and information such as the use of classical electronic silicon-based memory chips, ROM, RAM, Flash-memory, Solid State Drive (SSD) memory, optical memory chips and/or other forms of photonic memory, spintronics memory, DNA memory, and what will here be referred to as a color coded memory (CCM) which is configured to process and store data and information which has been configured in various combinations and permutations of different frequencies and wavelengths of visible and/or invisible light. In this regard, the method, technique, and process of configuring data and information using various combinations and permutations of different frequencies and wavelengths of visible and/or invisible light has been discussed in the preceding paragraphs using the DNA molecule as a visual aid and this method and process has been referred to herein as color coding and/or color coded.

Again, one or more of the different models, methods, and processes which are being used to communicate data and information in various telecommunication and computer network environments can be configured and adapted to be used with one or more of the structures, methods, and processes discussed and shown in the present disclosure, and vice-versa, that is, the structures, methods, and processes relating to making a computer language and code for software application development, data compression, and use with conventional, optical, hybrid electro-optical and quantum computers can be configured and adapted to be used with one or more of the different models, methods, and processes which are being used to communicate data and information in various telecommunication and computer network environments.

Figure 35:
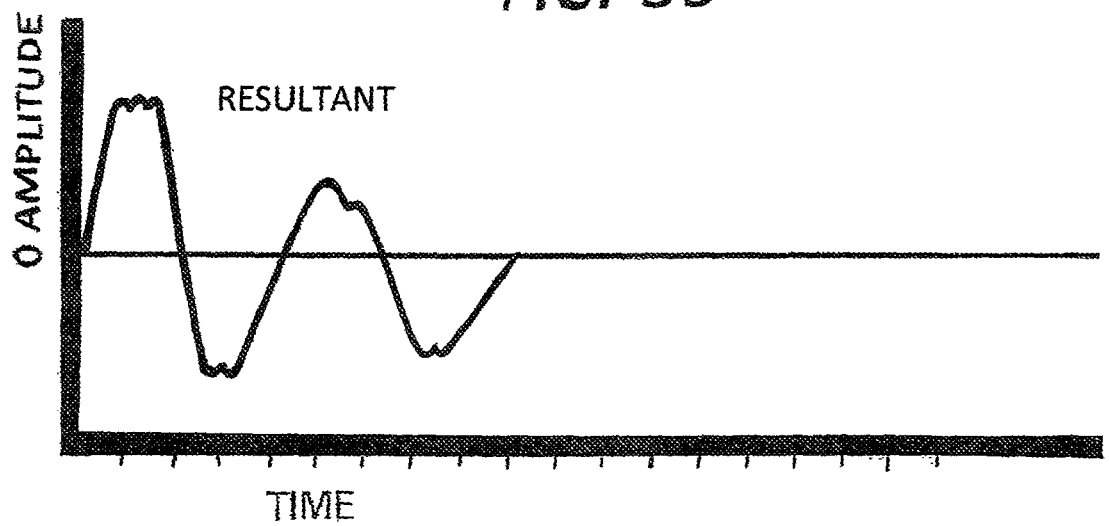
FIG. 35 shows a resultant wave form derived from the summation and combination of the three different sine waves shown in FIG. 34.

FIG. 35 shows a representation of a resultant wave form derived from the summation and combination of the three different sine waves shown in FIG. 34. In this regard, the amplitude and time scales shown on the vertical and horizontal axis in FIG. 35 are approximately twice as large as those used in FIG. 34. The representation shown in FIG. 35 was not derived using mathematical data which was processed and graphed by a computer program, but rather is merely a rough approximation which is intended to show that the resultant wave created by a plurality of different sine waves can be very different looking than the individual sine waves, and the individual sine waves can then be either partially or completely unrecognizable in the resultant wave. Nevertheless, the data and information associated with the three individual sine waves is still present and can be effectively communicated by the resultant wave form.

Figure 36:
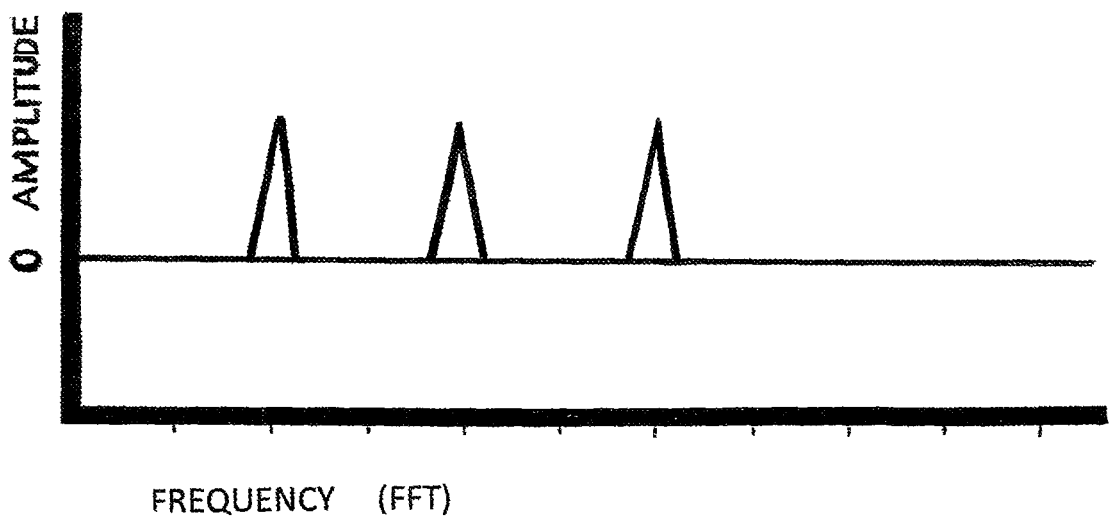
FIG. 36 shows the result of a Fast Fourier Transform of the data and information associated with the resultant wave shown in FIG. 35.

FIG. 36 shows the result of a Fast Fourier Transform (FFT) of the data and information associated with the resultant wave shown in FIG. 35. The use of the Fast Fourier Transform (FFT) can dramatically reduce the complexity and time required to compute a discrete Fourier transform (DFT) or its inverse (IDFT) by an attempt to calculate O ($N^2$), and instead enables O (N log N) to be calculated where N is the size of the data. Some FFT algorithms depend on the factorization of N, but others exist which can also be used with prime N. In FIG. 36, the graph shows amplitude on the vertical axis, and frequency on the horizontal axis, whereas FIGS. 34-35 show amplitude on the vertical axis, and time on the horizontal axis. The FFT indicates and communicates the three different frequencies of the three different sine waves corresponding to visible and/or invisible light shown in FIG. 34 which make up the single resultant wave form shown in FIG. 35. For example: the sine wave having the shortest wavelength could correspond to the color violet in the visible light spectrum and have a wavelength of 450 nanometers (nm) which takes 1.5 Femtoseconds (Fs) to complete one cycle, and because wavelength times frequency equals the speed of light, and frequency equals the speed of light divided by the wavelength, the frequency corresponding to the wavelength of 450 nm would be 666,205,462,222,222 Hz. This frequency would then be indicated and communicated by the peak shown in FIG. 36 on the far right side. The sine wave having the second shortest wavelength could correspond to the color yellow in the visible light spectrum and have a wavelength of 590 nm which takes 2.0 Fs to complete one cycle, and because wavelength times frequency equals the speed of light, and frequency equals the speed of light divided by the wavelength, the frequency corresponding to a wavelength of 590 nm would be 508,122,810,169,492 Hz, or approximately 508 THz. This frequency would then be indicated and communicated by the peak shown in FIG. 36 in the middle. The sine wave having the longest wavelength could correspond to the color red in the visible light spectrum and have a wavelength of 700 nm which takes 2.3 Fs to complete one cycle, and because wavelength times frequency equals the speed of light, and frequency equals the speed of light divided by the wavelength, the frequency corresponding to a wavelength of 700 nm would be 428,274,940,000,000 Hz, or approximately 428 THz. This frequency would then be indicated and communicated by the peak shown in FIG. 36 on the far left side. When these three different frequencies and wavelengths of visible light are coded so as to represent specific data and information, whether it be a single letter of the alphabet, a word, a symbol, a number, a command, a function, or an operation, the data and information can be communicated using light waves, and be read and understood by a user of a computer or other data storage and processing device which includes a software application which includes a compilation of programs, codes, lists, algorithms, commands, and other methods for processing, manipulating, and storing data and information. Alternatively, the three different FFT wave forms could correspond to three different sine waves having the different frequencies and wavelengths in the visible and/or invisible light spectrum, such as the invisible portion of the infrared light spectrum.

Accordingly, whether data and information is communicated using visible light, invisible light, or a different portion of the electromagnetic spectrum, and whether the data and information is communicated in a series of wave forms, or a plurality of wave forms communicated in parallel, or a plurality of wave forms which are being communicated nearly or actually simultaneously, and then whether using electronic means and wires and/or photonic means using visible or invisible light and optical fiber cable or other photonic or optical communication structures, devices and methods, the data and information associated with a plurality of wave forms and signals can be communicated, identified, read and understood by a user of a computer or other data storage and processing device which includes a software application which includes a suitable compilation of programs, codes, lists, and algorithms including but not limited to the Fast Fourier Transform (FFT), and other possible commands, methods, and techniques for processing, manipulating, and storing data and information.

The following Clauses provide exemplary methods of making a computer language, and/or exemplary methods of communicating a computer language, and/or at least one exemplary computer language, but also exemplary optical keyboards and optical game controllers for use with electronic computers, optical computers, electro-optical computers, and/or quantum computers.

Clause 1: A method of making a computer language comprising providing a dictionary comprising a list comprising a plurality of member alphabetical letters and/or words and/or numbers and/or symbols, each member of said plurality being represented by a corresponding wave form comprising a specific frequency and wavelength.

Clause 2: The method of making a computer language according to clause 1, wherein said wave form is in the electromagnetic spectrum.

Clause 3: The method of making a computer language according to clause 1, wherein said wave form comprises a photonic wave in the visible light spectrum and/or invisible portion of the infrared light spectrum.

Clause 4: The method of making a computer language according to clause 1, wherein said wave form comprises a sine wave.

Clause 5: The method of making a computer language according to clause 1, wherein said wave form comprises an electronic wave.

Clause 6: The method of making a computer language according to clause 1, wherein said wave form comprises a square wave.

Clause 7: The method of making a computer language according to clause 1, wherein said wave form comprises a product of data compression.

Clause 8: The method of making a computer language according to clause 1, wherein said list of alphabetic letters and/or words further comprises a plurality of sub-lists comprising the following categories: noun, verb, adjective, adverb, pronoun, preposition, conjunction, determiner, and exclamation.

Clause 9: The method of making a computer language according to clause 1, wherein said plurality of member numbers are represented by a first wave form comprising a first frequency and wavelength which represents the base portion of a specific number, and a second wave form comprising a second frequency and wavelength which represents the exponent portion of said specific number, whereby the value of said specific number can be represented and communicated.

Clause 10: The method of making a computer language according to clause 9, wherein a difference exists in time and/or space between the start of said first wave form and said second wave form and said second wave form is substantially identical in amplitude and shape to said first wave form, but said second wave form is phase shifted relative to said first wave form, and said first wave form represents the base portion of said specific number, and the amount to which said second wave form is phase shifted in time and/or space represents the value of the exponent corresponding to said specific number, whereby the value of said specific number can be represented and communicated.

Clause 11: The method of making a computer language according to clause 1, wherein the absence of a break between two of said plurality of member numbers which are represented and/or communicated in a series represents a mathematic function comprising addition.

Clause 12: The method of making a computer language according to clause 1, wherein the absence of a break between two of said plurality of member numbers which are represented and/or communicated in a series represents a mathematical function comprising multiplication.

Clause 13: The method of making a computer language according to clause 1, wherein a break between two of said plurality of member letters and/or words and/or numbers and/or symbols represents a separation between said plurality member letters and/or words and/or numbers and/or symbols.

Clause 14: The method of making a computer language according to clause 1, wherein the presence of a wave form representing a symbol disposed between two of said plurality of member numbers represents a mathematical function and operation between said member numbers.

Clause 15: A method of making a computer language for representing any positive number using the values and numbers 0, 1, 2, $2^{nth}$ exponential power, 3, and $3^{nth}$ exponential power and/or a sum of two or more of said values and numbers.

Clause 16: A method of making a computer language for representing and communicating values or numbers each comprising a base portion comprising one or more of the following 0, 1, 2, 3, 4, 5, 6, 7, 8, 9, and an exponent portion, said base portion being represented and communicated by a wave form comprising a first frequency and wavelength, said exponent portion being represented by a second wave form comprising a second frequency and wavelength, wherein a difference exists in time and/or space between the start of said first wave form and said second wave form, and said second wave form is substantially identical in amplitude and shape to said first wave form, and said second wave form is phase shifted relative to said first wave form, and the amount to which said second wave form is phase shifted in time and/or space represents and communicates the exponent, whereby said values or numbers can be represented and communicated.

Clause 17: The method of making a computer language for representing and communicating a plurality of values or numbers according to clause 16, wherein said first wave form and said second wave form comprise square waves.

Clause 18: The method of making a computer language for representing and communicating a plurality of values or numbers according to clause 16, wherein said first wave form and said second wave form comprise sine waves.

Clause 19: The method of making a computer language for representing and communicating a plurality of values or numbers according to clause 16, wherein said first wave form and said second wave form comprise different frequencies and wavelengths.

Clause 20: A method of making a computer language for representing and communicating a value or number in a known base number system, said value or number having a base portion equal to said known base number in said known base number system and an exponent portion comprising a value obtained from a list comprising a table of algorithms, said known base number in said known base number system and said exponent portion being configured to be manipulated by a mathematical function by which a resultant wave form having a specific wavelength is derived to represent and communicate said value or number.

Clause 21: The method of making a computer language according to clause 20, wherein said base number in said known base number system comprises the number 10 in the base 10 number system.

Clause 22: The method of making a computer language according to clause 20, wherein said base number in said known base number system comprises the natural logarithm value e.

Clause 23: An optical keyboard configured to communicate data and information using visible light and/or infrared light.

Clause 24: An optical game controller configured to communicate data and information using visible light and/or infrared light.

Clause 25: A computer keyboard comprising means for producing an output comprising photons and a plurality of sine waves in the visible light spectrum and/or invisible portion of the infrared light spectrum, said output comprising representations of a plurality of alphabetical letters and/or words and/or numbers and/or symbols and/or commands and/or functions and/or operations, said output being communicated by fiber optic cable to a computer, said computer selected from the group of computers consisting of an electronic computer, an optical computer, an electro-optical computer, and a quantum computer.

Clause 26: A method of communicating a computer language comprising providing a dictionary comprising a list comprising a plurality of member alphabetical letters and/or words and/or numbers and/or symbols, each of said plurality of member alphabetical letters and/or words and/or numbers and/or symbols being represented by a corresponding wave form comprising a specific frequency and wavelength.

Clause 27: A computer language comprising a dictionary comprising a list comprising a plurality of member alphabetical letters and/or words and/or numbers and/or symbols, each of said plurality of member alphabetical letters and/or words and/or numbers and/or symbols being represented by a corresponding wave form comprising a specific frequency and wavelength.

Clause 28: A method of making a computer language comprising selecting a value or number X in a base number system comprising a logarithmic function and expression $Log_b^n = X$, where b is the base portion of a number in said base number system, and where n is the exponent portion of said number in said base number system to which b is raised to produce said value or number X, taking and using n as a first factor, and multiplying n by at least a second factor to yield a specific frequency and associated wavelength comprising a portion of the electromagnetic spectrum.

Clause 29: The method according to clause 28, further including at least a third factor which is randomly generated, and the multiplication of said first factor n and said second factor and said third factor yields said frequency and associated wavelength comprising a portion of the electromagnetic spectrum.

Clause 30: The method according to clause 28, wherein said portion of the electromagnetic spectrum comprises a portion of the visible light spectrum and/or infrared light spectrum.

Clause 31: A method of making a computer language comprising selecting a plurality of wave forms corresponding to specific frequencies and associated wavelengths in the visible light spectrum and/or invisible portion of the infrared light spectrum, and combining at least two of said plurality of wave forms corresponding to specific frequencies and wavelengths to create a coding point.

Clause 32: The method according to clause 31, wherein at least four of said plurality of wave forms are combined to create a coding point.

Clause 33: The method according to clause 31, wherein said coding point is used to represent at least one of an alphabetical letter, a word, a number, a symbol, a command, a function, and an operation.

Clause 34: The method according to clause 31, wherein said at least two of said plurality of wave forms are combined to comprise a plurality of sets, said plurality of sets being disposed in series and/or in parallel to provide a plurality of coding points.

Clause 35: The method according to clause 34, wherein the number of permutations of said plurality of coding points corresponds to the formula: Permutations=(Number of Sets)!/(Number of Sets-2)!, and the number of combinations of said coding points corresponds to the formula: Combinations=(Number of Sets)!/2!×(Number of Sets-2)!

As discussed above, the computer language and code for software application development, data compression, and the communication of data and information can be used with conventional, optical, hybrid electro-optical and quantum computers. Having thus described the subject matter, it should be apparent that numerous software applications, modifications, and adaptations may be resorted to without departing from the scope and fair meaning of the subject matter as set forth hereinabove.

What is claimed is:

1. A computer non-transitory readable medium which configures at least one of a conventional computer, an optical computer, an electro-optical computer, and/or a quantum computer comprising a processor, a memory, at least one input device, and at least one output device to perform inputting, outputting, processing, and memory, said memory comprising data and information comprising a plurality of alphabetical letters and/or a plurality of words, and/or a plurality of numbers, and/or a plurality of symbols, each of said plurality of alphabetical letters and/or said plurality of words and/or said plurality of numbers and/or plurality symbols being directly represented and encoded by a square wave form, a sinusoidal wave form, and/or a combination thereof comprising a specific frequency and wavelength.

2. The computer non-transitory readable medium according to claim 1, wherein said memory comprises at least 1000 different of said plurality of alphabetical letters and/or said plurality of words.

3. The computer non-transitory readable medium according to claim 1, wherein said plurality of alphabetical letters are represented and encoded based upon their known frequency of use in the English Language which when ranked from most frequent to least frequent is as follows: E, A, R, I, O, T, N, S, L, C, U, D, P, M, H, G, B, F, Y, W, K, V, X, Z, J, and Q.

4. The computer non-transitory readable medium according to claim 1, wherein said memory comprises a plurality of programs, and a plurality of said plurality of programs are compiled.

5. The computer non-transitory readable medium according to claim 1, wherein said plurality alphabetical letters and/or said plurality of words are configured in groups in said memory based on their only or first letter, and said groups are represented and encoded using a defined range of frequencies and wavelengths.

6. The computer non-transitory readable medium according to claim 1, wherein said computer comprises an electro-optical computer comprising a hybrid digital and optical processor which can process data and information which is represented and encoded in the form of said square wave form and/or said sinusoidal wave form, and a combination thereof.

7. The computer non-transitory readable medium according to claim 1, wherein said data and information comprises a product of data compression.

8. The computer non-transitory readable medium according to claim 1, wherein said memory comprises groups of said plurality of words in accordance with the following word classes that exist in the English language: noun, verb, adjective, adverb, pronoun, preposition, conjunction, determiner, and exclamation.

9. The computer non-transitory readable medium according to claim 1, wherein said plurality of numbers are each individually represented and encoded by a first square wave form and/or first sinusoidal wave form comprising a first frequency and wavelength which represents and encodes a base portion of a specific number, and a second square wave form and/or second sinusoidal wave form comprising a second frequency and wavelength which represents and encodes an exponent portion of said specific number.

10. The computer readable medium according to claim 9, wherein a difference exists in time and/or space between the start of said first square wave form and/or said first sinusoidal wave form and said second square wave form and/or said second sinusoidal wave form and said second square wave form and/or said second sinusoidal wave form is phase shifted relative to said first square wave form and/or said first sinusoidal wave form, and said first square wave form and/or said first sinusoidal wave form is used to represent and encode said base portion of said specific number, and the amount to which said second square wave form and/or said second sinusoidal wave form is phase shifted in time and/or space is used to represent and encode said exponent portion of said specific number.

11. The computer non-transitory readable medium according to claim 1, wherein the absence of a break between two of said plurality of numbers represents a mathematic function comprising addition.

12. The computer non-transitory readable medium according to claim 1, wherein the absence of a break between two of said plurality of numbers represents a mathematical function comprising multiplication.

13. The computer non-transitory readable medium according to claim 1, wherein a break between two of said plurality of letters and/or said plurality of words and/or said plurality of symbols represents a separation between said two of said plurality letters and/or of said plurality of words and/or said plurality of symbols.

14. The computer non-transitory readable medium according to claim 1, wherein a break between two of said plurality of numbers represents a separation between said two of said plurality of numbers.

15. The computer non-transitory readable medium according to claim 1, wherein the presence of said square wave form and/or said sinusoidal wave form represents an encoded symbol disposed between two of said plurality of numbers and a mathematical function and operation between said two of said plurality of numbers.

16. The computer non-transitory readable medium according to claim 1, wherein said memory comprises a formal computer language which comprises at least one of a construction language, a command language, a configuration language, a programming language, a query language, a transformation language, a data exchange language, a markup language, a modeling language, an architecture description language, a hardware description language, a printed page language, a simulation language, a specification language, a sheet style language, a domain-specific language, a general-purpose language, a natural language processing language.

17. The computer non-transitory readable medium according to claim 1, wherein said memory comprises a plurality of computer keyboard commands, functions, operations, and/or shortcuts comprising a plurality of the following: Alt, Backspace, Caps Lock, Ctrl, Delete, End, Enter, Esc, Fn, Home, Insert, Num LK, Pgdn, Pgup, Pause Break, Prt SC SYSRQ, Scr Lk, Shift, Spacebar, Tab, Windows, Ctrl+A, Ctrl+C (or Ctrl+Insert), Ctrl+X, Ctrl+V (or Shift+Insert), Ctrl+Z, Ctrl+Y, Ctrl+Shift+N, Alt+F4, Ctrl+D (Del), Shift+Delete, Alt+Tab, PrtScn, Windows key+I, Windows key+E, Windows key+A, Windows key+D, Windows key+L, Windows key+V, Windows key+Period (.) or semicolon (;), Windows key+PrtScn, Windows key+Shift+S, Windows key+Left arrow key, Windows key+Right arrow key, Keyboard shortcut, Windows key (or Ctrl+Esc), Ctrl+Arrow keys, Ctrl+Shift+Esc, Ctrl+Shift, Alt+F4, Ctrl+F5 (or Ctrl+R), Ctrl+Alt+Tab, Ctrl+Arrow keys (to select)+Spacebar, Alt+Underlined letter, Alt+Tab, Alt+Left arrow key, Alt+Right arrow key, Alt+Page Up, Alt+_Page Down, Alt+Esc, Alt+Spacebar, Alt+F8, Shift+Click app button, Ctrl+Shift+Click app button, Shift+Right-click app button, Ctrl+Click a grouped app button, Shift+Right-click grouped app button, Ctrl+Left arrow key, Ctrl+Right arrow key, Ctrl+Up arrow key, Ctrl+Down arrow key, Ctrl+Shift+Arrow key, Ctrl+Spacebar, Shift+F10, Shift+Arrow keys, Windows key+X, Windows key+Number (0-9), Windows key+T, Windows key+Alt+Number (0-9), Windows key+D, Windows key+M, Windows key+Shift+M, Windows key+Home, Windows key+Shift+Up arrow key, Windows key+Shift+Down arrow key, Windows key+Shift+Left arrow key, Windows key+Shift+Right arrow key, Windows key+Left arrow key, Windows key+Right arrow key, Windows key+S (or Q), Windows key+Alt+D, Windows key+Tab, Windows key+Ctrl+D, Windows key+Ctrl+F4, Windows key+Ctrl+Right arrow, Windows key+Ctrl+Left arrow, Windows key+P, Windows key+A, Windows key+I, Windows key+E, Alt+D, Ctrl+E (or F), Ctrl+N, Ctrl+W, Ctrl+F (or F3), Ctrl+Mouse scroll wheel, Ctrl+Shift+E, Ctrl+Shift+N, Ctrl+L, Ctrl+Shift+Number (1-8), Alt+P, Alt+Enter, Alt+Right arrow key, Alt+Left arrow key (or Backspace), Alt+Up arrow, F1, F2, F3, F4, F5, F6, F7, F8, F9, F10, F11, F12, Ctrl+Tab, Ctrl+Shift+Tab, Ctrl+number of tab, Tab, Shift+Tab, Alt+underline letter, Spacebar, Arrow keys, Ctrl+A, Ctrl+C (or Ctrl+Insert), Ctrl+V (or Shift+Insert), Ctrl+M, Ctrl+Up arrow key, Ctrl+Down arrow key, Ctrl+F, Left or right arrow keys, Up or down arrow keys, Page Up, Page Down, Ctrl+Home, Ctrl+End, Windows key, Windows key+A, Windows key+S (or Q), Windows key+D, Windows key+L, Windows key+M, Windows key+B, Windows key+C, Windows key+F, Windows key+G, Windows key+Y, Windows key+O, Windows key+T, Windows key+Z, Windows key+J, Windows key+H, Windows key+E, Windows key+I, Windows key+R, Windows key+K, Windows key+X, Windows key+V, Windows key+W, Windows key+U, Windows key+P, Windows key+Ctrl+Enter, Windows key+Plus (+), Windows key+Minus (−), Windows key+Esc, Windows key+Forward-slash (/), Windows key+Comma (,), Windows key+Up arrow key, Windows key+Down arrow key, Windows key+Home, Windows key+Shift+M, Windows key+Shift+Up arrow key, Windows key+Shift+Down arrow key, Windows key+Shift+Left arrow key, Windows key+Shift+Right arrow key, Windows key+Left arrow key, Windows key+Right arrow key, Windows key+Number (0-9), Windows key+Shift+Number (0-9), Windows key+Ctrl+Number (0-9), Windows key+Alt+Number (0-9), Windows key+Ctrl+Shift+Number (0-9), Windows key+Ctrl+Spacebar, Windows key+Spacebar, Windows_key+Tab, Windows key+Ctrl+D, Windows key+Ctrl+F4, Windows key+Ctrl+Right arrow, Windows key+Ctrl+Left arrow, Windows key+Ctrl+Shift+B, Windows key+PrtScn, Windows key+Shift+S, Windows key+Shift+V, Windows key+Ctrl+F, Windows key+Ctrl+Q, Windows key+Alt+D, Windows key+Period (.) or semicolon (;), Windows key+Pause.

18. The computer non-transitory readable medium according to claim 1, wherein said memory comprises a plurality of programs comprising calculations, problem-solving operations, and/or algorithms, and said calculations, said problem-solving operations, and/or said algorithms comprise at least one selected from the group of calculations, problem-solving operations, and algorithms consisting of: Aho Corasick String Matching; Algebraic-Group Factorization Algorithms; Algorithm to Detect Cycle; Articulation Points in a Graph; AKS Primality Test; Bach's Algorithm; Backpropagation Through A Neural Network; Beam Search Algorithm; Bell Ford Algorithm; Big O Notation; Binary Search Algorithm; Binary Indexed Tree or Fenwick Tree; Binary Search Trees; Boyer-Moore Majority Vote Algorithm; Breadth First Search Algorithm; Bridges in a Graph; Bubble Sort Algorithm; Bucket Sort Algorithm; Buchberger's Algorithm; Canonical Representation OF A Positive Number; Catalan Numbers; Convex Hull/Jarvis's Algorithm; Compression; Continued Fraction Factorization (CFRAC); Counting Inversions; Counting Sort Algorithm; Data Compression; Depth First Search Algorithm; Diffie-Hellman Key Exchange; Dijkstra's Algorithm; Dinic's Algorithm; Discrete Differentiation; Disjoint-Set Data Structure; Distance-Vector Routine Protocol Algorithm (DVRPA); Dixon's Algorithm; Dynamic Programming; Euclid's Algorithm; Euler's Factorization Method; Euler's Totient Function; Expectation-Maximization Algorithm; Factorial Calculation; Factorization; Fermat's Factorization Method; Ferrers Diagrams; Finite Automata Algorithm for Pattern Searching; Flood Fill Algorithm; Fast Fourier Transform (FFT) Algorithm; Floyd's Cycle Detection Algorithm; Floyd Warshall Algorithm; Ford-Fulkerson Algorithm; Gaussian Elimination to Solve Linear Equations; General Number Field Sieve (GNFS); Graham Scan; Gradient Decent Algorithm; Graphs; Graph Search Algorithm; Hashing; Heap Sort Algorithm; Hopcroft-Karp Algorithm for Maximum Matching; Huffman Coding Compression Algorithm; Hungarian Algorithm; Insertion Sort Algorithm; Interval Tree; Introsort Algorithm; Johnson's Algorithm; Kadane's Algorithm; Karatsuba Multiplication; Kahn's Topological Sort Algorithm; K Dimensional Tree; Key Exchange Encryption Algorithm; KMP Algorithm; Kraitchik Family Algorithm; Kruskal's Algorithm; Lee Algorithm; Lenstra Elliptical Curve Factorization; Link Cut; Linked List; Link-State Routing Protocol Algorithm (LSRPA); Logarithmic Exponentiation; Lowest Common Ancestor; LLL Algorithm; Matrix Exponentiation; Matrix Rank; Merge Sort Algorithm; Minimum Spanning Tree Algorithms; Modular Exponentiation; Modular Multiplicative Inverse; Mo's Algorithm; Multiplicative Partition; Newton's Method; Order Statistics; PageRank Algorithm; P-ADIC Order; Partition In Number Theory; Pollard's P-1 Algorithm; Pollard's Rho Algorithm; Primality Testing Algorithms such as the Sieve of Eratosthenes, the Fermat Primality Test and the Miller-Rabin Primality Test; Prime Factorization; Q Learning; Quadratic Sieve Algorithm; Queues; Quick Select Algorithm; Quick Sort Algorithm; Rabin Karp Algorithm; Random Sample Consensus Algorithm; Range Minimum Query; Rational Sieve; Recursion Functions; Regular Expression; RSA Algorithm; Schonhage-Strassen Algorithm; Segmented Sieve; Segment Tree; Selection Sort Algorithm; Shank's Square Forms Factorization (SQUFOF); Shor's Algorithm; Simplex Algorithm; Singular Value Decomposition (SVD); Solving a System of Linear Equations; Square Root of an Integer; Stacks; String Matching and Parsing; Transmission Control Protocol/Internet Protocol (TCP/IP) Algorithms; Trial Division Factorization Method; Trie; Trees; Topological Sort Algorithm; Union Find Algorithm; Viterbi Algorithm; Wheel Factorization; William's p+1 Algorithm; Wilson's Theorem; Young Diagrams; and, Z's Algorithm.

19. The computer non-transitory readable medium according to claim 1, wherein said memory further comprises a plurality of keywords which are used in a computer programming language and which each comprise a special meaning.

20. The computer non-transitory readable medium according to claim 19, wherein said keywords within a Java computer programming language comprise the following: abstract, assert, Boolean, break, byte, case, char, class, const, continue, default, do, double, else, enum, extends, false, final, finally, float, for, goto, if, implements, import, instanceof, int, interface, long, native, new, null, package, synchronized, this, throw, throws, transient, true, try, void, volatile, while, and these and other keywords and terms can be coded in order to be represented by individual square or sine wave forms having a specific frequency and wavelength, and wherein the following operators are used to perform arithmetic, assign values, and compare values: +, −, *, /, %, ++, −−, +, +=, −=, *=, /=, %=, ==, !=, >, >=, <, <=,.

21. A non-transitory computer readable medium that configures a computer comprising a processor, a memory, at least one input device, and at least one output device to input, output, process, store or persist in memory, and communicate a plurality of mathematical numbers each comprising a base portion comprising one or more of the following 0, 1, 2, 3, 4, 5, 6, 7, 8, 9, and an exponent portion, said base portion being represented and encoded and communicated by a square wave form and/or a sinusoidal wave form comprising a first frequency and wavelength, said exponent portion being represented and encoded by a second square wave form and/or sinusoidal wave form comprising a second frequency and wavelength, wherein said first square wave form and/or said first sinusoidal wave form and said second square wave form and/or said second sinusoidal wave form are communicated in a series and/or simultaneously in parallel.

22. A computer implemented method for inputting, outputting, communicating, processing, and storing or persisting in memory numerical data in a computer comprising a processor, a memory, at least one input device, and at least one output device, the method comprising: representing and encoding a number in a preselected base number system, said number having a base portion equal to said preselected base number in said preselected base number system and an exponent portion comprising a number obtained from a table of logarithms stored in said memory, said preselected base number in said preselected base number system and said exponent portion being configured to be manipulated by an algorithm by which a resultant square wave form and/or sinusoidal wave form having a specific frequency and wavelength is derived to represent and encode said number.

23. The computer implemented method according to claim 22 comprising: selecting said number X in a base number system; representing said selected said number X in the form of a logarithmic function and expression $Log_b{}^n = X$, where b is the base portion of said selected number X in said base number system, and where n is the exponent to which b is raised to yield said number X; taking and using n as a first factor;-multiplying n by at least a second factor y to yield a resulting numerical product; selecting a square wave form and/or sinusoidal wave form comprising a specific frequency and wavelength such that length of said wavelength equals said numerical product, whereby said square wave form and/or sinusoidal wave form comprising said specific frequency and wavelength is used to represent and encode said number X.

24. The computer implemented method according to claim 23, further including the step of including at least a third factor z which is randomly generated so that (n)(y)(z) equals said resulting numerical product.

25. A computer implemented method for inputting, outputting, communicating, processing, and storing or persisting data and information using a computer comprising a processor, a memory, at least one input device, and at least one output device comprising the steps of configuring said computer to perform input, output, processing, and storage or persistence of said data and information in said memory, said data and information being represented and encoded by a plurality of square wave forms and/or sinusoidal wave forms each comprising a specific frequency and wavelength, and the step of selecting and combining at least two of said plurality of square wave forms and/or sinusoidal wave forms resulting in a first coding point comprising a first set.

26. The computer implemented method according to claim 25, wherein said first coding point is configured to represent at least one of an alphabetical letter, a word, a number, a symbol, a command, a function, and an operation.

27. The computer implement method according to claim 25, wherein the step of selecting and combining at least two of said plurality of square wave forms and/or said sinusoidal wave forms comprises combining in the range between three and eight of said plurality of square wave forms and/or said sinusoidal wave forms.

28. The computer implemented method according to claim 25, wherein said memory comprises a formal computer language which comprises at least one of a construction language, a command language, a configuration language, a programming language, a query language, a transformation language, a data exchange language, a markup language, a modeling language, an architecture description language, a hardware description language, a printed page language, a simulation language, a specification language, a sheet style language, a domain-specific language, a general-purpose language, a natural language processing language.

29. The computer implemented method according to claim 25, wherein each difference in said specific frequency and wavelength comprises a potential coding point, whereby the possible permutations and combinations using X of said frequencies and wavelengths from a set of Y members is expressed by the formulas: Permutations nPr=Y!/(Y−X)! and Combinations nCr=Y!/X! X(Y−X)!.

30. The computer implemented method according to claim 25, further comprising the additional step of selecting at least a second set of at least two of said plurality of square wave forms and/or said sinusoidal wave forms resulting in a second coding point and a second set, said first set and said second set comprising a plurality of sets, said plurality of sets being configured in a series and/or in parallel to define a sequence comprising a plurality of said first coding point and said second coding point, whereby said data and information can be stored or persisted in said computer memory.

31. The computer implemented method according to claim 30, wherein said plurality of sets comprising said plurality of coding points for representing and encoding data and information are configured to comprise a data packet, block, cell, datagram, frame, or payload, and said data packet, block, cell, datagram, frame, or payload further comprises control information, user data, destination data, error detection codes, and sequencing data configured in at least one of a header, a footer, or a trailer, whereby said data and information is configured for being transmitted and received in a communication system.

32. A computer non-transitory readable medium which configures at least one of an optical computer, an electro-optical computer, and/or a quantum computer comprising a processor, a memory, at least one input device, and at least one output device to perform inputting, outputting, processing, and memory, said memory comprising data and information a plurality of alphabetical letters and/or a plurality of words and/or a plurality of numbers selected from the group of numbers consisting of: 0, 1, 2, 3, 4, 5, 6, 7, 8, 9, and/or and a combination thereof, and/or a plurality of symbols, each of said plurality of alphabetical letters and/or said plurality of words and/or said plurality of numbers and/or said plurality of symbols being directly represented and encoded by a corresponding sinusoidal wave form comprising a specific frequency and wavelength in the visible light portion or invisible light portion of the electromagnetic spectrum.

* * * * *